(12) United States Patent
Sugimoto et al.

(10) Patent No.: US 6,832,863 B2
(45) Date of Patent: Dec. 21, 2004

(54) SUBSTRATE TREATING APPARATUS AND METHOD

(75) Inventors: Kenji Sugimoto, Kyoto (JP); Minobu Matsunaga, Kyoto (JP); Masakazu Sanada, Kyoto (JP); Katsushi Yoshioka, Kyoto (JP); Kaoru Aoki, Kyoto (JP); Moritaka Yano, Kyoto (JP); Satoshi Yamamoto, Kyoto (JP); Tsuyoshi Mitsuhashi, Kyoto (JP); Takashi Nagao, Kyoto (JP); Mitsumasa Kodama, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 10/458,719

(22) Filed: Jun. 9, 2003

(65) Prior Publication Data

US 2004/0005149 A1 Jan. 8, 2004

(30) Foreign Application Priority Data

Jun. 11, 2002 (JP) .................................... JP2002-170498
Jun. 11, 2002 (JP) .................................... JP2002-170499
Jun. 11, 2002 (JP) .................................... JP2002-170501

(51) Int. Cl.$^7$ ................................................. G03D 5/00
(52) U.S. Cl. ...................... 396/611; 414/269; 414/935; 414/940
(58) Field of Search .............................. 396/604, 611; 414/269, 935, 940

(56) References Cited

U.S. PATENT DOCUMENTS 6,089,811 A * 7/2000 Watanabe et al. ........... 414/269

FOREIGN PATENT DOCUMENTS

| JP | 10-74822 | 3/1998 |
| JP | 2001-168004 | 6/2001 |

* cited by examiner

*Primary Examiner*—D. Rutledge
(74) *Attorney, Agent, or Firm*—Ostrolenk, Faber, Gerb & Soffen, LLP

(57) ABSTRACT

A series of substrate transport paths for transporting substrates is arranged on upper and lower stories. Substrates are transferable between the substrate transport path on the first story and the substrate transport path on the second story. The paths include a going-only path for transporting the substrates forward, and a return-only path for transporting the substrates in the opposite direction, these paths being arranged on the upper and lower stories. An indexer connects one end of the substrate transport path on one story to one end of the substrate transport path on the other story. An interface connects the other end of the substrate transport path on one story to the other end of the substrate transport path on the other story. This construction efficiently reduces a waiting time due to interference between the substrates transported along the going-only path and the substrates transported along the return-only path.

52 Claims, 35 Drawing Sheets

Fig.5A
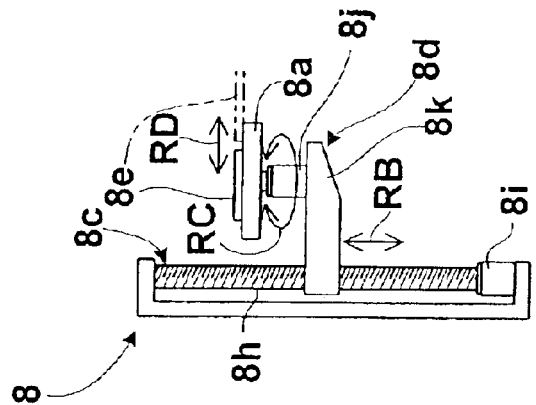
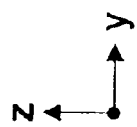
Fig.5B
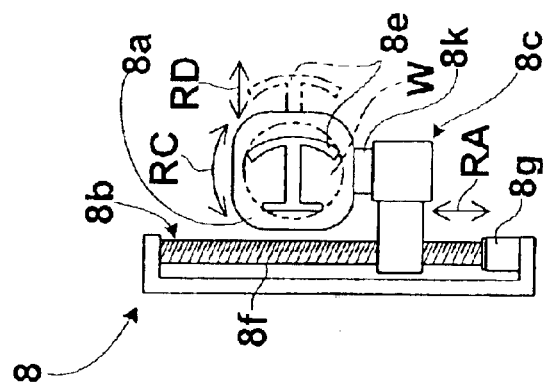
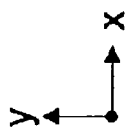

Fig.6A
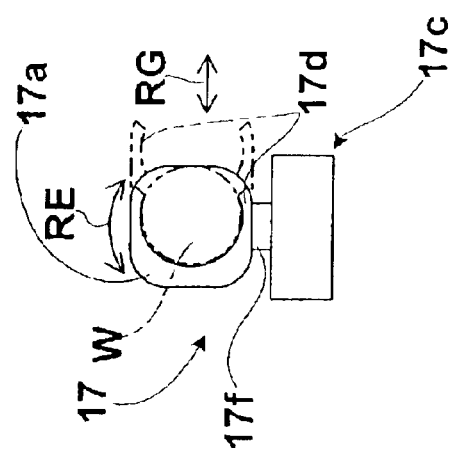
Fig.6B
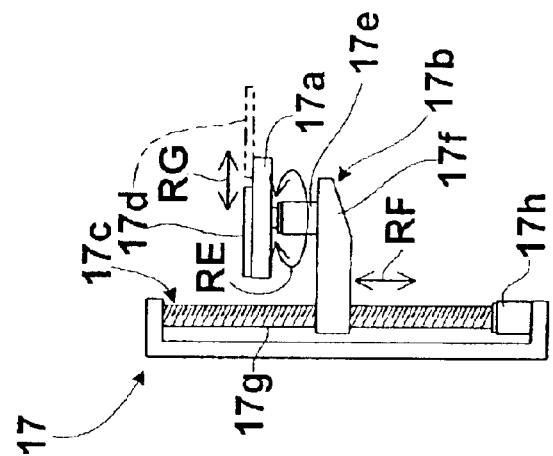
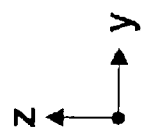
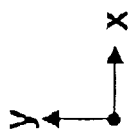

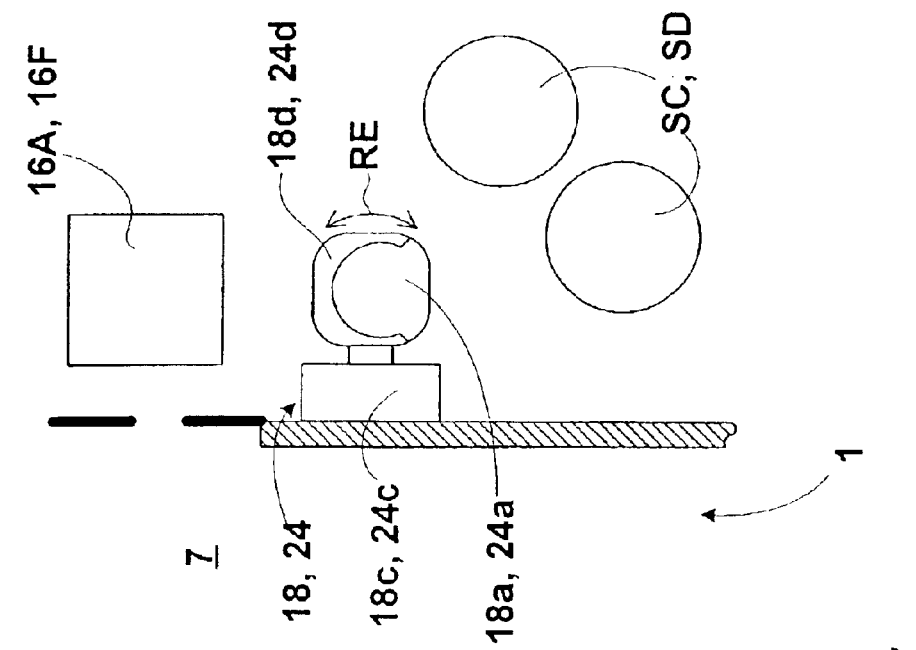
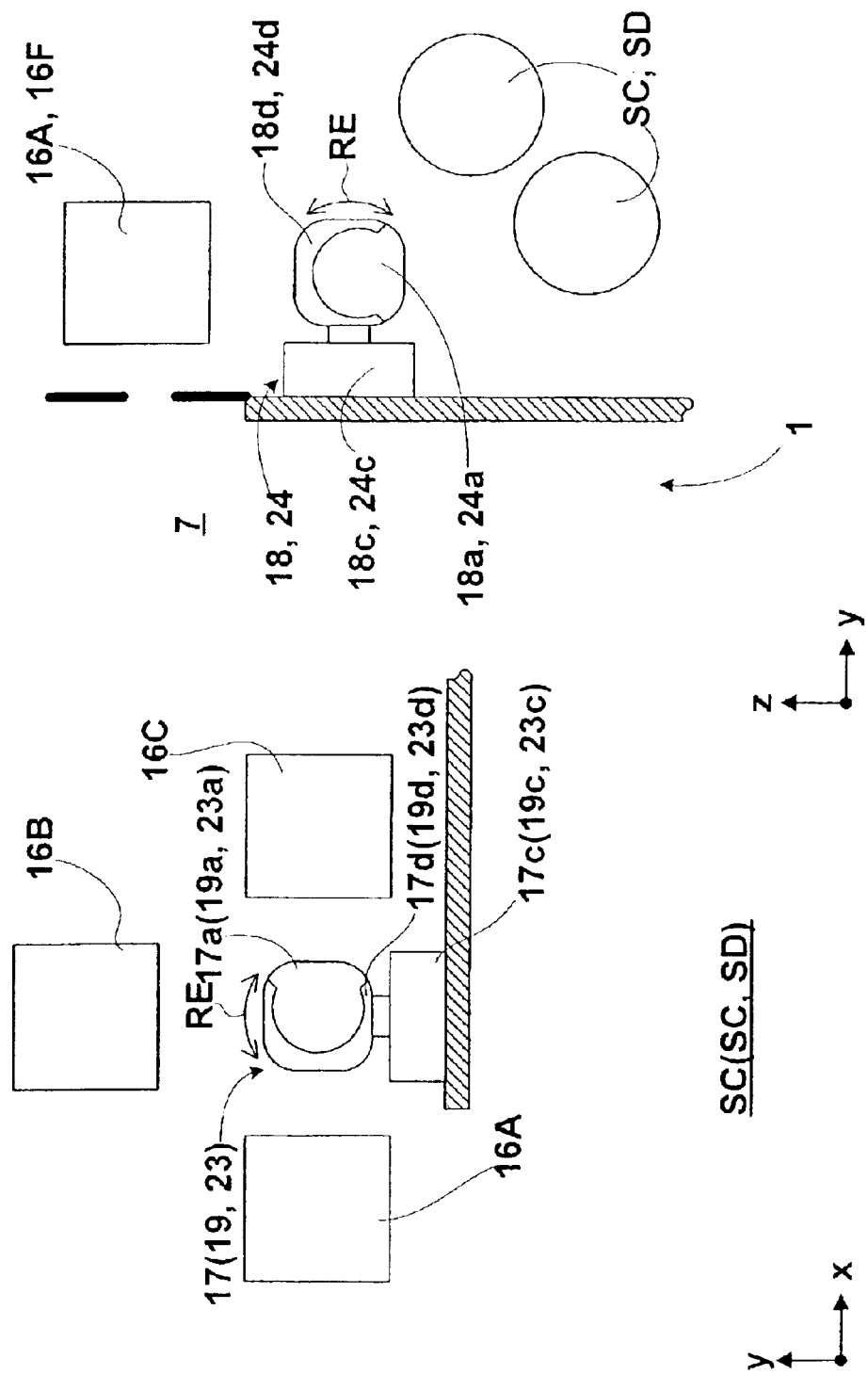

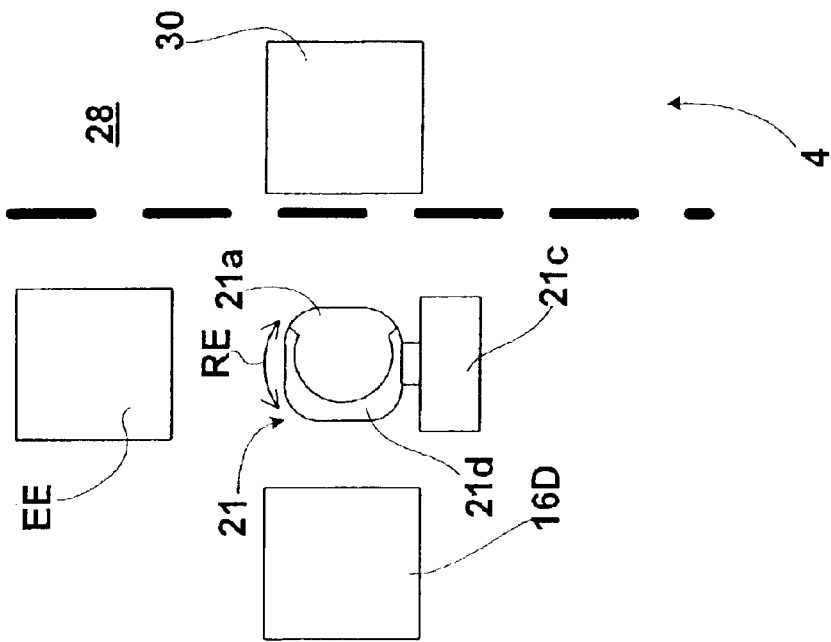
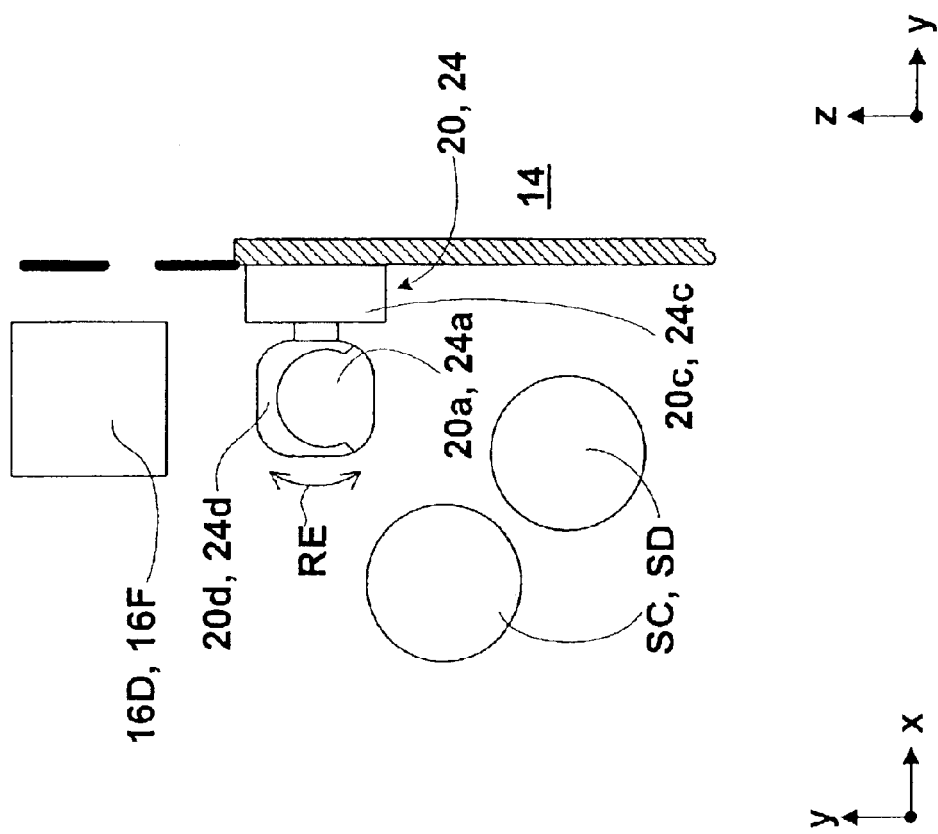

Fig.14

| step | substrate position | transport mech. |
|---|---|---|
| S1 | indexer | ID transport mech. 8 |
| S2 | substrate rest | heat treatment transport mech. 17 |
| S3 | AHL | heat treatment transport mech. 17 |
| S4 | CP | SC transport mech. 18 |
| S5 | SC(BARC) | SC transport mech. 18 |
| S6 | CP | heat treatment transport mech. 17 |
| S7 | HP | heat treatment transport mech. 17 |
| S8 | substrate rest | heat treatment transport mech. 19 |
| S9 | CP | SC transport mech. 20 |
| S10 | SC | SC transport mech. 20 |
| S11 | CP | heat treatment transport mech. 19 |
| S12 | HP | heat treatment transport mech. 19 |
| S13 | CP | heat treatment transport mech. 19 |
| S14 | substrate rest | EE transport mech. 21 |
| S15 | EE | EE transport mech. 21 |
| S16 | substrate rest | EE transport mech. 21 |
| S17 | BF | IF transport mech. 29 |
| S18 | interface | IF transport mech. 29 |
| S19 | STP | IF transport mech. 29 |
| S20 | interface | IF transport mech. 29 |
| S21 | substrate rest | PEB transport mech. 22 |
| S22 | PEB | PEB transport mech. 22 |
| S23 | CP | PEB transport mech. 22 |
| S24 | substrate rest | heat treatment transport mech. 23 |
| S25 | CP | SD transport mech. 24 |
| S26 | SD | SD transport mech. 24 |
| S27 | CP | heat treatment transport mech. 23 |
| S28 | HP | heat treatment transport mech. 23 |
| S29 | CP | heat treatment transport mech. 23 |
| S30 | substrate rest | heat treatment transport mech. 23 |
| S31 | substrate rest | ID transport mech. 8 |
| S32 | indexer | |

Fig.21

| step | position of substrate for testing | substrate position |
|---|---|---|
| S1 | indexer | ← ID transport mech. 8 |
| S2 | testing module | ← heat treatment transport mech. 17 |
| S4 | AHL | ← heat treatment transport mech. 17 |
| S5 | CP | ← SC transport mech. 18 |
| S6 | SC(BARC) | ← SC transport mech. 18 |
| S7 | CP | ← heat treatment transport mech. 17 |
| S8 | HP | ← heat treatment transport mech. 17 |
| S9 | substrate rest | ← heat treatment transport mech. 19 |
| S10 | CP | ← SC transport mech. 20 |
| S11 | SC | ← SC transport mech. 20 |
| S12 | CP | ← heat treatment transport mech. 19 |
| S13 | HP | ← heat treatment transport mech. 19 |
| S14 | CP | ← heat treatment transport mech. 19 |
| S15 | substrate rest | ← EE transport mech. 21 |
| S16 | EE | ← EE transport mech. 21 |
| S17 | substrate rest | ← EE transport mech. 21 |
| S18 | BF | ← IF transport mech. 29 |
| S19 | interface | ← IF transport mech. 29 |
| S20 | STP | ← IF transport mech. 29 |
| S21 | interface | ← IF transport mech. 29 |
| S22 | testing module | ← PEB transport mech. 22 |
| S24 | PEB | ← PEB transport mech. 22 |
| S25 | CP | ← PEB transport mech. 22 |
| S26 | substrate rest | ← heat treatment transport mech. 23 |
| S27 | CP | ← SD transport mech. 24 |
| S28 | SD | ← SD transport mech. 24 |
| S29 | CP | ← heat treatment transport mech. 23 |
| S30 | HP | ← heat treatment transport mech. 23 |
| S31 | CP | ← heat treatment transport mech. 23 |
| S32 | substrate rest | ← heat treatment transport mech. 23 |
| S33 | testing module | ← ID transport mech. 8 |
| S36 | indexer | |

Fig.22

| step | position of remaining substrates | substrate position |
|---|---|---|
| S1 | indexer | ID transport mech. 8 |
| S3 | substrate rest | heat treatment transport mech. 17 |
| S4 | AHL | heat treatment transport mech. 17 |
| S5 | CP | SC transport mech. 18 |
| S6 | SC(BARC) | SC transport mech. 18 |
| S7 | CP | heat treatment transport mech. 17 |
| S8 | HP | heat treatment transport mech. 17 |
| S9 | substrate rest | heat treatment transport mech. 19 |
| S10 | CP | SC transport mech. 20 |
| S11 | SC | SC transport mech. 20 |
| S12 | CP | heat treatment transport mech. 19 |
| S13 | HP | heat treatment transport mech. 19 |
| S14 | CP | heat treatment transport mech. 19 |
| S15 | substrate rest | EE transport mech. 21 |
| S16 | EE | EE transport mech. 21 |
| S17 | substrate rest | EE transport mech. 21 |
| S18 | BF | IF transport mech. 29 |
| S19 | interface | IF transport mech. 29 |
| S20 | STP | IF transport mech. 29 |
| S21 | interface | IF transport mech. 29 |
| S23 | substrate rest | PEB transport mech. 22 |
| S24 | PEB | PEB transport mech. 22 |
| S25 | CP | PEB transport mech. 22 |
| S26 | substrate rest | heat treatment transport mech. 23 |
| S27 | CP | SD transport mech. 24 |
| S28 | SD | SD transport mech. 24 |
| S29 | CP | heat treatment transport mech. 23 |
| S30 | HP | heat treatment transport mech. 23 |
| S31 | CP | heat treatment transport mech. 23 |
| S32 | substrate rest | heat treatment transport mech. 23 |
| S34 | substrate rest | ID transport mech. 8 |
| S36 | indexer | |

SUBSTRATE TREATING APPARATUS AND METHOD

BACKGROUND OF THE INVENTION (1) Field of the Invention

This invention relates to substrate treating apparatus and methods with a plurality of treating cells for treating semiconductor wafers, glass substrates for liquid crystal displays, glass substrates for photomasks, and substrates for optical disks (hereinafter called simply "substrates").

(2) Description of the Related Art

Conventionally, such a substrate treating apparatus is used, for example, in a photolithographic process for forming photoresist film on substrates, exposing the substrates having the photoresist film formed thereon, and developing the exposed substrates.

This apparatus will be described with reference to a plan view shown in FIG. 1. This substrate treating apparatus includes an indexer 103 having a cassette table 102 for receiving a plurality of cassettes C each containing or for containing a plurality of (e.g. 25) substrates or wafers W to be treated, or substrates or wafers W having been treated in treating cells 104 described hereinafter, and a transport mechanism 108a movable horizontally along the cassettes C for transporting the wafers W between the cassettes C and treating cells 104. The apparatus further includes, besides the treating cells 104, a main substrate transport path 105 along which the wafers W are transported from one treating cell 104 to another, and an interface 106 for transferring the wafers W between the treating cells 104 and an external treating apparatus 107.

The indexer 103 is constructed for successively fetching wafers W to be treated from each cassette C placed on the cassette table 102 and transferring these wafers W to the treating cells 104, and receiving treated wafers W from the treating cells 104 and successively depositing the treated wafers W in a predetermined cassette C.

The interface 106 connects the treating cells 104 and external treating apparatus 107. Where the substrate treating apparatus is designed for resist application and development as noted above, the external treating apparatus 107 is an exposing apparatus for exposing the wafers W.

The substrate treating apparatus further includes a transport mechanism 108b movable along the substrate transport path 105, and a transport mechanism 108c movable along a transport path of the interface 106. In addition, a table 109a is disposed at a connection between the indexer 103 and substrate transport path 105, and a table 109b at a connection between the substrate transport path 105 and interface 106.

The above substrate treating apparatus performs substrate treatment through the following procedure. A cassette C containing wafers W to be treated is placed on the cassette table 102. The transport mechanism 108a takes one wafer W out of this cassette C, and transports the wafer W to the table 109a to pass the wafer W to the transport mechanism 108b. The transport mechanism 108b, after receiving the wafer W placed on the table 109a, transports the wafer W into each treating cell 104 for a predetermined treatment (e.g. resist application) in the treating cell 104. Upon completion of the predetermined treatment, the transport mechanism 108b takes the wafer W out of the treating cell 104, and transports the wafer W into another treating cell 104 for a next treatment.

After a series of pre-exposure treatments is completed, the transport mechanism 108b transports the wafer W treated in the treating cells 104 to the table 109b to pass the wafer W to the transport mechanism 108c. The transport mechanism 108c receives the wafer W placed on the table 109b and transports the wafer W to the external treating apparatus 107. After a predetermined treatment (e.g. exposure), the transport mechanism 108c takes the wafer W out of the external treating apparatus 107, and transports it to the table 109b. Subsequently, the transport mechanism 108b transports the wafer W to the treating cells 104 where a series of post-exposure treatments (e.g. heating and cooling treatments and development) is performed. Treated wafers W are successively loaded into a predetermined cassette C to complete a series of substrate treatments.

The conventional apparatus with such a construction has the following problems (I)–(III):

Problem (I)

In the conventional substrate treating apparatus, the transport mechanism 108b transports wafers W from the indexer 103 to the interface 106 and from the interface 106 to the indexer 103. Thus, the transport mechanism 108b cannot perform the two transporting operations (from the indexer 103 to the interface 106 and from the interface 106 to the indexer 103) simultaneously. Even if two transport mechanisms 108b were provided, one adjacent the indexer 103 and the other adjacent the interface 106, interference could occur on the substrate transport path 105 between a wafer W transported from the indexer 103 to the interface 106 and a wafer W transported from the interface 106 to the indexer 103. Then, until one of the wafers W is sidestracked or loaded into a treating cell 104, the other wafer W must be kept on standby on the table 109a or 109b or on a temporary tray (buffer) not shown. As a result, a wasteful waiting time of wafers W increases to hamper improvement in treating efficiency.

Further, since the transport mechanism 108b transports wafers W from the indexer 103 to the interface 106 and from the interface 106 to the indexer 103 as noted above, a transport control for controlling substrate treatment is encumbered.

Problem (II)

The conventional substrate treating apparatus has a limit in treating a large number of wafers W. When a plurality of wafers W are treated simultaneously, interference will occur between the wafers W to lower the efficiency of treatment. To enable treatment of a large number of wafers W, it is conceivable to extend the substrate transport path 105 or provide an additional substrate transport path or paths. However, this will require an increased floor space (footprint) for installing the apparatus.

Problem (III)

In order to examine or test wafers W in the course of treatment, a testing device (not shown) is provided separately from the substrate treating apparatus. Wafers W are unloaded from the substrate treating apparatus, and transported to the testing device. The testing device may, for example, be one for checking linewidths of circuit patterns formed in a photolithographic process, one for checking alignment accuracy for exposure, one for checking sizes and numbers of dust particles adhering to the wafers W, or one for checking defects of circuit patterns. Such a testing device is in the form of an optical microscope, for example. A wafer W is tested in the course of treatment by transporting to the testing device the wafer W taken out of a treating cell 104 performing the treatment relating to the test.

Since the substrate treating apparatus and testing device are separate from each other as noted above, the substrate processing time is extended by the time taken in transporting the wafers W and other operations. Then, it is conceivable to incorporate the testing device into the substrate treating apparatus. However, since the testing device is operated in the middle of substrate treatment, to avoid interference between a wafer W subjected to the test and other wafers W, the other wafers W must be kept on standby. As a result, a wasteful waiting time of wafers W increases to hamper improvement in treating efficiency.

SUMMARY OF THE INVENTION

This invention has been made having regard to the state of the art noted above, and its object is to provide substrate treating apparatus and methods for (I) improving the efficiency of treating substrates and controlling transportation of the substrates simply, (II) improving the efficiency of treating substrates without enlarging a footprint, and (III) improving the efficiency of treating substrates when testing the substrates.

To solve the problem (I) noted above, a substrate treating apparatus having a plurality of treating devices for treating substrates, according to this invention, comprises:

a series of substrate transport paths arranged on upper and lower stories for transporting the substrates between the treating devices, the substrates being transferable between the substrate transport paths on the upper and lower stories;

wherein the substrate transport paths on the respective stories have opposite directions for transporting the substrates, such that the substrate transport paths on the respective stories define a going-only path for transporting the substrates forward, and a return-only path for transporting the substrates backward.

In the substrate treating apparatus according to this invention, a series of substrate transport paths is arranged on the upper and lower stories for transporting the substrates between the treating devices. The substrates may be transferred between the substrate transport paths on the upper and lower stories. The substrate transport paths on the respective stories have opposite directions for transporting the substrates. The substrate transport paths on the respective stories define a going-only path for transporting the substrates forward, and a return-only path for transporting the substrates backward. With this construction, each substrate is first transported along the going-only path, then its direction of transport is reversed, and the substrate is transported along the return-only path. When the direction of transport is reversed again, the substrate will be transported along the going-only path. In this way, the substrates are transported through the going and return-only paths from one treating device to another for substrate treatment. No interference occurs between the substrates transported through the going-only transport path and the substrates transported through the return-only transport path. This effectively reduces the wasteful waiting time due to interference between these substrates. As a result, the efficiency of treating substrates is improved.

Substrate transport devices may be arranged for transporting the substrates along the going-only path, and different substrate transport devices for transporting the substrates along the return-only path. Then, the substrate transport devices transport the substrates only forward or backward, which facilitates a transport control for controlling the substrate treatment.

Further, the series of substrate transport paths is arranged on the upper and lower stories, and the substrates may be transferred between the substrate transport paths on the respective stories. This construction provides an advantage of reducing a floor space (footprint) for installation of the apparatus.

In the substrate treating apparatus according to this invention, an indexer or interface may be added to the substrate treating apparatus in a plurality of forms as set out hereunder. The indexer includes a cassette table for receiving a cassette containing substrates to be treated, and is operable for successively fetching the substrates to be treated from the cassette, delivering the substrates to be treated to the treating devices, receiving treated substrates from the treating devices, and successively depositing the treated substrates in the cassette. The interface is operable for relaying the substrates between the treating devices and an external treating apparatus disposed adjacent the substrate treating apparatus.

In one form, the indexer is juxtaposed with the series of substrate transport paths arranged on the upper and lower stories, and an end of the series of substrate transport paths is connected to the indexer. This form provides two functions. In one function, the substrates contained in a cassette placed on the cassette table are successively fetched therefrom and delivered to the treating devices. That is, the substrates are delivered through the indexer having the cassette table and placed at the end of the series of substrate transport paths connected to the indexer. The substrates are then transported through the series of substrate transport paths from one treating device to another for substrate treatment.

In the other function, the substrates having received a series of substrate treatments by being transported between the treating devices through the series of substrate transport paths are successively deposited in a cassette from the treating devices. That is, the treated substrates are placed at the end of the series of substrate transport paths. The substrates are then transported through the indexer connected to the end of the series of substrate transport paths, and deposited in the cassette placed on the cassette table in the indexer.

In another form, the indexer is juxtaposed with the series of substrate transport paths arranged on the upper and lower stories, and an end of the substrate transport path on each of the stories is connected to the indexer. According to this form, the substrates contained in a cassette placed on the cassette table are successively fetched therefrom and delivered to the treating devices. That is, the substrates are delivered through the indexer having the cassette table and placed at one of the ends of the substrate transport paths on the respective stories connected to the indexer. The substrates are then transported between the treating devices, for substrate treatment, through the substrate transport path on the story on which the substrates are placed. The substrates having received the substrate treatment are successively deposited in a cassette from the treating devices. That is, the treated substrates are placed at the end of the substrate transport path on the story on which the substrates were placed. The substrates are then transported through the indexer connected to the end of the series of substrate transport paths, and deposited in the cassette placed on the cassette table in the indexer.

A plurality of substrates may be placed, through the indexer, at substantially the same time at the end of the substrate transport path on each story connected to the indexer, to perform a plurality of substrate treatments at substantially the same time. A substrate having received a series of substrate treatments may be placed at the end of the substrate transport path on the story on which the substrate was placed, then transported through the indexer connected to the end of the substrate transport path, and placed again at the end of the substrate transport path to repeat the series of substrate treatments for the substrate.

In a further form, the interface is juxtaposed with the series of substrate transport paths arranged on the upper and lower stories, and an end of the series of substrate transport paths is connected to the interface. This form provides two functions. In one function, the substrates treated in the external treating apparatus are transported through the interface, and placed at the end of the series of substrate transport paths connected to the interface. The substrates placed are transported through the series of substrate transport paths from one treating device to another for substrate treatment.

In the other function, the substrates having received a series of substrate treatments by being transported between the treating devices through the series of substrate transport paths are placed at the end of the series of substrate transport paths. The substrates are transferred to the external treating apparatus through the interface connected to the end of the series of substrate transport paths, to be treated in the external treating apparatus.

In a still further form, the interface is juxtaposed with the series of substrate transport paths arranged on the upper and lower stories, and an end of the substrate transport path on each of the stories is connected to the interface. According to this form, the substrates treated in the external treating apparatus are transported through the interface, and placed at one of the ends of the substrate transport paths on the respective stories connected to the interface. The substrates are transported through the substrate transport path on the story on which the substrates are placed, from one treating device to another for substrate treatment. After the substrate treatment, the substrates are transported through the substrate transport path on the story on which the substrates are placed, and placed at the end of the substrate transport path. Then, the substrates are transferred to the external treating apparatus through the interface connected to the end of the series of substrate transport paths, to be treated in the external treating apparatus again.

A plurality of substrates treated in the external treating apparatus may be placed, through the interface, at substantially the same time at the ends of the substrate transport paths on the respective stories connected to the interface, to perform a plurality of substrate treatments at substantially the same time. A substrate having received a series of substrate treatments may be placed at the end of the substrate transport path on the story on which the substrate was placed, then transported through the interface connected to the end of the substrate transport path, and transferred to the external treating apparatus to repeat the series of substrate treatment including the treatment by the external treating apparatus.

In a still further form, the indexer is juxtaposed with one end the series of substrate transport paths arranged on the upper and lower stories, and the interface is juxtaposed with the other end of the series of substrate transport paths arranged on the upper and lower stories, the one end of the series of substrate transport paths being connected to the indexer, and the other end of the series of substrate transport paths being connected to the interface. This form provides two functions. In one function, the substrates contained in a cassette placed on the cassette table are successively fetched therefrom and delivered to the treating devices. That is, the substrates are delivered through the indexer having the cassette table and placed at the end of the series of substrate transport paths connected to the indexer. The substrates are then transported through the series of substrate transport paths from one treating device to another for substrate treatment. The substrates having received the substrate treatment are placed at the other end of the series of substrate transport paths. The substrates are then transferred to the external treating apparatus through the interface connected to the other end of the series of substrate transport paths, to be treated in the external treating apparatus.

In the other function, the substrates treated in the external treating apparatus are transported through the interface, and placed at the other end of the series of substrate transport paths connected to the interface. The substrates placed are transported through the series of substrate transport paths from one treating device to another for substrate treatment. The substrates having received the substrate treatment are successively deposited in a cassette from the treating devices. That is, the treated substrates are placed at the end of the series of substrate transport paths. The substrates are then transported through the indexer connected to the end of the series of substrate transport paths, and deposited in the cassette placed on the cassette table in the indexer.

In a still further form, the indexer is juxtaposed with one end of the series of substrate transport paths arranged on the upper and lower stories, and the interface is juxtaposed with the other end of the series of substrate transport paths arranged on the upper and lower stories, the one end of the substrate transport path on each of the stories being connected to the indexer, and the other end of the substrate transport path on each of the stories being connected to the interface. According to this form, one end of the substrate transport path arranged on each story is connected to the indexer, and the other end of the substrate transport path arranged on each story is connected to the interface. No interference occurs between the substrates when the substrates are transported separately through the substrate transport paths arranged on the respective stories to extend between the indexer and interface. As a result, the transportation between the indexer and interface promotes the efficiency of treating substrates, including the treatment by the external treating apparatus.

The substrate treating apparatus described above is applicable to various substrate treatments. Such treatments include, for example, a coating treatment for applying a treating solution to the substrates, and development for developing the substrates having the treating solution applied thereto, in a photolithographic process. On the other hand, a substrate treating apparatus is installed in a cleanroom to avoid adverse influences of particles and the like on the substrates. The cleanroom usually employs a downflow system for drawing gas from above the apparatus and releasing the gas downward, thereby discharging the particles and the like downward. Where the substrate treating apparatus according to this invention is installed in such a cleanroom for coating and developing substrates, since the substrate transport paths are arranged on the upper and lower stories, one of a coating device and a developing device is disposed on the upper story, and the other on the lower story of the apparatus. Another point of fact to be noted is that the treating solution (e.g. photoresist solution) applied to the substrates in the coating device is higher in viscosity than the developer used in the developing device.

A substrate treating apparatus made in view of such a situation, according to this invention, comprises:

a coating device disposed on the going-only path for applying a treating solution to the substrates; and a developing device disposed on the return-only path for developing the substrates having the treating solution applied thereto in the coating device;

the series of substrate transport paths having the return-only path with the developing device arranged above the going-only path with the coating device, the substrates being transferable between the going-only path and the return-only path.

According to this substrate treating apparatus, the substrates may be transferred between the going-only path with the coating device and the return-only path with the developing device, to form the series of substrate transport paths. Thus, the substrates, after the coating treatment, may be developed in a continuous way. The return-only path with the developing device is disposed above the going-only path with the coating device as noted above, that is the developing device is disposed above the coating device. Thus, without requiring a separate air-conditioning system for adjusting the temperature of the coating device, downflows in a cleanroom may be used for temperature control of the coating device. Further, with the developing device disposed above the coating device, cups also are disposed below for preventing scattering of and for draining the treating solution. The cups having the highly viscous treating solution adhering thereto may be changed more easily than where the coating device is disposed above the developing device.

In order to treat the substrates with increased efficiency, it is preferred that the apparatus comprises a plurality of substrate transport devices for transporting the substrates along the substrate transport paths on the respective stories, wherein each of the substrate transport devices includes a loading transport device for loading the substrates into the treating devices, and an unloading transport device for unloading the substrates from the treating devices. With this construction, while the loading transport device loads the substrates in a forward direction into the treating devices, the unloading transport device can unloads the substrates in the forward direction from the treating devices.

To accommodate variations in the number of substrates to be treated, it is preferred that a plurality of treating devices vertically opposed to each other among the treating devices arranged along the substrate transport paths arranged on the upper and lower stories, and parts vertically opposed to each other of the substrate transport paths on the respective stories, constitute one of substrate treating units, the substrate treating units being arranged in the directions for transporting the substrates. With this construction, an increased or decreased number of substrate treating units may be arranged in the directions for transporting the substrates according to the number of substrates to be treated.

In the above construction, it is preferred that one, on one of the stories, of the parts of the substrate transport paths included in each of the substrate treating units is connected to one, on the one of the stories, of the parts of the substrate transport paths included in an adjacent one of the substrate treating units. With this connection mode and the substrate treating units arranged in the directions for transporting the substrates, the substrate transport paths on the respective stories may have a simple construction. Preferably, the apparatus comprises a substrate receiver on the substrate transport path on each story, between two adjacent substrate treating units, for receiving the substrates for transfer between the two adjacent substrate treating units. With this arrangement, the substrates may be transferred easily between the adjacent substrate treating units.

Take the coating treatment for example, at least one of the substrate treating units, preferably, comprises a resist film forming device for forming photoresist film on the substrates, or an anti-reflective coating forming device for forming an anti-reflective coating on the substrates.

In another aspect of the invention, a substrate treating method is provided which uses the substrate treating apparatus having the indexer juxtaposed with one end of the series of substrate transport paths arranged on the upper and lower stories, and the interface juxtaposed with the other end of the series of substrate transport paths arranged on the upper and lower stories, the one end of the substrate transport path on each of the stories being connected to the indexer, and the other end of the substrate transport path on each of the stories being connected to the interface. This method comprises the steps of:

placing substrates to be treated from the indexer at one of the ends of the substrate transport paths on the respective stories connected to the indexer;

transporting the substrates along the substrate transport path on the story on which the substrates have been placed, for substrate treatment in each of the treating devices;

transferring the substrates treated in each of the treating devices to the external treating apparatus through the interface connected to the other end of the substrate transport path on the story on which the substrates have been placed, for treatment in the external treating apparatus;

placing the substrates treated in the external treating apparatus, through the interface, at one of the other ends of the substrate transport paths on the respective stories connected to the interface; and transporting the substrates along the substrate transport path on the story on which the substrates have been placed, for substrate treatment in each of the treating devices;

a series of substrate treatments including the treatment by the external treating apparatus being carried out by executing the above steps.

With the substrate treating method according to this invention, substrates to be treated are transported through the indexer and placed at one of the ends of the substrate transport paths on the respective stories connected to the indexer, and the substrates are then transported along the substrate transport path on the story on which the substrates have been placed, for substrate treatment in each of the treating devices. The substrates treated in each of the treating devices are transferred to the external treating apparatus through the interface connected to the other end of the substrate transport path on the story on which the substrates have been placed, for treatment in the external treating apparatus. The substrates treated in the external treating apparatus are placed, through the interface, at one of the other ends of the substrate transport paths on the respective stories connected to the interface. The substrates are then transported along the substrate transport path on the story on which the substrates have been placed, for substrate treatment in each of the treating devices. This substrate treating method can easily carry out a series of substrate treatments including the treatment by the external treating apparatus, through the ends of the substrate transport paths on the respective stories connected to the indexer and interface.

Preferably, the substrates having received the series of substrate treatments including the treatment by the external treating apparatus are transported through the indexer connected to the ends of the substrate transport paths on the respective stories, and placed at one of the ends of the substrate transport paths on the respective stories, to repeat the series of substrate treatments for the substrates placed. In this case, the series of substrate treatments including the treatment by the external treating apparatus may be repeated advantageously.

To solve the problem (II) noted above, a substrate treating apparatus having a plurality of treating devices for treating substrates, according to this invention, comprises:

substrate transport paths arranged on upper and lower stories for transporting the substrates between the treating devices; and an indexer including a cassette table for receiving a cassette containing substrates to be treated, the indexer successively fetching the substrates to be treated from the cassette, delivering the substrates to be treated to the treating devices, receiving treated substrates from the treating devices, and successively depositing the treated substrates in the cassette;

wherein an end of each of the substrate transport paths on the respective stories is connected to the indexer.

In the substrate treating apparatus according to this invention, an end of the substrate transport path on each of the upper and lower stories is connected to the indexer. To fetch the substrates successively from the cassette placed on the cassette table and deliver the substrates to the treating devices, the substrates may be delivered through the indexer and placed at one of the ends of the substrate transport paths on the respective stories. To receive the substrates having undergone substrate treatment from the treating devices and deposit the substrates successively in a cassette, the treated substrates placed at one of the ends of the substrate transport paths on the respective stories may be transported through the indexer and deposited in the cassette placed on the cassette table in the indexer. Further, the substrates may be transferred between the substrate transport paths on the respective stories through the indexer. With the substrate transport paths arranged on the upper and lower stories, the apparatus does not require an enlarged floor space (footprint) for installation. Further, even when treating a large number of substrates, interference between the substrates may be reduced by sidetracking or transporting the substrates to the treatment transport path on each of the stories through the indexer as necessary. As a result, the efficiency of treatment may be improved compared with the prior art.

Another substrate treating apparatus having a plurality of treating devices for treating substrates, according to this invention, comprises:

substrate transport paths arranged on upper and lower stories for transporting the substrates between the treating devices; and an interface for relaying the substrates between the treating devices and an external treating apparatus disposed adjacent the substrate treating apparatus;

wherein an end of each of the substrate transport paths on the respective stories is connected to the interface.

In the substrate treating apparatus according to this invention, an end of the substrate transport path on each of the upper and lower stories is connected to the interface. The substrates treated in the external treating apparatus may be placed at one of the ends of the substrate transport paths on the respective stories. The substrates transported from one treating device to another for a series of substrate treatments may be placed at one of the ends of the substrate transport paths on the respective stories, and transferred through the interface to the external treating apparatus for treatment by the external treating apparatus. Further, the substrates may be transferred between the substrate transport paths on the respective stories through the interface. As in the case of the foregoing substrate treating apparatus, this apparatus does not require an enlarged footprint. Further, even when treating a large number of substrates, interference between the substrates may be reduced by sidetracking or transporting the substrates to the treatment transport path on each of the stories through the indexer as necessary. As a result, the efficiency of treatment may be improved compared with the prior art.

A further substrate treating apparatus having a plurality of treating devices for treating substrates, according to this invention, comprises:

substrate transport paths arranged on upper and lower stories for transporting the substrates between the treating devices;

an indexer including a cassette table for receiving a cassette containing substrates to be treated, the indexer successively fetching the substrates to be treated from the cassette, delivering the substrates to be treated to the treating devices, receiving treated substrates from the treating devices, and successively depositing the treated substrates in the cassette; and an interface for relaying the substrates between the treating devices and an external treating apparatus disposed adjacent the substrate treating apparatus;

wherein an end of each of the substrate transport paths on the respective stories is connected to the indexer, and the other end of each of the substrate transport paths on the respective stories is connected to the interface.

In the substrate treating apparatus according to this invention, an end of the substrate transport path on each of the upper and lower stories is connected to the indexer, while the other end of the substrate transport path on each of the upper and lower stories is connected to the interface. This construction provides three functions as described hereunder.

In one function, the substrates are transported through the indexer and placed at one end of the substrate transport path on one of the stories. The substrates are then transported through the substrate transport path on that story from one treating device to another for substrate treatment. The substrates having received a series of substrate treatments in the treating devices are placed at the other end of the substrate transport path on that story. The substrates are transferred through the interface to the external treating apparatus to be treated therein.

In the second function, the substrates treated by the external treating apparatus are transported through the interface and placed at the other end of the substrate transport path on one of the stories. The substrates are then transported through the substrate transport path on that story from one treating device to another for substrate treatment. The substrates having received a series of substrate treatments in the treating devices are placed at the one end of the substrate transport path on that story. The substrates are transported through the indexer and deposited in a cassette placed on the cassette table in the indexer.

In the third function, the substrates may be transferred between the substrate transport paths on the respective stories through the indexer or interface.

As in the case of the two preceding substrate treating apparatus, this apparatus does not require an enlarged footprint since the substrate transport paths are arranged on the upper and lower stories. Further, even when treating a large number of substrates, interference between the substrates may be reduced by sidetracking or transporting the substrates to the treatment transport path on each of the stories through the indexer as necessary. As a result, the efficiency of treatment may be improved compared with the prior art.

The substrate treating apparatus having the indexer, i.e. where an end of the substrate transport path on each of the upper and lower stories is connected to the indexer, may have the following preferred construction. A first receiver may be disposed in one of the indexer and the end of the substrate transport path on each of the stories for receiving the substrates for transfer between the indexer and the end of the substrate transport path on each of the stories. Then, the substrate may be transferred easily between the end of the substrate transport path and the indexer through the first receiver.

Similarly, the substrate treating apparatus having the interface, i.e. where an end of the substrate transport path on each of the upper and lower stories is connected to the interface, may have the following preferred construction. A second receiver may be disposed in one of the interface and the end of the substrate transport path on each of the stories for receiving the substrates for transfer between the end of the substrate transport path on each of the stories and the interface. Then, the substrate may be transferred easily between the end of the substrate transport path and the interface through the second receiver.

Since the substrate transport paths are arranged on the upper and lower stories, according to this invention, the above first or second receiver is arranged on the upper and lower stories to extend from an uppermost story to a lowermost story of the substrate transport paths, the first or second receiver being disposed in the indexer or interface.

In a further aspect of the invention, a substrate treating method is provided which uses the substrate treating apparatus with one end of the substrate transport path on each of the stories connected to the indexer, and the other end of the substrate transport path on each of the stories connected to the interface. This method comprises the steps of:

placing substrates to be treated, fetched by the indexer, at one of the ends of the substrate transport paths on the respective stories connected to the indexer;

transporting the substrates along one of the substrate transport paths for substrate treatment in each of the treating devices;

transferring the substrates treated in each of the treating devices to the external treating apparatus through the interface connected to the other ends of the substrate transport paths, for treatment in the external treating apparatus;

placing the substrates treated in the external treating apparatus, through the interface, at one of the other ends of the substrate transport paths on the respective stories connected to the interface; and transporting the substrates along one of the substrate transport paths for substrate treatment in each of the treating devices;

a series of substrate treatments including the treatment by the external treating apparatus being carried out by executing the above steps.

With the substrate treating method according to this invention, substrates to be treated are transported through the indexer and placed at one of the ends of the substrate transport paths on the respective stories connected to the indexer, and the substrates are then transported along one of the substrate transport paths for substrate treatment in each of the treating devices. The substrates treated in each of the treating devices are transferred to the external treating apparatus through the interface connected to the other ends of the substrate transport paths, for treatment in the external treating apparatus. The substrates treated in the external treating apparatus are placed, through the interface, at one of the other ends of the substrate transport paths on the respective stories connected to the interface. The substrates are then transported along one of the substrate transport paths for substrate treatment in each of the treating devices. This substrate treating method can easily carry out a series of substrate treatments including the treatment by the external treating apparatus, through the substrate transport paths connected to the indexer and interface.

With the ends of the substrate transport paths connected to the indexer and interface, the substrate treating method may repeat the series of substrate treatments including the treatment by the external treating apparatus, as follows. The substrates having received the series of substrate treatments including the treatment by the external treating apparatus are transported through the indexer connected to the ends of the substrate transport paths on the respective stories, and placed at one of the ends of the substrate transport paths on the respective stories, to repeat the series of substrate treatments for the substrates placed. Thus, the series of substrate treatments may be repeated advantageously.

To solve the problem (III) noted above, a substrate treating apparatus having a plurality of treating devices for treating substrates, according to this invention, comprises:

an indexer including a cassette table for receiving a cassette containing substrates to be treated, the indexer successively fetching the substrates to be treated from the cassette, delivering the substrates to be treated to the treating devices, receiving treated substrates from the treating devices, and successively depositing the treated substrates in the cassette; and a first testing device disposed in one of the indexer and one of the treating devices adjacent the indexer for testing substrates.

In the above substrate treating apparatus according to this invention, the first testing device is disposed in the indexer or the treating device adjacent the indexer for testing substrates. This construction enables a testing of the condition of the substrates before the substrate treatment or immediately after the substrate treatment. Thus, a reduction may be made in the waiting time of substrates due to interference between the substrates tested and the other substrates. With the first testing device incorporated into the substrate treating apparatus, a reduction may be made in the time taken in transporting the substrates for testing. Thus, the efficiency of treating the substrates including the testing of the substrates is improved.

Another substrate treating apparatus having a plurality of treating devices for treating substrates, according to this invention, comprises:

an interface for relaying the substrates between the treating devices and an external treating apparatus disposed adjacent the substrate treating apparatus; and a second testing device disposed in one of the interface and one of the treating devices adjacent the interface for testing substrates.

In the above substrate treating apparatus, the second testing device is disposed in the interface or the treating device adjacent the interface for testing substrates. This construction enables a testing of the condition of the substrates after treatment in the substrate treating apparatus and before treatment in the external treating apparatus, or immediately after treatment in the external treating apparatus and before treatment in the substrate treating apparatus. Thus, a reduction may be made in the waiting time of substrates due to interference between the substrates tested and the other substrates. With the second testing device incorporated into the substrate treating apparatus, a reduction may be made in the time taken in transporting the substrates for testing. Thus, the efficiency of treating the substrates including the examination of the substrates is improved.

A further substrate treating apparatus having a plurality of treating devices for treating substrates, according to this invention, comprises:

an indexer including a cassette table for receiving a cassette containing substrates to be treated, the indexer successively fetching the substrates to be treated from the cassette, delivering the substrates to be treated to the treating devices, receiving treated substrates from the treating devices, and successively depositing the treated substrates in the cassette; and an interface for relaying the substrates between the treating devices and an external treating apparatus disposed adjacent the substrate treating apparatus;

a first testing device disposed in one of the indexer and one of the treating devices adjacent the indexer for testing substrates; and a second testing device disposed in one of the interface and one of the treating devices adjacent the interface for testing substrates.

In the above substrate treating apparatus, the first testing device is disposed in the indexer or the treating device adjacent the indexer for testing substrates, and the second testing device is disposed in the interface or the treating device adjacent the interface for testing substrates. With this construction, the first testing device can test the condition of the substrates before the substrate treatment or immediately after the substrate treatment, and the second testing device can test the condition of the substrates after the treatment in the substrate treating apparatus and before the treatment in the external treating apparatus, or immediately after the treatment in the external treating apparatus and before the treatment in the substrate treating apparatus. Thus, a reduction may be made in the waiting time of substrates due to interference between the substrates tested and the other substrates. With the first and second testing devices incorporated into the substrate treating apparatus, a reduction may be made in the time taken in transporting the substrates for testing. Thus, the efficiency of treating the substrates including the examination of the substrates is improved.

The substrate treating apparatus having the indexer may have the following preferred construction. The apparatus may comprise a first receiver for receiving the substrates for transfer between the indexer and the one of the treating devices adjacent the indexer, the first testing device being arranged to test the substrates placed in the first receiver. In this case, when transferring the substrates between the indexer and the treating device adjacent the indexer, the first testing device may test the substrates placed in the first receiver. Thus, the substrates may be tested in parallel with the transfer to realize an improved efficiency of treating the substrates.

Similarly, the substrate treating apparatus having the interface may have the following preferred construction. The apparatus may comprise a second receiver for receiving the substrates for transfer between the interface and the one of the treating devices adjacent the interface, the second testing device being arranged to test the substrates placed in the second receiver. In this case, when transferring the substrates between the interface and the treating device adjacent the interface, the second testing device may test the substrates placed in the second receiver. Thus, the substrates may be tested in parallel with the transfer to realize an improved efficiency of treating the substrates.

Where, as in the substrate treating apparatus described above, the substrates are tested in parallel with the transfer, the apparatus preferably has the following construction. Of a plurality of substrates transferred between the indexer or interface and the treating devices, the substrates to be tested in the first or second testing device are transferred through the first or second receiver while the remaining substrates are transferred through a bypass passage without being tested. In this case, the substrates other than the substrates to be tested are transferred between the indexer or interface and the treating devices through the bypass passage without being tested. While certain of the substrates are tested, the remaining substrates may be transferred, to promote the efficiency of treatment.

This feature may be applied also to the substrate treating apparatus having the treating devices arranged on the upper and lower stories to reduce the floor space (footprint) for installing the apparatus. Thus, in a further aspect of the invention, a substrate treating apparatus having a plurality of treating devices for treating substrates, comprises:

a series of substrate transport paths arranged on upper and lower stories for transporting the substrates between the treating devices; and a third testing device disposed at one of a starting point and a terminal point of the substrate transport paths arranged on the respective stories.

In the substrate treating apparatus according to this invention, a series of substrate transport paths is arranged on the upper and lower stories for transporting the substrates between the treating devices, and a third testing device is disposed at a starting point or a terminal point of the substrate transport paths arranged on the respective stories. Thus, a test may be carried out on the condition of a substrate present at the starting point of the substrate transport path on each story, i.e. the condition of a substrate before substrate treatment, or on the condition of a substrate present at the terminal point of the substrate transport path on each story, i.e. the condition of a substrate immediately after the substrate treatment. With the third testing device provided at the starting point or terminal point of the substrate transport paths, a reduction may be made in the waiting time of substrates due to interference between the substrates tested and the other substrates, compared with a case of testing substrates halfway through the substrate transport paths. With the third testing device incorporated into the substrate treating apparatus, a reduction may be made in the time taken in transporting the substrates for testing. Thus, the efficiency of treating the substrates including the testing of the substrates is improved.

To promote the efficiency of treating the substrates, this substrate treating apparatus also, preferably, comprises an indexer, and a third receiver disposed at one of the starting point and the terminal point of the substrate transport paths for receiving the substrates for transfer between the indexer and the treating devices, the third testing device being arranged to test the substrates placed in the third receiver. Further, the substrate treating apparatus, preferably, comprises an interface, and a fourth receiver disposed at one of the starting point and the terminal point of the substrate transport paths for receiving the substrates for transfer between the interface and the treating devices, the third testing device being arranged to test the substrates placed in the fourth receiver.

In the former case, the third testing device can test the substrates, while the substrates are transferred between the indexer and the treating devices through the third receiver disposed at the starting point or terminal point of the substrate transport paths. In the latter case, the third testing device can test the substrates, while the substrates are transferred between the interface and the treating devices through the fourth receiver disposed at the starting point or terminal point of the substrate transport paths.

Also where the substrates are tested while being transferred in the substrate treating apparatus having the treating devices arranged on the upper and lower stories, the following construction is preferred in order to promote the efficiency of treating the substrates. Of a plurality of substrates transferred between the indexer or interface and the treating devices, the substrate to be tested in the third testing device are transferred through the third or fourth receiver while the remaining substrates are transferred through a bypass passage without being tested. In this case, while certain of the substrates are tested, the remaining substrates may be transferred between the indexer and treating devices or between the interface and treating devices.

In order to realize a substrate treating apparatus flexible as to the number of substrates treated, the substrate treating apparatus comprises a plurality of units each including treating devices, and these units are arranged in the direction for transporting the substrates. With this construction, the number of units may be varied according to the number of substrates to be treated. That is, when the number of substrates to be treated is increased, the number of units may be increased by adding a unit or units to an existing substrate treating apparatus as arranged in the direction for transporting the substrates. When the number of substrates to be treated is decreased, the number of units may be decreased by detaching a unit or units from an existing substrate treating apparatus. In this way, the number of units may be varied according to the number of substrates to be treated, by using an existing substrate treating apparatus, thereby realizing a flexible substrate treating apparatus.

These substrate treating apparatus designed to solve the problem (III) noted hereinbefore may comprise a testing unit including at least one of the first, second and third testing devices, the testing unit being juxtaposed with the treating devices in a direction for transporting the substrates. With this construction, the testing unit may be detached from an existing substrate treating apparatus when no testing is required, and may be added to the existing substrate treating apparatus when testing is required. This feature results in a flexible substrate treating apparatus.

In a further aspect of the invention, a substrate treating method is provided which uses the substrate treating apparatus having the first testing device disposed in the indexer or the treating device adjacent the indexer for testing substrates. This method comprises the steps of:

loading the substrates to be treated, through the indexer, into the treating devices for treatment in each of the treating devices;

testing the substrates in the first testing device for results of the treatment in the treating devices; and reloading the substrates found unacceptable, through the indexer, into the treating devices for repeated treatment in each of the treating devices.

With this substrate treating method according to this invention, the substrates are tested in the first testing device for results of the treatment in the treating devices, and the substrates found unacceptable are reloaded, through the indexer, into the treating devices for repeated treatment in each of the treating devices. Thus, the substrates found unacceptable may promptly be treated again (i.e. reworked).

In a further aspect of the invention, a substrate treating method is provided which uses the substrate treating apparatus having the first testing device disposed in the indexer or the treating device adjacent the indexer, and the second testing device disposed in the interface or the treating device adjacent the interface for testing substrates.

This method comprises the steps of:

loading the substrates to be treated, through the indexer, into the treating devices for treatment in each of the treating devices;

transferring the substrates treated in each of the treating devices, through the interface, to the external treating apparatus for treatment in the external treating apparatus;

loading the substrates treated in the external treating apparatus, through the interface, into the treating devices for treatment in each of the treating devices;

testing the substrates in the first testing device for results of the treatment in the treating devices; and reloading the substrates found unacceptable, through the indexer, into the treating devices for repeated treatment in each of the treating devices.

With this substrate treating method according to this invention, the substrates are tested in the first testing device for results of the treatment in the treating devices including the treatment in the external treating apparatus. The substrates found unacceptable are reloaded, through the indexer, into the treating devices for repeated treatment in each of the treating devices. Thus, the substrates found unacceptable may promptly be treated again (i.e. reworked).

In a still further aspect of the invention, a substrate treating method is provided which uses the substrate treating apparatus having the third receiver disposed the starting point or terminal point of the substrate transport paths for transferring the substrates between the indexer and the treating devices. This method comprises the steps of:

placing the substrates to be treated, through the indexer, at the starting point of the substrate transport paths;

transporting the substrates along the substrate transport paths for treatment in each of the treating devices;

placing the substrates treated in each of the treating devices, at the terminal point of the substrate transport paths;

placing the substrates in the third receiver for transfer to the indexer;

testing the substrates in the third testing device for results of the treatment in the treating devices;

placing the substrates found unacceptable, through the indexer, at the starting point of the substrate transport paths again; and transporting the substrates again along the substrate transport paths for repeated treatment in each of the treating devices.

With this substrate treating method according to this invention, the substrates are tested in the third testing device for results of the treatment in each of the treating devices. The substrates found unacceptable are placed again, through the indexer, at the starting point of the substrate transport paths. The substrates thus placed are transported again along the substrate transport paths for repeated treatment. Thus, the substrates found unacceptable may promptly be treated again (i.e. reworked).

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 5A is a plan view showing an outline of an indexer's transport mechanism in the first embodiment;

FIG. 5B is a right-hand side view of FIG. 5A;

FIG. 6A is a plan view of a transport mechanism for heat treatment, anti-reflective coating formation, resist film formation, edge exposure or development in the first embodiment;

FIG. 6B is a right-hand side view of FIG. 6A;

FIG. 7A is a plan view showing the transport mechanism for heat treatment fixed to a predetermined location, and a positional relationship thereof with adjacent components, in the first embodiment;

FIG. 7B is a plan view showing a fixed state of the transport mechanism for anti-reflective coating formation or development disposed adjacent an indexer;

FIG. 8A is a plan view showing the transport mechanism for resist film formation or development disposed adjacent an interface and fixed to a predetermined location, and a positional relationship thereof with adjacent components, in the first embodiment;

FIG. 8B is a plan view showing a fixed state of the transport mechanism for edge exposure;

FIG. 14 is a view showing a relationship between positions of substrates in the series of substrate treatments, and the transport mechanisms that transport the substrates;

FIG. 21 is a view showing a relationship between positions of substrates to be inspected in the series of substrate treatments, and the transport mechanisms that transport these substrates;

FIG. 22 is a view showing a relationship between positions of substrates not to be inspected in the series of substrate treatments, and the transport mechanisms that transport these substrates;

DESCRIPTION OF THE PREFERRED EMBODIMENTS

Preferred embodiments of this invention will be described in detail hereinafter with reference to the drawings.

First Embodiment

Figure 1:
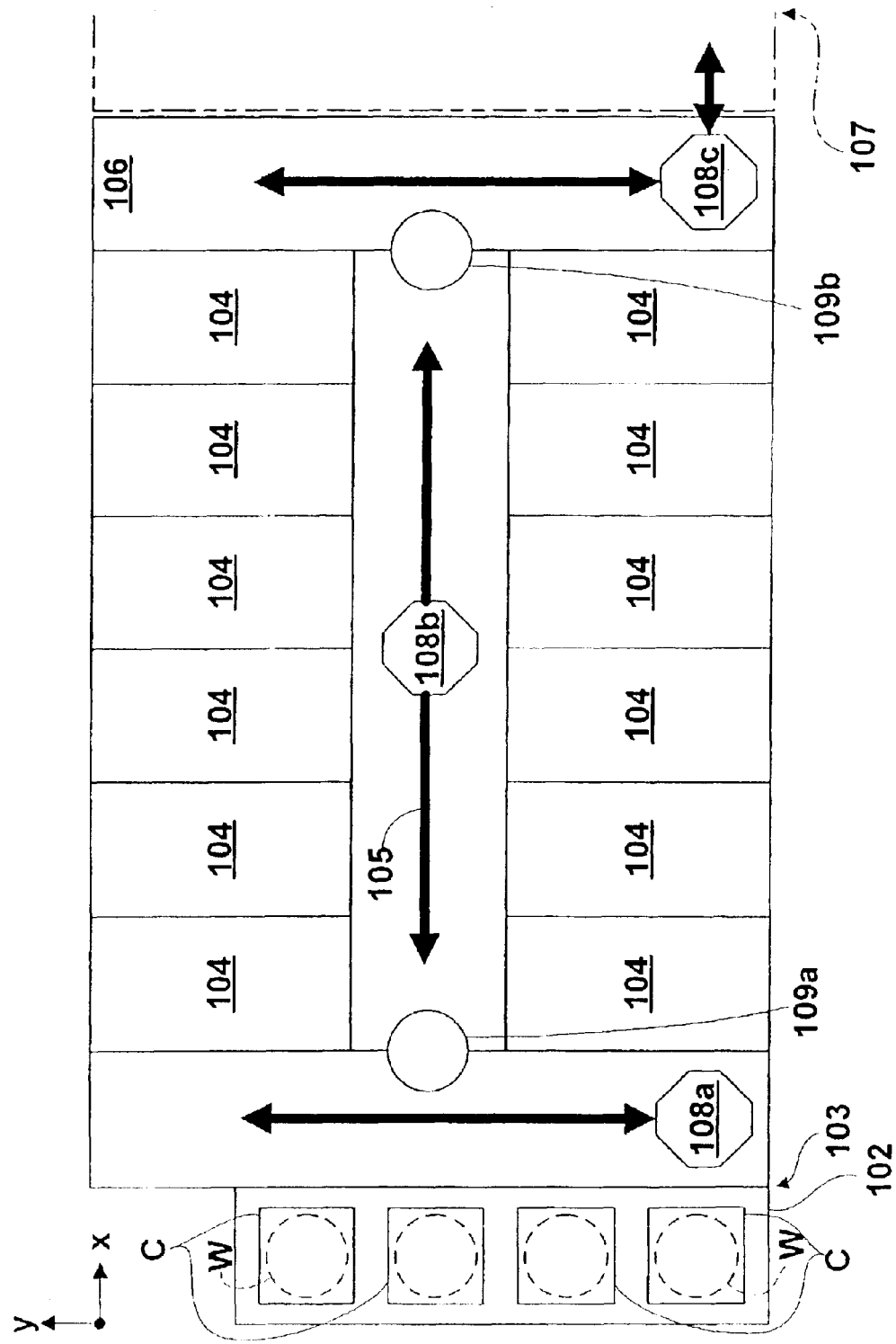
FIG. 1 is a block diagram showing the construction of a conventional substrate treating apparatus.
Figure 2:
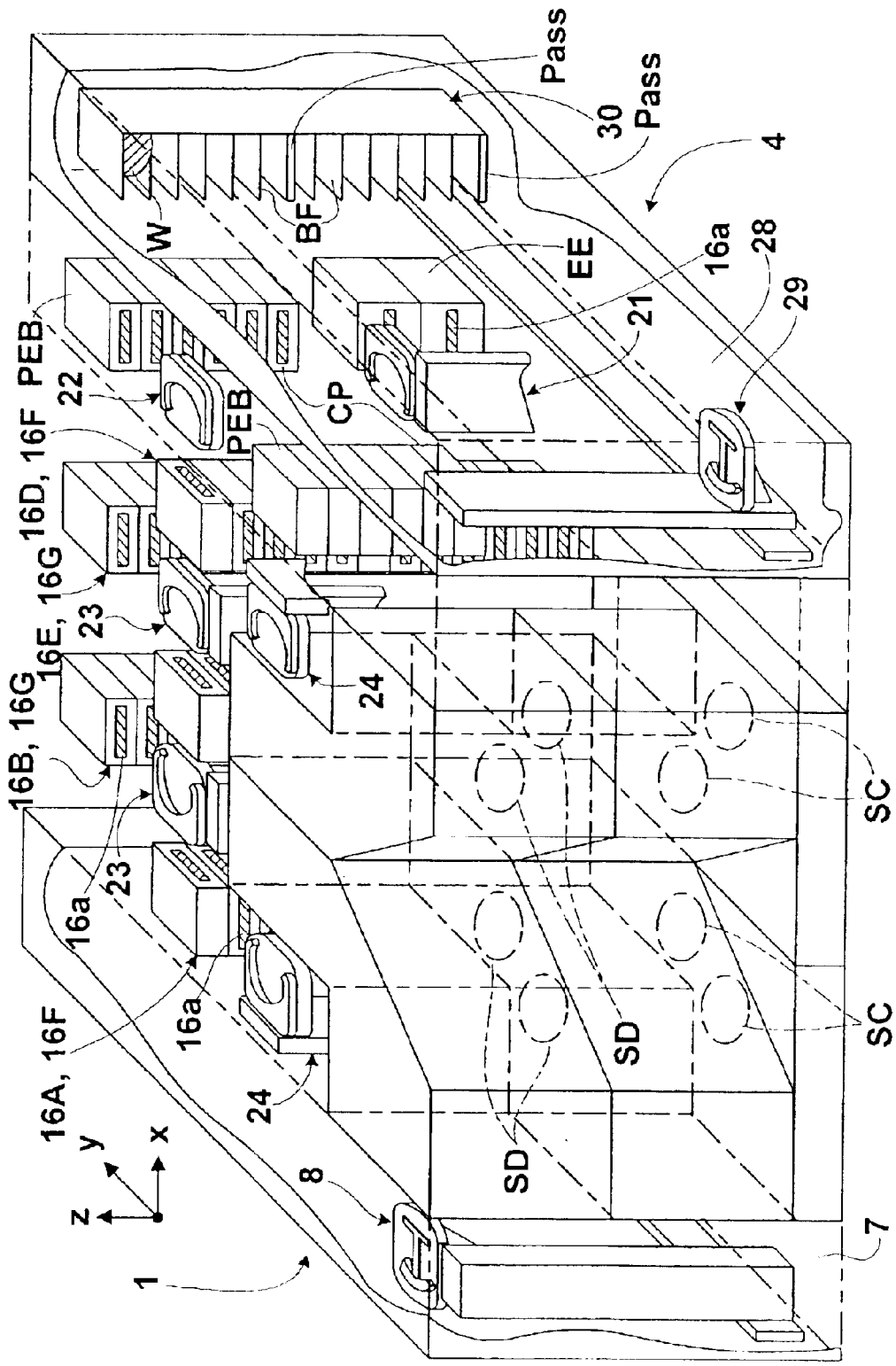
FIG. 2 is a perspective view showing an outline of a substrate treating apparatus in a first embodiment of the invention.
Figure 3:
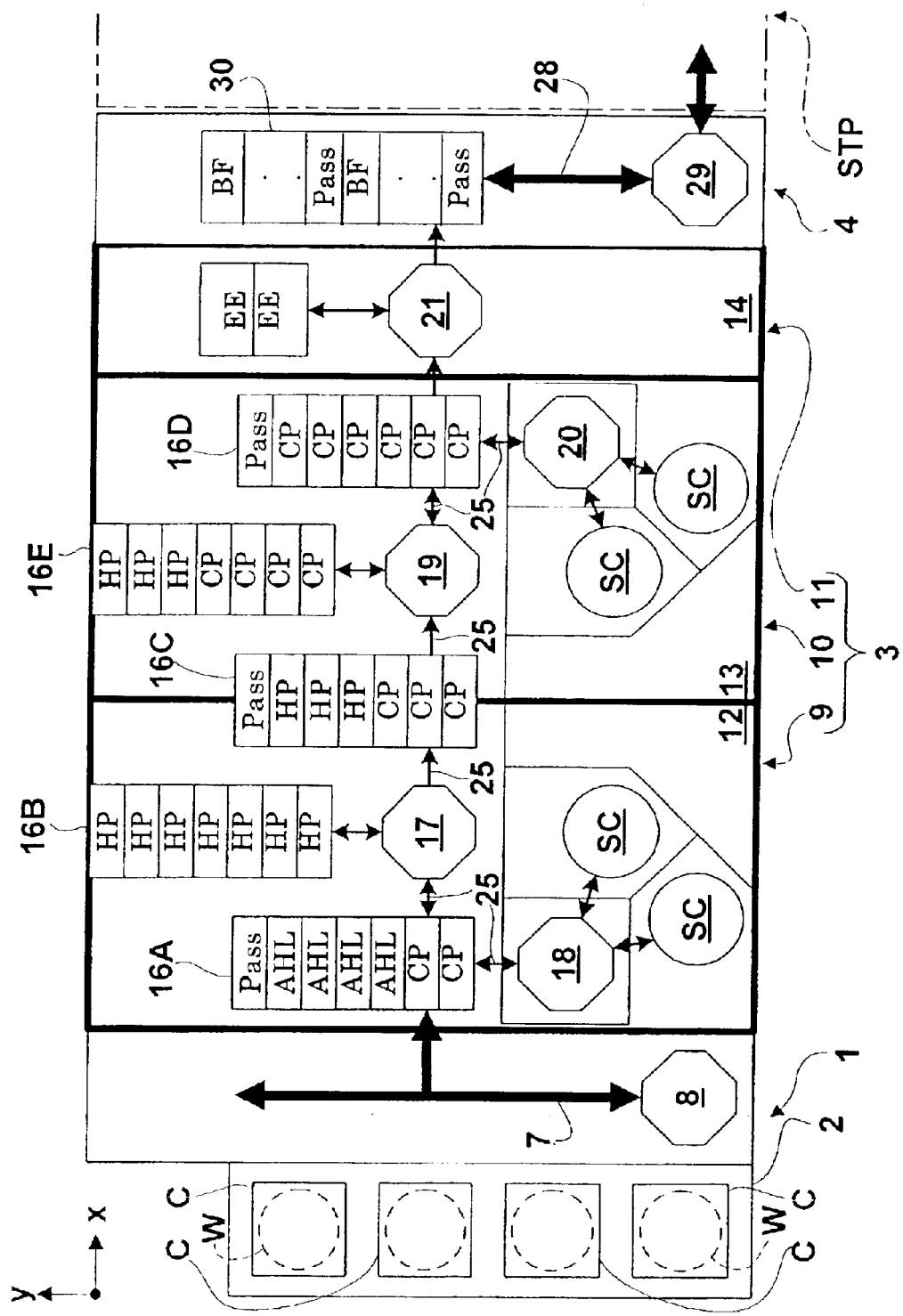
FIG. 3 is a block diagram seen in plan view of a first story of the substrate treating apparatus in the first embodiment.
Figure 4:
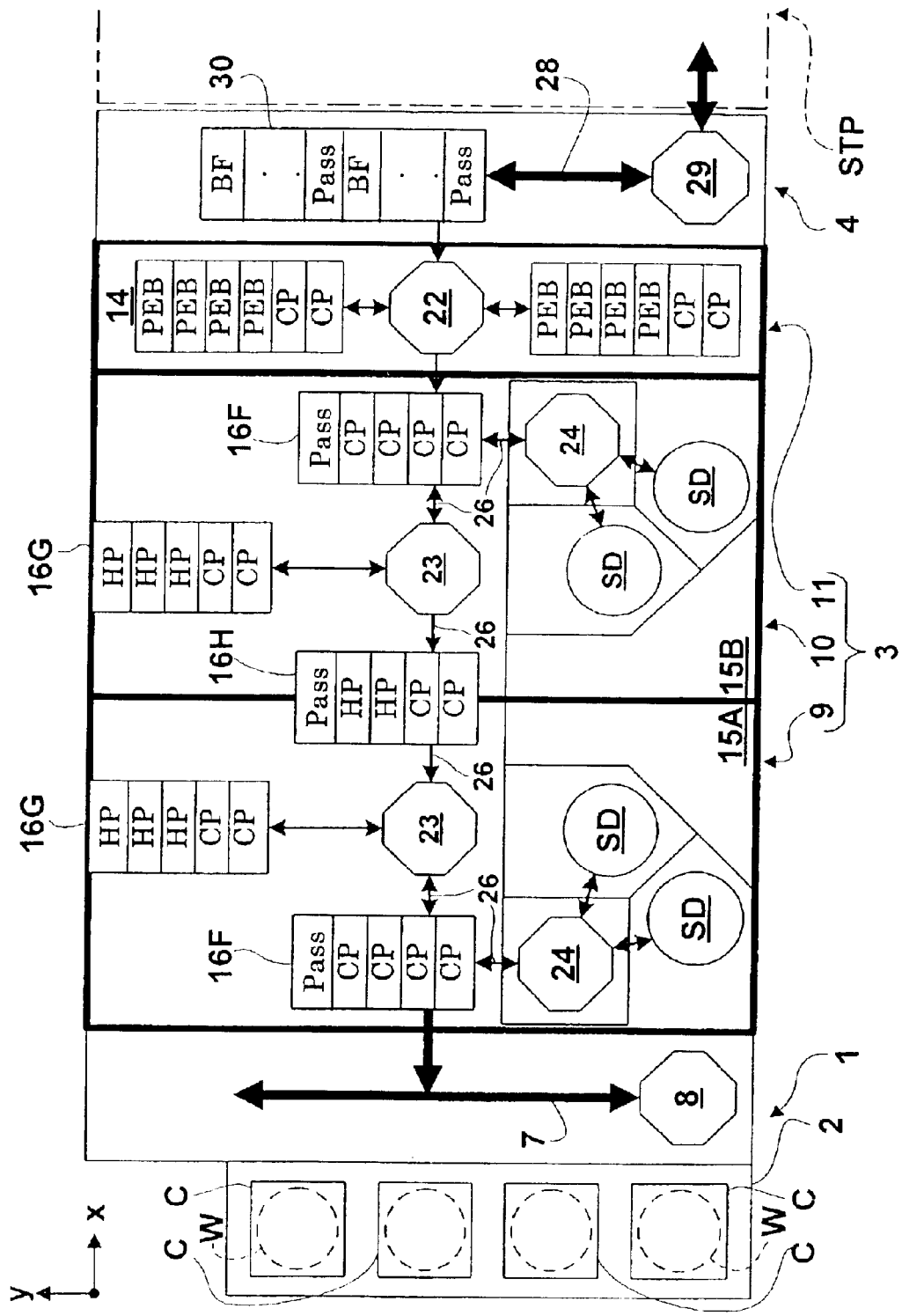
FIG. 4 is a block diagram seen in plan view of a second story of the substrate treating apparatus in the first embodiment.

FIG. 2 is a perspective view showing an outline of a substrate treating apparatus in a first embodiment. FIG. 3 is a block diagram seen in plan view of a first story of the substrate treating apparatus. FIG. 4 is a block diagram seen in plan view of a second story of the substrate treating apparatus. For expediency of illustration, FIG. 2 does not show a cassette table for receiving cassettes each containing or for containing substrates in multiple stages. FIGS. 3 and 4 present, in a developed plan, heat-treating modules and an interface rack arranged vertically as described hereinafter. Note that the first embodiment includes one indexer and one interface shown in FIGS. 3 and 4; they are not provided for each story. Substrate treatment in the first embodiment will be described, taking for example spin coaters for performing resist application while spinning substrates in a photolithographic process, and spin developers for performing development while spinning the substrates having undergone an exposing process.

As shown in FIGS. 2 through 4, the substrate treating apparatus in the first embodiment includes an indexer 1, a processing unit 3 and an interface 4. In the first embodiment, the interface 4 connects the processing unit 3 for performing the resist application and development, and an exposing apparatus acting as an external treating apparatus for exposing the substrates (e.g. a stepper for performing step-and-repeat exposure).

A specific construction of the indexer 1 will be described next. As shown in FIGS. 2 through 4, the indexer 1 includes a cassette table 2, an indexer's transport path 7 and an indexer's transport mechanism 8. The cassette table 2 is constructed for receiving thereon a plurality of (four in FIGS. 3 and 4) cassettes C each containing a plurality of (e.g. 25) wafers W to be treated or wafers W already treated. The transport path 7 extends horizontally along the cassette table 2 having the plurality of cassettes C placed thereon. The transport mechanism 8 is movable vertically, and horizontally along the transport path 7, for transferring the wafers W between the cassettes C on the cassette table 2 and the processing unit 3. More particularly, the transport mechanism 8 successively fetches wafers W to be treated from the cassettes C placed on the cassette table 2 and delivers these wafers W to the processing unit 3, and receives treated wafers W from the processing unit 3 and successively deposits the treated wafers W in predetermined cassettes C on the cassette table 2. This cassette table 2 corresponds to the cassette table of this invention.

A specific construction of the indexer's transport mechanism 8 will be described next with reference to FIG. 5. As shown in the plan view of FIG. 5A and right-hand side view of FIG. 5B, the transport mechanism 8 includes a y-axis moving mechanism 8b for horizontally moving an arm base 8a in the directions of arrow RA along the indexer's transport path 7 (y-direction), a z-axis lift mechanism 8c for vertically moving the arm base 8a in the directions of arrow RB (z-direction), and a rotating mechanism 8d for rotating the arm base 8a about the z-axis (in directions of arrow RC). The arm base 8a has an arm 8e for holding a wafer W. This arm 8e is constructed extendible and retractable radially of the rotation (in directions of arrow RD).

As shown in FIG. 5A, the y-axis moving mechanism 8b has a screw shaft 8f, and a motor 8g for rotating the screw shaft 8f about its axis. The z-axis lift mechanism 8c is meshed at a proximal end thereof with the screw shaft 8f. By rotation of motor 8g, the z-axis lift mechanism 8c attached to the screw shaft 8f is moved horizontally.

As shown in FIG. 5B, the z-axis lift mechanism 8c, as does the y-axis moving mechanism 8b, has a screw shaft 8h, and a motor 8i for rotating the screw shaft 8h about its axis. The above rotating mechanism 8d is meshed at a proximal end thereof with the screw shaft 8h. By rotation of motor 8i, the rotating mechanism 8d attached to the screw shaft 8h is moved vertically.

As shown in FIG. 5B, the rotating mechanism 8d has the arm base 8a, a motor 8j for rotating the arm base 8a about its axis, and a support member 8k for supporting the arm base 8a and motor 8j. By rotation of motor 8j, the arm base 8a is rotated along with the arm 8e in a horizontal plane.

With this construction, the wafer W held by the arm 8e of arm base 8a may be moved horizontally along the cassette table 2, moved up and down, rotated in a horizontal plane, and extended and retracted in a horizontal plane.

A specific construction of the processing unit 3 will be described with reference to FIGS. 2 through 4. As shown in FIGS. 3 and 4, the processing unit 3 includes a first treating unit 9, a second treating unit 10 and a third treating unit 11 arranged in this order from the indexer 1. The first to third treating units 9–11 correspond to the substrate treating units of this invention.

Each of the first to third treating units 9–11 extends from the first story to the second story. As shown in FIG. 3, the first treating unit 9 has an anti-reflective coating forming cell 12 disposed on the first story and including spin coaters (referenced "SC" in FIG. 3) and heat-treating columns for forming a bottom anti-reflective coating on wafers W in order to prevent a reflection of light from photoresist film formed on the wafers W. The second treating unit 10 has a resist film forming cell 13 disposed on the first story and including spin coaters and heat-treating columns for forming photoresist film on wafers W while spinning the wafers W. The third treating unit 11 has a post-exposure baking cell 14 disposed on the first story for heating exposed wafers W (Post Exposure Bake referenced "PEB" in FIG. 4). The spin coaters SC for forming the anti-reflective coating and resist film correspond to the coating device of this invention. The spin coaters SC in the anti-reflective coating forming cell 12 correspond to the anti-reflective coating forming device of this invention. The spin coaters SC in the resist film forming cell 13 correspond to the resist film forming device of this invention.

As shown in FIG. 4, the first treating unit 9 has a developing cell 15A disposed on the second story and including spin developers (referenced "SD" in FIG. 4) for developing exposed wafers W while spinning the wafers W, and heat-treating columns. The second treating unit 10 has a developing cell 15B, similar to the developing cell 15A, disposed on the second story. The third treating unit 11 has a post-exposure baking cell 14 on the second story as on the first story. The spin developers SD in the developing cells 15 correspond to the developing device of this invention.

As described above, the anti-reflective coating forming cell 12 and the developing cell 15A adjacent the indexer 1 constitute the first treating unit 9. The resist film forming cell 13 and the developing cell 15B adjacent the interface 4 constitute the second treating unit 10. The two post-exposure baking cells 14 on the first and second stories constitute the third treating unit 11.

A specific construction of the anti-reflective coating forming cell 12 will be described next. As shown in FIG. 3, the anti-reflective coating forming cell 12 includes three heat-treating columns 16A, 16B and 16C, a transport mechanism 17 for heat treatment for transporting wafers W between these heat-treating columns 16A, 16B and 16C, two spin coaters SC for applying the anti-reflective coating to the wafers W, and a transport mechanism 18 for anti-reflective coating formation for transporting wafers W between the heat-treating column 16A and two spin coaters SC.

As shown in FIG. 3, the three heat-treating columns 16A, 16B and 16C are arranged in three positions around and opposed to the transport mechanism 17 for heat treatment. Each of the heat-treating columns 16A, 16B and 16C has a vertical multi-stage structure.

The heat-treating column 16A disposed adjacent the indexer 1 includes, stacked from bottom to top, two cooling modules (referenced "CP" in FIG. 3) for cooling heated wafers W and maintaining the wafers W at room temperature, four adhesion promoting modules (referenced "AHL" in FIG. 3) for promoting adhesion of the photoresist film to the wafers W, and a substrate rest (referenced "Pass" in FIG. 3) for transferring wafers W without heat-treating the wafers W. In the adhesion promoting treatment, wafers W are treated with HMDS [$(CH_3)_3SiNHSi(CH_3)_3$] in vapor form before resist application.

This heat-treating column 16A has also a function to transfer wafers W between the transport mechanism 8 of indexer 1, the transport mechanism 17 for heat treatment and the transport mechanism 18 for anti-reflective coating formation by using the substrate rest "Pass", adhesion promoting modules AHL and cooling modules CP. That is, the indexer's transport mechanism 8 and the transport mechanism 17 for heat treatment transfer wafers W through the substrate rest "Pass". The substrate rest "Pass" has openings 16a (FIG. 10) formed only in surfaces thereof opposed to the indexer's transport mechanism 8 and the transport mechanism 17 for heat treatment to allow the respective transport mechanisms access to the substrate rest "Pass". The transport mechanism 17 for heat treatment and the transport mechanism 18 for anti-reflective coating formation transfer wafers W through the cooling modules CP. The cooling modules CP have openings 16a (FIG. 10) formed only in surfaces thereof opposed to the transport mechanism 17 for heat treatment and the transport mechanism 18 for anti-reflective coating formation to allow the respective transport mechanisms access to the cooling modules CP. The adhesion promoting modules AHL transfer wafers W only to and from the transport mechanism 17 for heat treatment, and therefore have openings 16a (FIG. 10) formed only in surfaces thereof opposed to the transport mechanism 17 to allow it access to the adhesion promoting modules AHL.

The substrate rest "Pass" in this heat-treating column 16A is a rest for transferring wafers W between the indexer 1 and treating transport paths 25 described hereinafter. The substrate rest "Pass" in the heat-treating column 16A and a substrate rest "Pass" in a heat-treating column 16F described hereinafter correspond to the first receiver of this invention.

The heat-treating column 16B has an opening 16a (see FIGS. 2 and 10) formed in each stage and opposed to the transport mechanism 17 for heat treatment. The transport mechanism 17 for heat treatment transports wafers W into and out of the heat-treating column 16B through these openings 16a. The heat-treating column 16B includes seven heating modules (referenced "HP" in FIG. 3) stacked vertically for heating the wafers W.

The heat treating column 16C bridges the anti-reflective coating forming cell 12 and resist film forming cell 13. Thus, the heat treating column 16C is shared by the anti-reflective coating forming cell 12 and resist film forming cell 13. The heat-treating column 16C includes, stacked from bottom to top, three cooling modules CP similar to those in the heat-treating column 16A, three heating modules HP similar to those in the heat-treating column 16B, and a substrate rest "Pass" similar to that in the heat-treating column 16A.

In the first embodiment, the three cooling modules CP are used as part of the anti-reflective coating forming cell 12, and the three heating modules HP as part of the resist film forming cell 13. The substrate rest "Pass" of the heat-treating column 16C has openings 16a (FIG. 10) formed only in surfaces thereof opposed to the transport mechanism 17 for heat treatment and a transport mechanism 19 for heat treatment disposed in the resist forming cell 13, described hereinafter, to enable a transfer of wafers W between these transport mechanisms 17 and 19. The three cooling modules CP of the heat-treating column 16C have openings 16a formed only in surfaces thereof opposed to the transport mechanism 17 for heat treatment to transfer wafers W only to and from the transport mechanism 17. Similarly, the three heating modules HP of the heat-treating column 16C have openings 16a formed only in surfaces thereof opposed to the transport mechanism 19 for heat treatment to transfer wafers W only to and from the transport mechanism 19.

The substrate rest "Pass" in this heat-treating column 16C is a rest for transferring wafers W between the anti-reflective coating forming cell 12 and resist film forming cell 13 arranged adjacent each other. The substrate rest "Pass" in this heat-treating column 16C and a substrate rest "Pass" in a heat-treating column 16H described hereinafter correspond to the receiver of this invention.

The spin coaters SC in the anti-reflective coating forming cell 12 are constructed to form the anti-reflective coating on the wafers W while spinning the wafers W as noted hereinbefore. Specifically, each spin coater SC includes a spin chuck for holding and spinning a wafer W in a horizontal plane, and a nozzle for delivering an anti-reflective coating solution. The anti-reflective coating solution is delivered from the nozzle toward the center of wafer W held and spun by the spin chuck. The centrifugal force of wafer W spreads the anti-reflective coating solution from the center to form the anti-reflective coating over the entire surface of wafer W.

The transport mechanism 17 for heat treatment, the transport mechanism 18 for anti-reflective coating formation, the transport mechanism 19 for heat treatment, a transport mechanism 20 for resist film formation, a transport mechanism 21 for edge exposure, a transport mechanism 23 for heat treatment, and a transport mechanism 24 for development, all have the same construction. The construction of these transport mechanisms will particularly be described hereinafter.

A specific construction of the resist film forming cell 13 will be described next. As shown in FIG. 3, the resist film forming cell 13 includes three heat-treating columns 16C, 16D and 16E, a transport mechanism 19 for heat treatment for transporting wafers W between these heat-treating columns 16C, 16D and 16E, two spin coaters SC for applying the resist film to the wafers W, and a transport mechanism 20 for resist film formation for transporting wafers W between the heat-treating column 16D and two spin coaters SC.

As shown in FIG. 3, and as in the anti-reflective coating forming cell 12, the three heat-treating columns 16C, 16D and 16E are arranged in three positions around and opposed to the transport mechanism 19 for heat treatment. Each of the heat-treating columns 16C, 16D and 16E has a vertical multi-stage structure.

The heat-treating column 16D disposed adjacent the third treating unit 11 includes six cooling modules CP and a substrate rest "Pass" stacked from bottom to top.

This heat-treating column 16D has also a function to transfer wafers W through the substrate rest "Pass" between the transport mechanism 19 for heat treatment and the transport mechanism 21 for edge exposure to be described hereinafter. That is, the transport mechanism 19 for heat treatment and the transport mechanism 21 for edge exposure transfer wafers W through the substrate rest "Pass". The substrate rest "Pass" has openings 16a (FIG. 10) formed only in surfaces thereof opposed to the transport mechanism 19 for heat treatment and the transport mechanism 21 for edge exposure to allow the respective transport mechanisms access to the substrate rest "Pass". The cooling modules CP have openings 16a (FIGS. 2 and 10) formed only in surfaces thereof opposed to the transport mechanism 19 for heat treatment and the transport mechanism 21 for edge exposure to allow the respective transport mechanisms access to the cooling modules CP.

The heat-treating column 16E has an opening 16a (FIGS. 2 and 10) formed in each stage and opposed to the transport mechanism 19 for heat treatment. The transport mechanism 19 for heat treatment transports wafers W into and out of the heat-treating column 16E through these openings 16a. As does the heat-treating column 16B in the anti-reflective coating forming cell 12, the heat-treating column 16E includes four cooling modules CP and three heating modules HP stacked from bottom to top.

As described hereinbefore, the heat treating column 16C bridges the anti-reflective coating forming cell 12 and resist film forming cell 13. Thus, the heat treating column 16C is shared by the anti-reflective coating forming cell 12 and resist film forming cell 13. That is, the heat-treating column 16C is also the heat treating column 16C in the anti-reflective coating forming cell 12. The construction of the heat-treating column 16C will not be described again.

The spin coaters SC in the resist film forming cell 13 have the same construction as the spin coaters SC in the anti-reflective coating forming cell 12 except that a photoresist solution is delivered to form photoresist film. Thus, the spin coaters SC in the resist film forming cell 13 will not be described.

A specific construction of the post-exposure baking cell 14 on the first story will be described next. As shown in FIG. 3, the post-exposure baking cell 14 on the first story includes two edge exposure units (referenced "EE" in FIG. 3) for exposing edges of wafers W before an exposing process, and the transport mechanism 21 for edge exposure for transferring wafers W between the heat-treating column 16D, the two edge exposure units EE and a rack 30 in the interface 4.

The two edge exposure units EE are stacked vertically in the position shown in FIG. 3. As do the heat-treating columns 16, each edge exposure unit EE has an opening 16a (FIGS. 2 and 10) opposed to the transport mechanism 21 for edge exposure. The transport mechanism 21 for edge exposure transports wafers W into and out of the edge exposure units EE through these openings 16a.

A specific construction of the post-exposure baking cell 14 on the second story will be described next. As shown in FIG. 4, the post-exposure baking cell 14 on the second story includes eight post-exposure baking modules (referenced "PEB" in FIG. 4) for heating exposed wafers W, four cooling modules CP, and a transport mechanism 22 for post-exposure bake for transporting wafers W between the post-exposure baking modules PEB, the cooling modules CP, the rack 30 in the interface 4 described hereinafter, and the heat-treating column 16F in the developing cell 15B described hereinafter.

As shown in FIG. 4, the eight post-exposure baking modules PEB and four cooling modules CP are each divided into halves (i.e. two cooling modules CP and four post-exposure baking modules PEB) to be stacked from bottom to top, and opposed to the transport mechanism 22 for post-exposure bake. Each of the post-exposure baking modules PEB and cooling modules CP has an opening 16a (FIGS. 2 and 10) opposed to the transport mechanism 22 for post-exposure bake. The transport mechanism 22 for post-exposure bake transports wafers W into and out of the post-exposure bake modules PEB and cooling modules CP through the openings 16a. The construction of the transport mechanism 22 for post-exposure bake will also be described hereinafter.

A specific construction of the developing cells 15 (15A and 15B) will be described next. Of the developing cells 15, the developing cell 15B adjacent the interface 4, as shown in FIG. 4, includes three heat-treating columns 16F, 16G and 16H, a transport mechanism 23 for heat treatment for transporting wafers W between the heat-treating columns 16F, 16G and 16H, two spin developers SD for developing exposed wafers W while spinning the wafers W, and a transport mechanism 24 for development for transporting wafers W between the heat-treating column 16F and two spin developers SD.

As shown in FIG. 4, the three heat-treating columns 16F, 16G and 16H are arranged in three positions around and opposed to the transport mechanism 23 for heat treatment. Each of the heat-treating columns 16F, 16G and 16H has a vertical multi-stage structure.

The heat-treating columns 16F disposed adjacent the third treating unit 11, or adjacent the interface 4, has four cooling modules CP and the substrate rest "Pass" stacked in order from the bottom.

The heat-treating column 16F has also a function to transfer wafers W through the substrate rest "Pass" between the transport mechanism 23 for heat treatment and the transport mechanism 22 for post-exposure bake. That is, the transport mechanism 23 for heat treatment and the transport mechanism 21 for post-exposure bake transfer wafers W through the substrate rest "Pass". The substrate rest "Pass" has openings 16a (FIGS. 2 and 10) formed only in surfaces thereof opposed to the transport mechanism 23 for heat treatment and the transport mechanism 22 for post-exposure bake to allow the respective transport mechanisms access to the substrate rest "Pass". The four cooling modules CP have openings 16a (FIGS. 2 and 10) formed only in surfaces thereof opposed to the transport mechanism 23 for heat treatment and the transport mechanism 24 for development to allow the respective transport mechanisms access to the cooling modules CP.

The heat-treating column 16G has an opening 16a (FIGS. 2 and 10) formed in each stage and opposed to the transport mechanism 23 for heat treatment. The transport mechanism 23 for heat treatment transports wafers W into and out of the heat-treating column 16G through these openings 16a. The heat-treating column 16G includes two cooling modules CP and three heating modules HP stacked in order from the bottom.

The heat-treating column 16H bridges the developing cells 15A and 15B. Thus, the heat-treating column 16H is shared by the developing cells 15A and 15B. The heat-treating column 16H includes two cooling modules CP, two heating modules HP and one substrate rest "Pass" stacked in order from the bottom.

In the first embodiment, the second cooling module CP from the bottom and the heating module HP at the fourth stage from the bottom are used as part of the developing cell 15B, and the first cooling module CP from the bottom and the heating module HP at the third stage from the bottom as part of the developing cell 15A. The substrate rest "Pass" of the heat-treating column 16H has openings 16a (FIGS. 2 and 10) formed only in surfaces thereof opposed to the transport mechanism 23 for heat treatment and a transport mechanism 23 for heat treatment disposed in the developing cell 15A, described hereinafter, to enable a transfer of wafers W between these transport mechanisms 23. The cooling module CP and heating module HP of the heat-treating column 16H used as part of the developing cell 15B have openings 16a formed only in surfaces thereof opposed to the transport mechanism 23 for heat treatment in the developing cell 15B to allow the transport mechanism 23 access to these modules CP and HP for transfer of wafers W. Similarly, the cooling module CP and heating module HP of the heat-treating column 16H used as part of the developing cell 15A have openings 16a formed only in surfaces thereof opposed to the transport mechanism 23 for heat treatment in the developing cell 15A to allow the transport mechanism 23 access to these modules CP and HP for transfer of wafers W.

The developing cell 15A adjacent the indexer 1 has the same construction as the developing cell 15B adjacent the interface 4, except that the two developing cells 15A and 15B are symmetrical (with respect to an yz plane). Thus, the developing cell 15A will not be described. The heat-treating column 16F in the developing cell 15A has a function to transfer wafers W through the cooling modules CP between the transport mechanism 23 for heat treatment and the transport mechanism 24 for development, and a function to transfer wafers W through the substrate rest "Pass" between the transport mechanism 23 for heat treatment and the indexer's transport mechanism 8. That is, the cooling modules CP of the heat-treating column 16F have openings 16a formed only in surfaces thereof opposed to the transport mechanism 23 for heat treatment and the transport mechanism 24 for development. The substrate rest "Pass" has openings 16a formed only in surfaces thereof opposed to the transport mechanism 23 for heat treatment and the indexer's transport mechanism 8. The reason for providing the two developing cells 15 (developing cells 15A and 15B) is that, while two wafers W are processed by the two spin developers SD in one developing cell 15, other wafers W having undergone the post-exposure baking treatment may be processed by the spin developers SD in the other developing cell 15.

As described above, the processing unit 3 includes the first treating unit 9 having the anti-reflective coating forming cell 12 and developing cell 15A, the second treating unit 10 having the resist film forming cell 13 and developing cell 15B, and the third treating unit 11 having the post-exposure baking cell 14 on the first story and the post-exposure baking cell 14 on the second story.

On the first story, the transport mechanism 17 for heat treatment and the transport mechanism 19 for heat treatment transfer wafers W to and from heat-treating column 16C among the heat-treating columns 16 (16A–16G). Thus, these transport mechanisms 17 and 19 share the heat-treating column 16C. The transport mechanism 17 for heat treatment and the transport mechanism 18 for anti-reflective coating formation transfer wafers W to and from the heat-treating column 16A. These transport mechanisms 17 and 18 share the heat-treating column 16A. The transport mechanism 19 for heat treatment, the transport mechanism 20 for resist film formation and the transport mechanism 21 for edge exposure transfer wafers W to and from the heat-treating column 16D. These transport mechanisms 19, 20 and 21 share the heat-treating column 16D. That is, the transport mechanisms 17–21 are arranged with the heat-treating columns 16A, 16C and 16D in between, to form treating transport paths 25 for transporting wafers W between the heat-treating columns 16 and spin coaters SC. The wafers W are transferred and transported along the treating transport paths 25 in the directions indicated by arrows in FIG. 3. The treating transport paths 25 constitute to a substrate transport path of this invention.

On the second story, the transport mechanisms 23 for heat treatment in the developing cell 15A and developing cell 15B transfer wafers W to and from the heat-treating column 16H among the heat-treating columns 16 (16A–16G). Thus, these transport mechanisms 23 share the heat-treating column 16H. The transport mechanism 22 for post-exposure bake, the transport mechanism 23 for heat treatment in the developing cell 15B and the transport mechanism 24 for development in developing cell 15B transfer wafers W to and from the heat-treating column 16F in the developing cell 15B. These transport mechanisms 22–24 share the heat-treating column 16F. The transport mechanism 23 for heat treatment in the developing cell 15A and the transport mechanism 24 for development in the developing cell 15A transfer wafers W to and from the heat-treating column 16F in the developing cell 15A. These transport mechanisms 23 and 24 share the heat-treating column 16F. That is, the transport mechanisms 22–24 are arranged with the heat-treating columns 16F and 16H in between, to form treating transport paths 26 for transporting wafers W between the heat-treating columns 16 and spin developers SD. The wafers W are transferred and transported along the treating transport paths 26 in the directions indicated by arrows in FIG. 4. The treating transport paths 26 also constitute a substrate transport path of this invention.

That is, the treating transport paths 25 and 26 are arranged on the two, upper and lower stories. One end of the treating transport paths 25 on the first story and one end of the treating transport paths 26 on the second story (at the left-hand ends of FIGS. 3 and 4) are connected to the indexer 1, respectively. The other end of the treating transport paths 25 on the first story and the other end of the treating transport paths 26 on the second story (at the right-hand ends of FIGS. 3 and 4) are connected to the interface 4, respectively. These treating transport paths 25 and 26 have opposite substrate transport directions. The treating transport paths 25 constitute a going-only path for transporting wafers W forward (in the direction departing from the indexer 1 in the first embodiment). The treating transport paths 26 constitute a return-only path for transporting the wafers W in the reversed direction (in the direction returning to the indexer 1 in the first embodiment).

A specific construction of the transport mechanisms 17–21, 23 and 24 will be described next with reference to FIGS. 6 through 8. These transport mechanisms have the same construction as noted hereinbefore, and only the transport mechanism 17 for heat treatment will be described. As shown in the plan view of FIG. 6A and the right-hand side view of FIG. 6B, the transport mechanism 17 for heat treatment includes a rotating mechanism 17b for rotating an arm base 17a about a z-axis (in directions of arrow RE), and a z-axis lift mechanism 17c for vertically moving the arm base 17a in the directions of arrow RF (z-direction). The arm base 17a has an arm 17d for holding a wafer W. This arm 17d is constructed extendible and retractable radially of the rotation (in directions of arrow RG).

As shown in FIG. 6B, and as does the rotating mechanism 8d of the indexer's transport mechanism 8, the rotating mechanism 17b has a motor 17e for rotating the arm base 17a, and a support member 17f for supporting the arm base 17a and motor 17e.

As shown in FIG. 6B, the z-axis lift mechanism 17c has a screw shaft 17g, and a motor 17h for rotating the screw shaft 17g. The above rotating mechanism 17b is meshed at a proximal end thereof with the screw shaft 17g. By rotation of motor 17h, the rotating mechanism 17b attached to the screw shaft 17g is moved vertically. The z-axis lift mechanism 17c is fixedly erected on an apparatus base, and does not move horizontally as does the z-axis lift mechanism 8c of the indexer's transport mechanism 8.

With this construction, the wafer W held by the arm 17d of arm base 17a is rotatable in a horizontal plane, vertically movable, and extendible and retractable. As shown in FIG. 7A, the z-axis lift mechanism 17c is fixed in a direction toward the spin coaters SC, other than the three directions toward the heat-treating columns 16A, 16B and 16C. Thus, the transport mechanism 17 for heat treatment transfers wafers W between the heat-treating columns 16A, 16B and 16C.

As does the transport mechanism 17 for heat treatment, each of the transport mechanism 19 for heat treatment and the transport mechanisms 23 for heat treatment has the z-axis lift mechanism 17c fixed in the same direction as shown in FIG. 7A. That is, the transport mechanism 19 for heat treatment has the z-axis lift mechanism 17c fixed in a direction toward the spin coaters SC. Each transport mechanism 23 for heat treatment has the z-axis lift mechanism 17c fixed in a direction toward the spin developers SD.

Each of the transport mechanism 18 for anti-reflective coating formation and the transport mechanism 24 for development in the developing cell 15A disposed adjacent the indexer 1 has a z-axis lift mechanism 18c or 24c fixed in a direction as shown in FIG. 7B, i.e. toward the indexer 1. Thus, the transport mechanism 18 for anti-reflective coating formation transfers wafers W between the spin coaters SC and heat-treating column 16A. The transport mechanism 24 for development transfers wafers W between the spin developers SD and heat-treating column 16F.

Each of the transport mechanism 20 for resist film formation and the transport mechanism 24 for development in the developing cell 15B disposed adjacent the interface 4 has a z-axis lift mechanism 20c or 24c fixed in a direction as shown in FIG. 8A, i.e. toward the interface 4. Thus, the transport mechanism 20 for resist film formation transfers wafers W between the spin coaters SC and heat-treating column 16D. The transport mechanism 24 for development transfers wafers W between the spin developers SD and heat-treating column 16F.

As shown in FIG. 8B, the transport mechanism 21 for edge exposure has a z-axis lift mechanism 21c fixed to a position not facing the heat-treating column 16D, edge exposure units EE or the interface rack 30. Thus, the transport mechanism 21 for edge exposure transfers wafers W between the heat-treating column 16D, edge exposure units EE and the rack 30, described hereinafter, in the interface 4.

These transport mechanisms 17–21, 23 and 24 correspond to the substrate transport devices of this invention.

A specific construction of the transport mechanism 22 for post-exposure bake will be described next with reference to FIG. 9. As shown in the plan view of FIG. 9A, side view of FIG. 9B and front view of FIG. 9C, the transport mechanism 22 for post-exposure bake includes a z-axis lift mechanism 22b for vertically moving an arm base 22a, and a motor 22c for rotating the z-axis lift mechanism 22b about the z-axis (in directions of arrow RI). The arm base 22a has an arm 22d for holding a wafer W. The arm 22d is constructed extendible and retractable in directions of arrow RJ radially of the rotation.

Figure 9C:
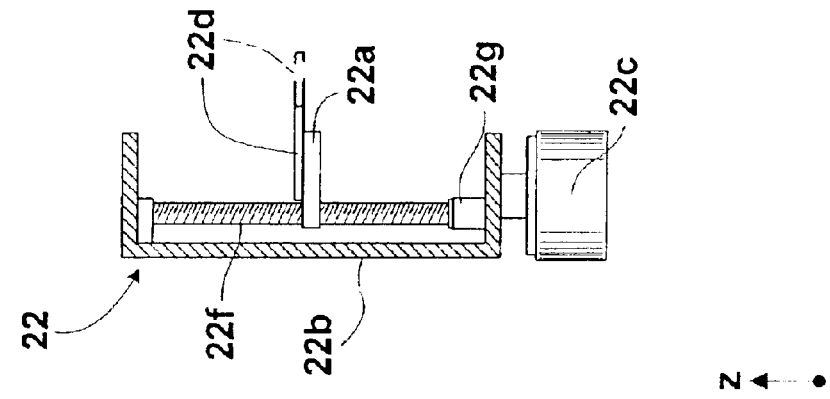
FIG. 9C is a front view of FIG. 9A.
Figure 9B:
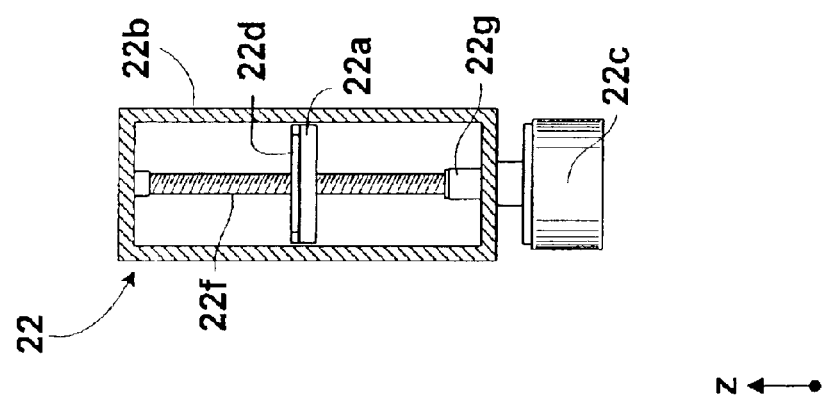
FIG. 9B is a side view of FIG. 9A.
Figure 9A:
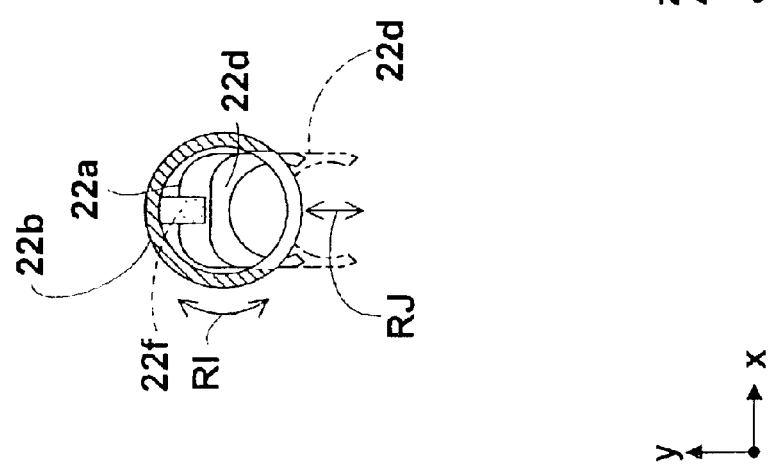
FIG. 9A is a plan view showing an outline of a transport mechanism for post-exposure bake in the first embodiment.

As shown in FIGS. 9A–9C, the z-axis lift mechanism 22b includes a screw shaft 22f, and a motor 22g for rotating the screw shaft 22f about its axis. The arm base 22a is meshed with the screw shaft 22f. By rotation of motor 22g, the arm base 22a meshed with the screw shaft 22f is moved vertically.

The above motor 22c is attached to the bottom of z-axis lift mechanism 22b. By rotation of the motor 22c the z-axis lift mechanism 22b itself is rotated about a vertical axis along with the arm base 22a and arm 22d.

With this construction, the wafer W held by the arm 22d of arm base 22a is rotatable in a horizontal plane, vertically movable, and extendible and retractable. Thus, the transport mechanism 22 for post-exposure bake transfers wafers W between the post-exposure baking modules PEB, the cooling modules CP, the rack 30 in the interface 4 described hereinafter, and the heat-treating column 16F in the developing cell 15B.

The transport mechanisms 17–21, 23 and 24 cannot transfer wafers W in the direction in which the z axis lift mechanisms are fixed. However, the transport mechanism 22 for post-exposure bake, since the z-axis lift mechanism 22b itself is rotatable, can transfer wafers W in all directions in a horizontal plane.

On the other hand, the transport mechanisms 17–21, 23 and 24 facilitate maintenance done from the side not opposed to the treating columns or the like (the side where the z-axis lift mechanisms are installed). With the transport mechanism 22 for post-exposure bake surrounded by the treating columns and the like, it is not easy to secure a space for maintenance work.

Figure 10:
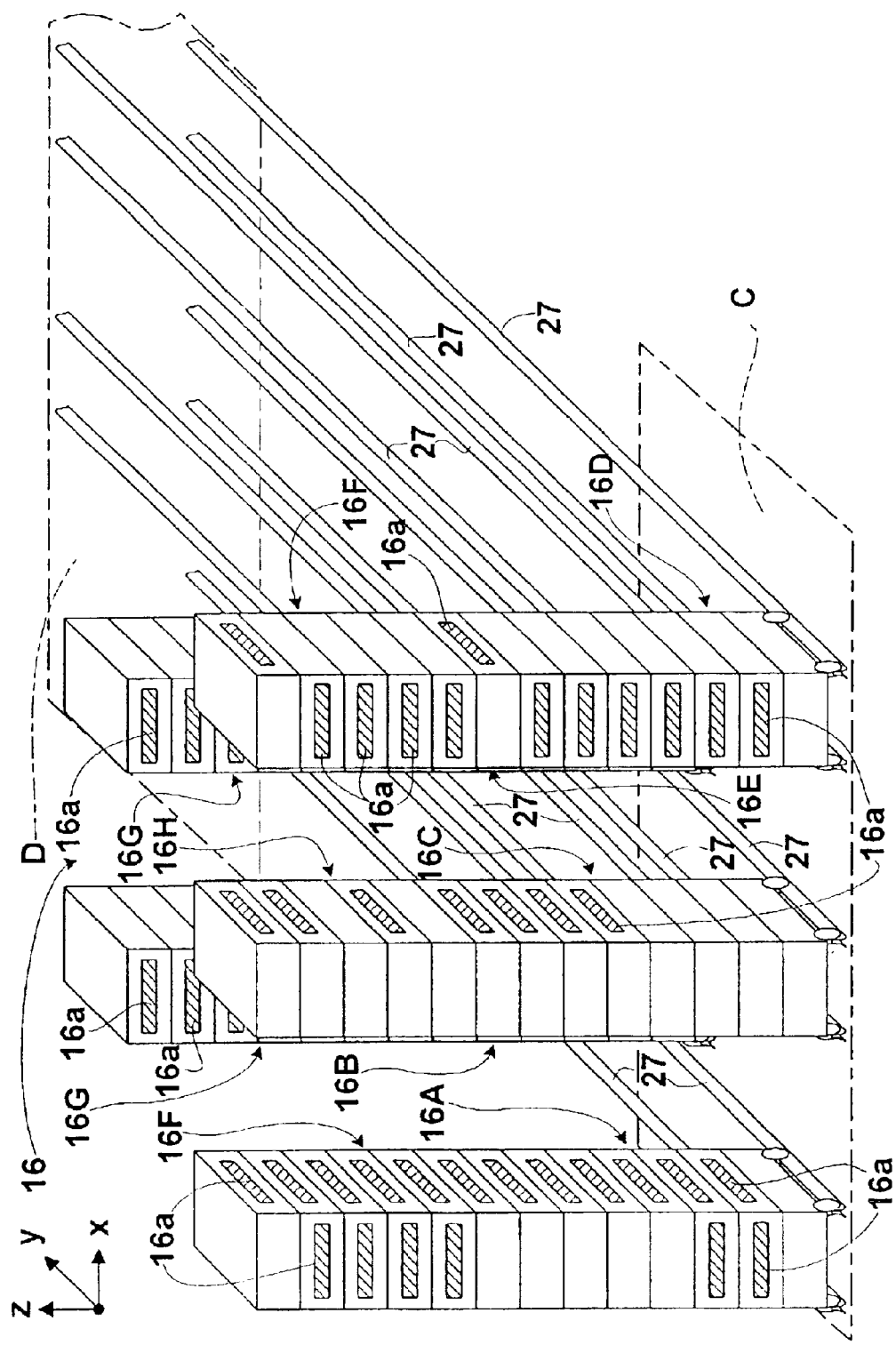
FIG. 10 is a perspective view showing an outline of heat-treating columns in the first embodiment.
Figure 11:
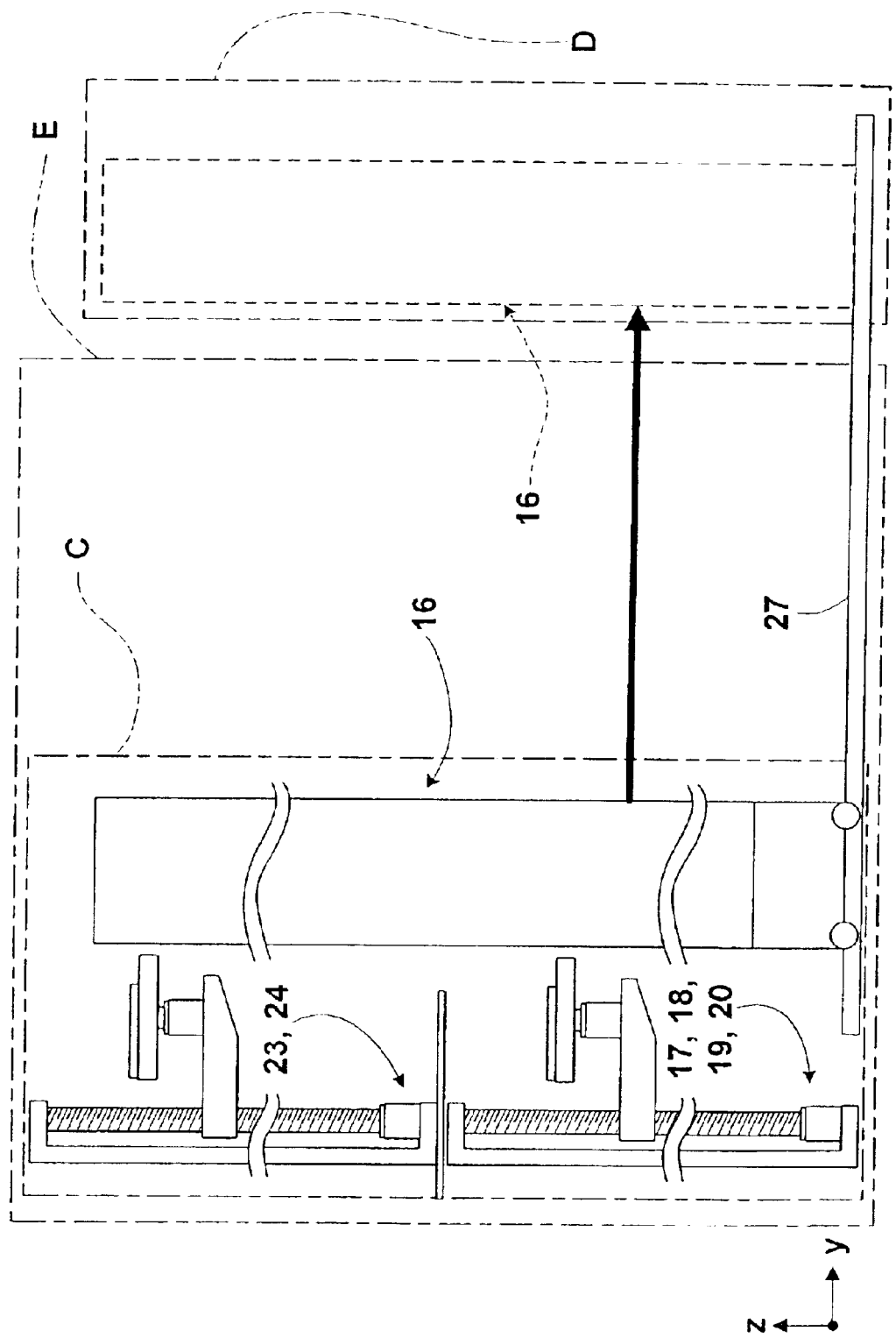
FIG. 11 is a side view showing a heat-treating column in a retracted position.

A specific construction of the heat-treating columns 16 (16A–16G) will be described next with reference to FIGS. 10 and 11. FIG. 10 omits illustration of the transport mechanisms and the like arranged around the heat-treating columns 16. As shown in FIG. 10, the heat-treating column 16F in the developing cell 15A on the second story is stacked on the heat-treating column 16A in the anti-reflective coating forming cell 12 on the first story. Similarly, the heat-treating column 16G in the cell 15A is stacked on the heat-treating column 16B in the cell 12. The heat-treating column 16H is stacked on the heat-treating column 16C. The heat-treating column 16F in the developing cell 15B is stacked on the heat-treating column 16D in the resist film forming cell 13. Similarly, the heat-treating column 16G is stacked on the heat-treating column 16E.

Rails 27 are laid on the apparatus base providing the bottoms of the heat-treating columns 16 (16A–16D) on the first story. These rails 27 extend from a normal position C opposed to the transport mechanisms 17–20, 23 and 24 to a retracted position D, respectively. With the stacked heat-treating columns 16 mounted on the rails 27, when maintaining the apparatus in the first embodiment, particularly the transport mechanisms 17–20, 23 and 24, the heat-treating columns 16 are moved on the rails 27 from the normal position C to the retracted position D to secure a maintenance zone E as shown in FIG. 11.

Reverting to FIGS. 2 through 4, a specific construction of the interface 4 will be described. The interface 4 includes a transport path 28, a transport mechanism 29 and the interface rack 30. As shown in FIGS. 3 and 4, the interface's transport path 28 is formed parallel to the indexer's transport path 7. The interface's transport mechanism 29 is movable along the transport path 28 to transport wafers W between the interface rack 30 and an exposing apparatus (stepper) STP shown in a two-dot chain line in FIGS. 3 and 4. This exposing apparatus STP is provided separately from the substrate treating apparatus in the first embodiment. The exposing apparatus STP corresponds to the external treating apparatus of this invention. The interface rack 30 is a rack for transferring wafers W between the treating transport paths 26 and interface 4. The interface rack 30 corresponds to the second receiver of this invention.

The interface's transport mechanism 29 has the same construction as the indexer's transport mechanism 8 except that the z-axis lift mechanism 8c of the indexer's transport mechanism 8 is mounted in a different position. Thus, a specific construction of the interface's transport mechanism 29 will not be described.

As shown in FIG. 2, the interface rack 30 has a substrate rest "Pass" exclusive to the first story and a substrate rest "Pass" exclusive to the second story arranged in a vertical multi-stage structure. The substrate rest "Pass" exclusive to the first story is used for transferring wafers W between the transport mechanism 21 for edge exposure in the first story portion of the post-exposure baking cell 14 and the interface's transport mechanism 29. The substrate rest "Pass" exclusive to the second story is used for transferring wafers W between the transport mechanism 22 for post-exposure bake in the second story portion of the post-exposure baking cell 14 and the interface's transport mechanism 29. A plurality of buffers (referenced "BF" in FIG. 2) are arranged between the substrate rest "Pass" exclusive to the first story and the substrate rest "Pass" exclusive to the second story, and above the substrate rest "Pass" exclusive to the second story, for temporarily storing wafers W. Thus, the substrate rest "Pass" and buffers BF exclusive to the first story, and the substrate rest "Pass" and buffers BF exclusive to the second story, are stacked from bottom to top.

The substrates rests "Pass" are open toward both the post-exposure baking cell 14 and the interface's transport mechanism 29. Through these openings, wafers W are transferred between the transport mechanism 21 for edge exposure in the post-exposure baking cell 14 on the first story, the transport mechanism 22 for post-exposure bake in the post-exposure baking cell 14 on the second story, and the interface's transport mechanism 29.

The buffers BF exclusive to the first story and the buffers BF exclusive to the second story are open at least toward the interface's transport mechanism 29. Wafers W are transferred through these openings to and from the interface's transport mechanism 29.

Figure 12:
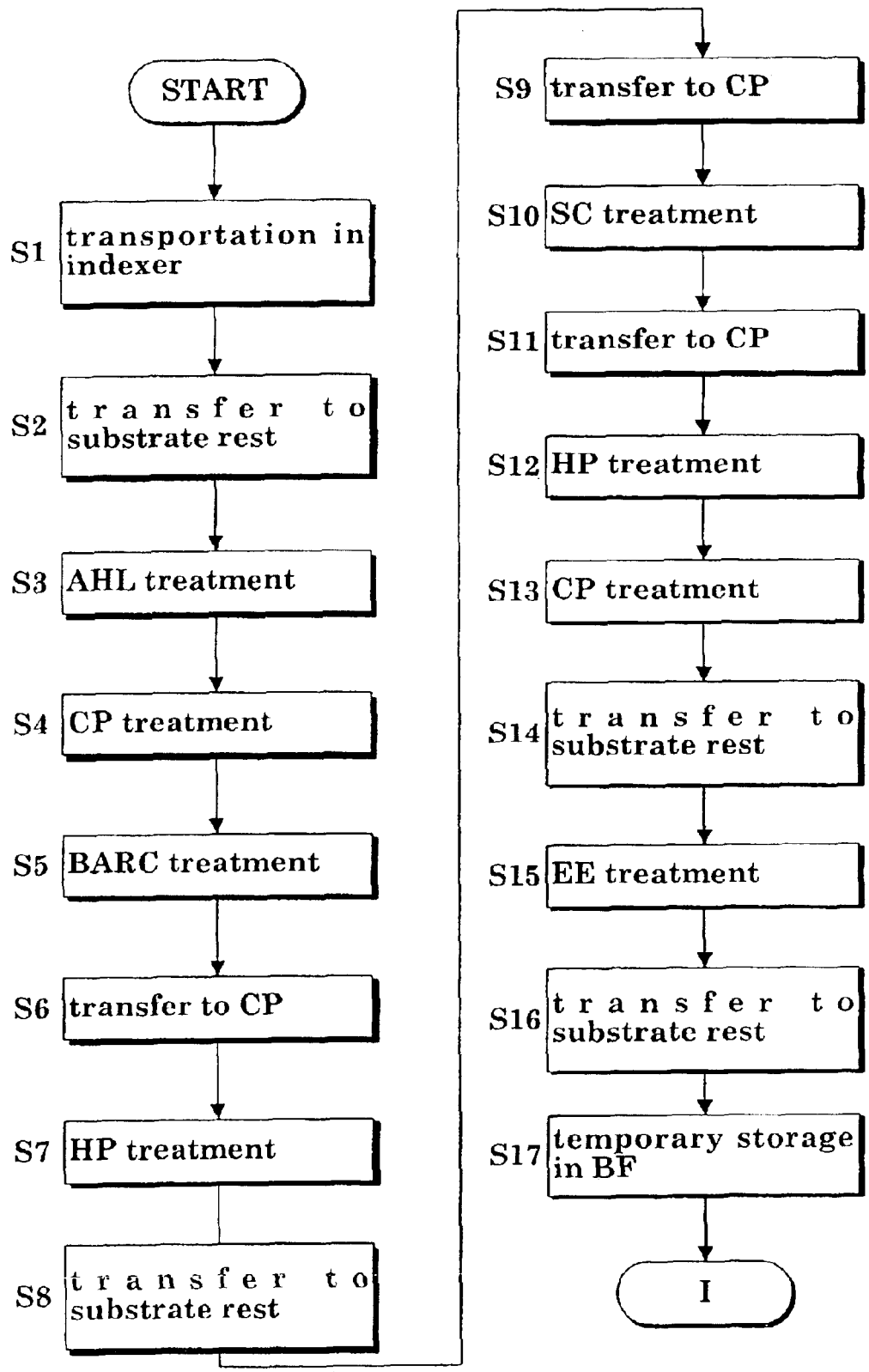
FIG. 12 is a flow chart showing a series of substrate treatments in a photolithographic process by the substrate treating apparatus in the first embodiment.
Figure 13:
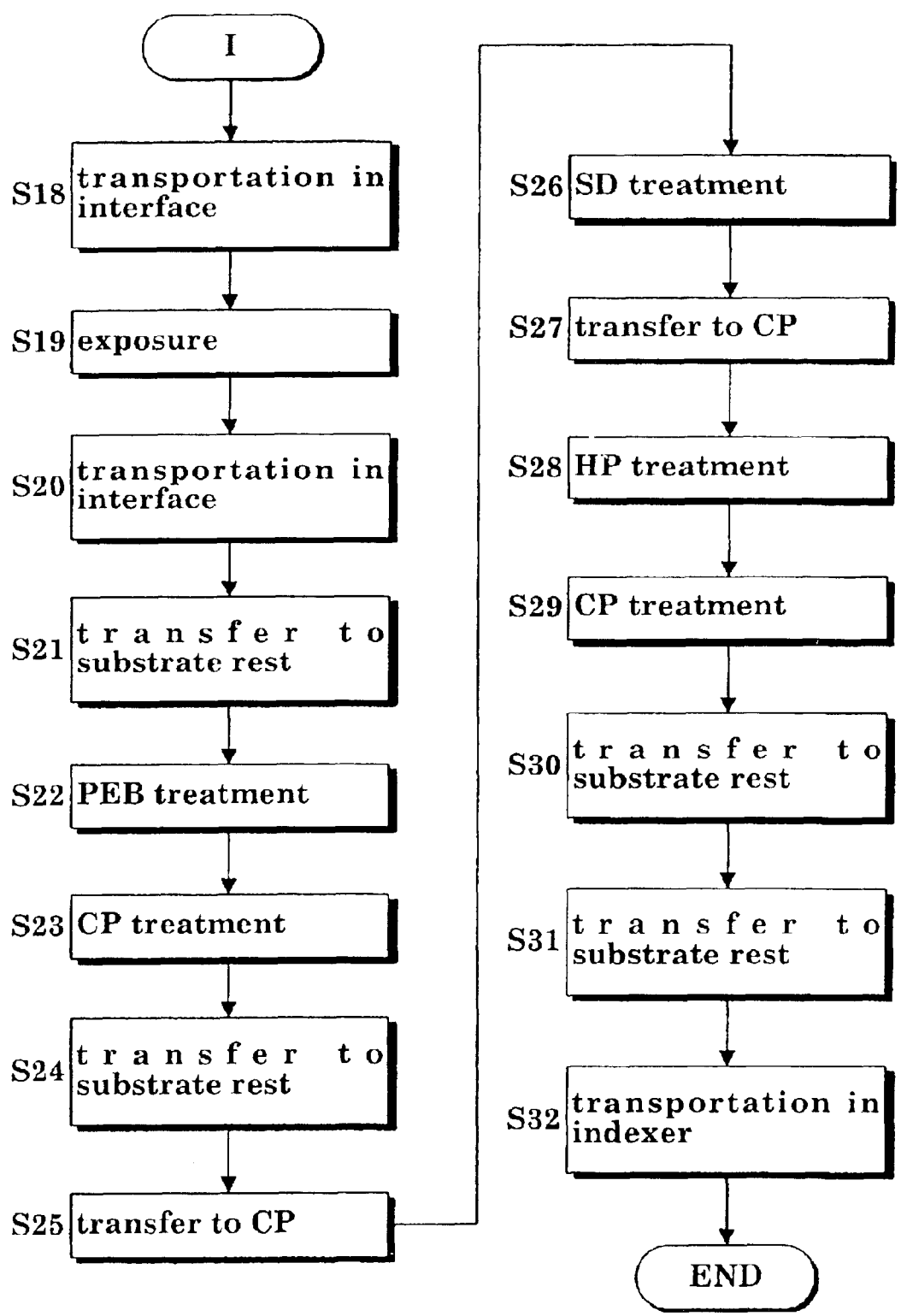
FIG. 13 is a flow chart showing a series of substrate treatments in a photolithographic process by the substrate treating apparatus in the first embodiment.

A series of substrate treatments in a photolithographic process will be described hereinafter with reference to the flowcharts of FIGS. 12 and 13 and to FIG. 14. While a plurality of wafers W are processed in parallel in each treatment, the following description centers on one wafer W. Among the transport mechanisms in FIG. 14, ID represents the indexer, SC the spin coaters (numeral 18 for anti-reflective coating formation, and numeral 20 for resist film formation), EE represents edge exposure, IF the interface, PEB post-exposure bake and SD the spin developers.

(Step S1) Transportation in Indexer:

A cassette C containing a plurality of wafers W to be treated is placed on the cassette table 2. To fetch one wafer W from this cassette C, the indexer's transport mechanism 8 moves horizontally along the indexer's transport path 7 to a position opposed to the cassette C. The arm base 8a is rotated in a horizontal plane to be opposed to the cassette C. The arm base 8a is moved vertically to a position opposed to the wafer W to be fetched from the cassette C. Then, the arm 8e is moved forward under the wafer W. The arm 8e is raised slightly to pick up the wafer W. The arm 8e holding the wafer W is retracted to take the wafer W out of the cassette C.

(Step S2) Transfer to Substrate Rest:

To pass the wafer W on to the transport mechanism 17 for heat treatment in the anti-reflective coating forming cell 12, the indexer's transport mechanism 8 moves along the indexer's transport path 7, and places the wafer W in the substrate rest "Pass" of the heat-treating column 16A in the cell 12. Specifically, the transport mechanism 8 moves along the transport path 7 to a position opposed to the substrate rest "Pass". Then, the arm base 8a is raised and rotated to place the arm 8e opposite the substrate rest "Pass". The arm 8e holding the wafer W is advanced through the opening 16a of the substrate rest "Pass", and places the wafer W in the substrate rest "Pass". Then, the arm 8e is retracted.

(Step S3) Adhesion (AHL) Treatment:

To receive the wafer W placed in the substrate rest "Pass", the arm base 17a of the transport mechanism 17 for heat treatment is raised and rotated in a horizontal plane. When the arm 17d is placed opposite the substrate rest "Pass", the arm 17d is advanced through the opening 16a of the substrate rest "Pass" to take the wafer W out of the substrate rest "Pass". Then, the arm 17d holding the wafer W is retracted.

To treat the wafer W in one of the adhesion promoting modules AHL of the heat-treating column 16A, the arm base 17a is lowered to the adhesion promoting module AHL under the substrate rest "Pass". The arm 17d is advanced through the opening 16a of the adhesion promoting module AHL and places the wafer W in the adhesion promoting module AHL. Then, the arm 17d is retracted.

The wafer W placed in the adhesion promoting module AHL receives adhesion promoting treatment to increase the adhesion of photoresist film to the wafer W.

The transport mechanism 17 for heat treatment also transfers the wafer W from the adhesion promoting module AHL to one of the cooling modules CP. The transport mechanism 17 may be kept on standby in front of the adhesion promoting module AHL until completion of the adhesion promoting treatment. For a higher processing efficiency, the transport mechanism 17 may be used to transport other wafers W until completion of the adhesion promoting treatment.

(Step S4) Cooling (CP) Treatment:

Upon completion of the adhesion promoting treatment, the arm 17d of the transport mechanism 17 advances into the adhesion promoting module AHL, and takes the wafer W out of the adhesion promoting module AHL.

To treat the wafer W in one of the cooling modules CP of the heat-treating column 16A, the arm base 17a is lowered to the cooling module CP under the adhesion promoting module AHL. Then, the arm 17d is advanced through the opening 16a of the cooling module CP, and places the wafer W in the cooling module CP.

The wafer W placed in the cooling module CP receives cooling treatment to cool the wafer W heated in the adhesion promoting module AHL and maintain it at room temperature.

(Step S5) Bottom Anti-Reflective Coating (BARC) Treatment:

After the cooling treatment, the arm 18d of the transport mechanism 18 for anti-reflective coating formation takes the wafer W out of the cooling module CP through the opening 16a of the cooling module CP.

To treat the wafer W in one of the spin coaters SC in the anti-reflective coating forming cell 12, the arm base 18a of the transport mechanism 18 is lowered and rotated. Then, the arm 18d is advanced to place the wafer W on the spin chuck (not shown) of the spin coater SC.

The wafer W placed in the spin coater SC receives anti-reflective coating treatment for forming an anti-reflective coating on the wafer W while spinning the wafer W.

(Step S6) Transfer to Cooling Module (CP):

After the anti-reflective coating treatment, the transport mechanism 18 unloads the wafer W from the spin coater SC.

To load the wafer W into one of the cooling modules CP in the heat-treatment column 16A, the arm base 18a of the transport mechanism 18 is raised and rotated. Then, the arm 18d is advanced to place the wafer W in the cooling module CP. The wafer W may be cooled in this cooling module CP as necessary.

(Step S7) Heating (HP) Treatment:

To receive the wafer W placed in the cooling module CP, the arm 17d of the transport mechanism 17 for heat treatment advances into the cooling module CP, and takes the wafer W out of the cooling module CP.

To treat the wafer W in one of the heating modules HP of the heat-treating column 16B in the anti-reflective coating forming cell 12, the arm 17d of the transport mechanism 17 advances into the heating module HP, and places the wafer W in the heating module HP.

The wafer W placed in the heating module HP receives heating treatment for heating the wafer W after the anti-reflective coating formation.

(Step S8) Transfer to Substrate Rest:

After the heating treatment, the transport mechanism 17 takes the wafer W out of the heating module HP.

To pass the wafer W on to the transport mechanism 19 for heat treatment in the resist film forming cell 13, the transport mechanism 17 for heat treatment places the wafer W in the substrate rest "Pass" of the heat-treating column 16C.

(Step S9) Transfer to Cooling Module (CP):

To receive the wafer W placed in the substrate rest "Pass", the transport mechanism 19 for heat treatment takes the wafer W out of the substrate rest "Pass".

The transport mechanism 19 places the wafer W in one of the cooling modules CP of the heat-treating column 16D. In this cooling module CP, cooling treatment is performed to cool the wafer W to a predetermined temperature.

(Step S10) Resist Film Forming (SC) Treatment:

To receive the wafer W placed in the cooling module CP, the transport mechanism 20 for resist film formation takes the wafer W out of the cooling module CP.

To treat the wafer W in one of the spin coaters SC in the resist film forming cell 13, the transport mechanism 20 places the wafer W on the spin chuck (not shown) of the spin coater SC.

The wafer W placed in the spin coater SC receives resist film forming treatment for forming resist film on the wafer W while spinning the wafer W.

(Step S11) Transfer to Cooling Module (CP):

After the resist film forming treatment, the transport mechanism 20 unloads the wafer W from the spin coater SC.

The transport mechanism 20 places the wafer W in one of the cooling modules CP of the heat-treating column 16D. The wafer W may be cooled in this cooling module CP as necessary.

(Step S12) Heating (HP) Treatment:

To receive the wafer W placed in the cooling module CP, the transport mechanism 19 takes the wafer W out of the cooling module CP.

To treat the wafer W in one of the heating modules HP of the heat-treating column 16E in the resist film forming cell 13, the transport mechanism 19 places the wafer W in the heating module HP.

The wafer W placed in the heating module HP receives heating treatment for heating the wafer W after the resist film formation.

(Step S13) Cooling (CP) Treatment:

After the heating treatment, the transport mechanism 19 takes the wafer W out of the heating module HP.

To treat the wafer W in one of the cooling modules CP of the heat-treating column 16D, the transport mechanism 19 places the wafer W in the cooling module CP.

The wafer W placed in the cooling module CP receives cooling treatment to cool the wafer W heated in the heating module HP and maintain it at room temperature.

(Step S14) Transfer to Substrate Rest:

After the cooling treatment, the transport mechanism 19 for heat treatment takes the wafer W out of the cooling module CP.

To pass the wafer W on to the transport mechanism 21 for edge exposure in the post-exposure baking cell 14, the transport mechanism 19 for heat treatment places the wafer W in the substrate rest "Pass" of the heat-treating column 16D.

(Step S15) Edge Exposure (EE) Treatment:

To receive the wafer W placed in the substrate rest "Pass", the transport mechanism 21 for edge exposure advances into the substrate rest "Pass", and takes the wafer W out of the substrate rest "Pass".

To treat the wafer W in one of the edge exposure units EE in the post-exposure baking cell 14 on the first story, the transport mechanism 21 places the wafer W in the edge exposure unit EE.

The wafer W placed in the edge exposure unit EE receives edge exposure treatment for exposing the edges of wafer W before an exposing process.

(Step S16) Transfer to Substrate Rest:

After the edge exposure treatment in the edge exposure unit EE, the transport mechanism 21 for edge exposure takes the wafer W out of the edge exposure unit EE.

To pass the wafer W on to the transport mechanism 29 in the interface 4, the transport mechanism 21 for edge exposure places the wafer W in the substrate rest "Pass", exclusive to the first story, in the rack 30 of the interface 4.

(Step S17) Temporary Storage in Buffer (BF):

To receive the wafer W placed in the substrate rest "Pass", the interface's transport mechanism 29 advances into the substrate rest "Pass" and takes the wafer W out of the substrate rest "Pass". When a waiting time occurs with the wafer W because of the processing time in the exposing apparatus STP, the interface's transport mechanism 29 stores the wafer W in one of the buffers BF exclusive to the first story. When an exposing process is performed without requiring the wafer W to wait for its turn, this temporary storage in the buffer BF is omitted.

(Step S18) Transportation in Interface:

To receive the wafer W placed in the buffer BF, the interface's transport mechanism 29 moves along the transport path 28, and the arm 29e of the transport mechanism 29 is advanced to take the wafer W out of the buffer BF through the opening of the buffer BF.

(Step S19) Exposure:

To process the wafer W in the exposing apparatus STP connected to the interface 4, the transport mechanism 29 moves along the transport path 28, and the arm 29e of the transport mechanism 29 is advanced to load the wafer W into the exposing apparatus STP. The wafer W is exposed in the exposing apparatus STP.

(Step S20) Transportation in Interface:

After the exposing process, the transport mechanism 29 moves the transport path 28 to unload the wafer W from the exposing apparatus STP.

(Step S21) Transfer to Substrate Rest:

To pass the wafer W on to the transport mechanism 22 for post-exposure bake in the post-exposure baking cell 14 on the second story, the transport mechanism 29 places the wafer W in the substrate rest "Pass", exclusive to the second story, in the rack 30 of the interface 4.

When an adjustment is needed for the time for passing the wafer W to the transport mechanism 22 for post-exposure bake, the interface's transport mechanism 29 transports the wafer W to one of the buffers BF exclusive to the second story for adjustment of time. When the transport mechanism 22 for post-exposure bake becomes ready to accept the wafer W, the interface's transport mechanism 29 transports the wafer W from the buffer BF to the substrate rest "Pass".

(Step S22) Post-Exposure Baking (PEB) Treatment:

To receive the wafer W placed in the substrate rest "Pass", the transport mechanism 22 for post-exposure bake takes the wafer W out of the substrate rest "Pass".

To treat the wafer W in one of the post-exposure baking modules PEB in the post-exposure baking cell 14 on the second story, the transport mechanism 22 for post-exposure bake places the wafer W in the post-exposure baking module PEB.

The wafer W placed in the post-exposure baking module PEB receives post-exposure baking treatment for heating the exposed wafer W.

(Step S23) Cooling (CP) Treatment:

After the post-exposure baking treatment, the transport mechanism 22 takes the wafer W out of the post-exposure baking module PEB.

To treat the wafer W in one of the cooling modules CP in the post-exposure baking cell 14 on the second story, the arm base 22a of the transport mechanism 22 is lowered to the cooling module CP under the post-exposure baking module PEB. Then, the arm 22d is advanced to place the wafer W in the cooling module CP.

The wafer W placed in the cooling module CP receives cooling treatment to cool the wafer W heated in the post-exposure baking module PEB and maintain it at room temperature.

(Step S24) Transfer to Substrate Rest:

After the cooling treatment, the transport mechanism 22 takes the wafer W out of the cooling module CP.

To pass the wafer W on to the transport mechanism 23 for heat treatment in the developing cell 15B, the transport mechanism 22 places the wafer W in the substrate rest "Pass" of heat-treating column 16F in the cell 15B.

When the treatment of wafers W is in progress in both the spin developers SD, the transport mechanism 22 may pass the wafer W on to the transport mechanism 23 for heat treatment in the developing cell 15B through the substrate rest "Pass" of the heat-treating column 16F in the cell 15B. The transport mechanism 23 in the cell 15B then passes the wafer W on to the transport mechanism 23 in the developing cell 15A through the substrate rest "Pass" of the heat-treating column 16H shared by the cells 15A and 15B. Further, the transport mechanism 23 in the developing cell 15A passes the wafer W on to the transport mechanism 24 for development in the cell 15A through one of the cooling modules CP of heat-treatment column 16F in the cell 15A. Subsequently, the transport mechanism 24 in the cell 15A places the wafer W in one of the spin developers SD in the cell 15A for development in the spin developer SD.

(Step S25) Transfer to Cooling Module (CP):

To receive the wafer W placed in the substrate rest "Pass", the transport mechanism 23 for heat treatment takes the wafer W out of the substrate rest "Pass".

The transport mechanism 23 places the wafer W in one of the cooling modules CP of the heat-treating column 16F. This cooling module CP may be operated to adjust the wafer W to a temperature around room temperature with increased precision.

(Step S26) Developing (SD) Treatment:

To receive the wafer W placed in the cooling module CP, the transport mechanism 24 for development takes the wafer W out of the cooling module CP.

To treat the wafer in one of the spin developers SD in the developing cell 15B, the transport mechanism 24 places the wafer W on the spin chuck (not shown) of the spin developer SD.

The wafer W placed in the spin developer SD is developed while being spun.

(Step S27) Transfer to Cooling Module (CP):

After the developing treatment, the transport mechanism 24 unloads the wafer W from the spin developer SD.

To pass the wafer W on to the transport mechanism 23 for heat treatment in the developing cell 15B, the transport mechanism 24 places the wafer W in one of the cooling modules CP of the heat-treating column 16F in the developing cell 15B.

(Step S28) Heating (HP) Treatment:

To receive the wafer W placed in the cooling module CP, the transport mechanism 23 takes the wafer W out of the cooling module CP.

To treat the wafer W in one of the heating modules HP of the heat-treating column 16G in the developing cell 15B, the transport mechanism 23 places the wafer W in the heating module HP.

The wafer W placed in the heating module HP receives heating treatment for heating the developed wafer W.

(Step S29) Cooling (CP) Treatment:

After the heating treatment, the transport mechanism 23 takes the wafer W out of the heating module HP.

To treat the wafer W in one of the cooling modules CP of the heat-treating column 16G, the arm base 23a of the transport mechanism 23 is lowered to the cooling module CP under the heating module HP. Then, the arm 23d is advanced to place the wafer W in the cooling module CP.

The wafer W placed in the cooling module CP receives cooling treatment to cool the wafer W heated in the heating module HP and maintain it at room temperature.

(Step S30) Transfer to Substrate Rest:

After the cooling treatment, the transport mechanism 23 takes the wafer W out of the cooling module CP.

To pass the wafer W on to the transport mechanism 23 for heat treatment in the developing cell 15A, the transport mechanism 23 in the developing cell 15B places the wafer W in the substrate rest "Pass" of heat-treating column 16H.

(Step S31) Transfer to Substrate Rest:

The transport mechanism 23 for heat treatment in the developing cell 15A takes the wafer W out of the substrate rest "Pass".

To pass the wafer W on to the transport mechanism 8 in the indexer 1, the transport mechanism 23 places the wafer W in the substrate rest "Pass" of heat-treating column 16F in the developing cell 15A.

(Step S32) Transportation in Indexer:

To take out of the wafer W placed in the substrate rest "Pass", the indexer's transport mechanism 8 moves along the indexer's transport path 7. The arm 8e of the transport mechanism 8 is advanced to take the wafer W out of the substrate rest "Pass".

To deposit the wafer W in a cassette C placed on the cassette table 2, the transport mechanism 8 moves along the transport path 7 to a position opposed to the cassette C. The arm base 8a of the transport mechanism 8 is rotated in a horizontal plane to be opposed to the cassette C. Then, the arm base 8a is lowered to a position opposed to a stage in the cassette C for receiving the wafer W, and the arm 8e is advanced and slightly lowered to place the wafer W on that stage. The arm 8e is withdrawn, leaving the wafer W in the cassette C.

A predetermined number of treated wafers W are successively deposited in the cassette C to complete the series of substrate treatments.

The first embodiment solves the problems (I) and (II) described hereinbefore.

Regarding Problem (I):

The substrate treating apparatus in the first embodiment having the above construction produces the following effects. The treating transport paths 25 on the second story and the treating transport paths 26 on the second story are connected to both the indexer 1 and interface 4. Thus, wafers W may be transferred between the treating transport paths 25 and 26. The treating transport paths 25 and the treating transport paths 26 have opposite directions for transporting wafers W. The treating transport paths 25 constitute a going-only path for transporting wafers W forward. The treating transport paths 26 constitute a return-only path for transporting the wafers W in the reversed direction. These going-only and return-only paths are arranged in a vertically overlapping relationship. With this arrangement, wafers W are treated while being transported through the going-only and return-only paths in the processing unit 3 including the heat-treating columns 16, spin coaters SC and spin developers SD. No interference occurs between the wafers W transported through the going-only treating transport paths 25 and the wafers W transported through the return-only treating transport paths 26. This effectively reduces the wasteful waiting time due to interference between these wafers W. As a result, the efficiency of treating wafers W is improved.

Further, as described also in relation to steps S1–S32 above, through the indexer 1 (step S1), each wafer W to be treated is placed in the substrate rest "Pass" of the heat-treating column 16A located on the treating transport paths 25 on the first story (step S2). The wafer W placed is transported between the heat-treating columns 16 and spin coaters SC through the treating transport paths 25 on the first story for substrate treatment (steps S3–S15). The wafer W having been treated while being transported between the heat-treating columns 16 and spin coaters SC is placed in the substrate rest "Pass" or a buffer BF, exclusive to the first story, in the interface rack 30 (steps S16 and S17). The wafer W is passed through the interface 4 (step S18) to the exposing apparatus STP which is the external treating apparatus in this invention. The wafer W is exposed in the exposing apparatus STP (step S19).

The wafer W exposed in the exposing apparatus STP is transported through the interface 4 (step S20), and placed in the substrate rest "Pass", exclusive to the second story, in the interface rack 30 (step S21). The wafer W placed is transported between the heat-treating columns 16 and spin developers SD through the treating transport paths 26 on the second story for substrate treatment (steps S22–S30). The wafer W having been treated while being transported between the heat-treating columns 16 and spin developers SD is placed in the substrate rest "Pass" of the heat-treating column 16F located on the treating transport paths 26 on the second story (step S31). Then, through the indexer 1 (step S32), the wafer W is deposited in a cassette C.

The series of substrate treatments in these steps S1–S32 including the exposing process may be carried out easily through the treating transport paths 25 and 26 connected to the indexer 1 and interface 4. In the first embodiment, the series of substrate treatments described above is performed once. Instead, the wafer W having received the series of substrate treatments may be transported through the indexer 1 connected to the treating transport paths 25 and 26 and placed again in the substrate rest "Pass" of the heat-treating column 16A on the treating transport paths 25 to repeat the series of substrate treatments for the same wafer W.

Since each of the transport mechanisms 17–21, 23 and 24 transports wafers W only forward or backward, a transport control may be carried out easily for controlling the substrate treatment. Further, since the series of substrate transport paths is arranged on the upper and lower stories, with wafers W transferred between the treating transport paths 25 and 26 on the first story and second story, the apparatus requires a reduced floor space (footprint) for installation.

Figure 15:
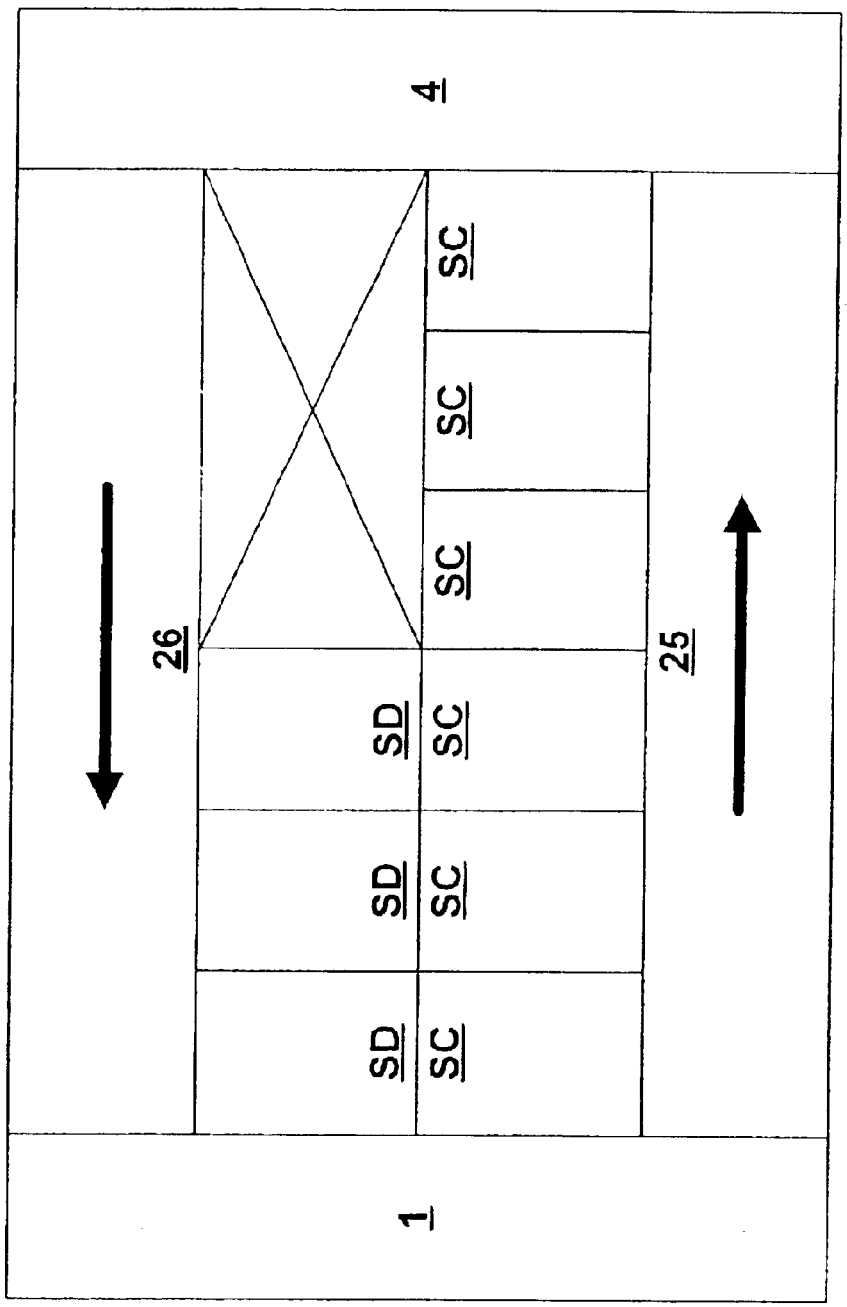
FIG. 15 is a block diagram in plan view of a substrate treating apparatus having going-only and return-only paths arranged on a plane.

Where, as shown in FIG. 15, for example, going-only and return-only paths are arranged on a plane, and the number of treating steps executed (e.g. by spin coaters SC) in the going movement and the number of treating steps executed (e.g. by spin developers SD) in the return movement are different, the treating transport paths must be designed to match the larger number of treating steps (the spin coaters SC in FIG. 15). The treating transport paths 26 formed along the treating devices less in number (the spin developers SD in FIG. 15) has a wasteful length. As opposed to this, the apparatus in the first embodiment has the going-only and return-only paths arranged in the vertically overlapping relationship. Where treating devices larger in number are installed below, treating devices less in number may be installed above, to realize a reduced waste of transport paths.

In the first embodiment, the treating transport paths 25 are connected to the indexer 1, and the treating transport paths 26 to the interface 4. This construction improves the efficiency of treating wafers W, including exposure by the exposing apparatus (stepper) STP, while transporting the wafers W between the indexer 1 and interface 4.

In the first embodiment, the first story includes the treating cells with spin coaters SC (i.e. anti-reflective coating forming cell 12 and resist film forming cell 13), while the second story includes the treating cells with spin developers SD (i.e. developing cells 15A and 15B). The treating cells with the spin developers SD are arranged above the treating cells with the spin coaters SC. Thus, without requiring a separate air-conditioning system for adjusting the temperature of cells 12 and 13, downflows in a cleanroom may be used for temperature control of the cells 12 and 13. Further, scatter preventive cups (not shown) also are arranged downward for preventing scattering of and draining the photoresist solution. The scatter preventive cups having the highly viscous photoresist solution adhering thereto may be changed more easily than where the anti-reflective coating forming cell 12 and resist film forming cell 13 are arranged above the developing cells 15A and 15B.

Regarding Problem (II):

The substrate treating apparatus in the first embodiment having the above construction produces the following effects. The treating transport paths 25 on the first story and the treating transport paths 26 on the second story are connected to both the indexer 1 and interface 4. With the treating transport paths 25 and 26 connected in this way, wafers W are processed as follows.

As described also in relation to steps S1–S32 above, through the indexer 1 (step S1), each wafer W to be treated is placed in the substrate rest "Pass" of the heat-treating column 16A located on the treating transport paths 25 on the first story (step S2). The wafer W placed is transported between the heat-treating columns 16 and spin coaters SC through the treating transport paths 25 on the first story for substrate treatment (steps S3–S15). The wafer W having been treated while being transported between the heat-treating columns 16 and spin coaters SC is placed in the substrate rest "Pass" and a buffer BF, exclusive to the first story, in the interface rack 30 (steps S16 and S17). The wafer W is passed through the interface 4 (step S18) to the exposing apparatus STP which is the external treating apparatus in this invention. The wafer W is exposed in the exposing apparatus STP (step S19).

The wafer W exposed in the exposing apparatus STP is transported through the interface 4 (step S20), and placed in the substrate rest "Pass", exclusive to the second story, in the interface rack 30 (step S21). The wafer W placed is transported between the heat-treating columns 16 and spin developers SD through the treating transport paths 26 on the second story for substrate treatment (steps S22–S30). The wafer W having been treated while being transported between the heat-treating columns 16 and spin developers SD is placed in the substrate rest "Pass" of the heat-treating column 16F located on the treating transport paths 26 on the second story (step S31). Then, through the indexer 1 (step S32), the wafer W is deposited in a cassette C.

The series of substrate treatments in these steps S1–S32 including the exposing process may be carried out easily through the treating transport paths 25 and 26 connected to the indexer 1 and interface 4. In the first embodiment, the series of substrate treatments described above is performed once. Instead, the wafer W having received the series of substrate treatments may be transported through the indexer 1 connected to the treating transport paths 25 and 26 and placed again in the substrate rest "Pass" of the heat-treating column 16A on the treating transport paths 25 to repeat the series of substrate treatments for the same wafer W.

Since the treating transport paths 25 and 26 are arranged on the upper and lower stories, the apparatus does not require an enlarged floor space (footprint) for installation. Further, even when treating a large number of wafers W, interference between the wafers W may be reduced by sidetracking or transporting the wafers W to the treating transport paths 25 and 26 on the first and second stories through the indexer 1 as necessary. As a result, the efficiency of treatment may be improved compared with the prior art.

Further, wafers W may be transferred between the treating transport paths 25 and 26 on the first and second stories through the indexer 1 or interface 4. The substrate rest "Pass" in the heat-treating column 16A is disposed on the treating transport paths 25, while the substrate rest "Pass" in the heat-treating column 16F is disposed on the treating transport paths 26. The interface 4 includes the rack 30 having a vertically stacked structure and extending from the treating transport paths 25 (i.e. from the first story) to the treating transport paths 26 (i.e. to the second story). Through the substrate rests "Pass" in the heat-treating columns 16A and 16F and the interface rack 30, wafers W may be transferred easily between the treating transport paths 25 and 26 and indexer 1, and between the treating transport paths 25 and 26 and interface 4.

The interface rack 30 in particular has the vertically stacked structure to extend from the first story to the second story. The transfer of wafers W may be carried out easily only by installing the interface rack 30 of vertically stacked structure in the apparatus having the treating transport paths 25 and 26 arranged on the upper and lower stories.

Second Embodiment

Figure 16:
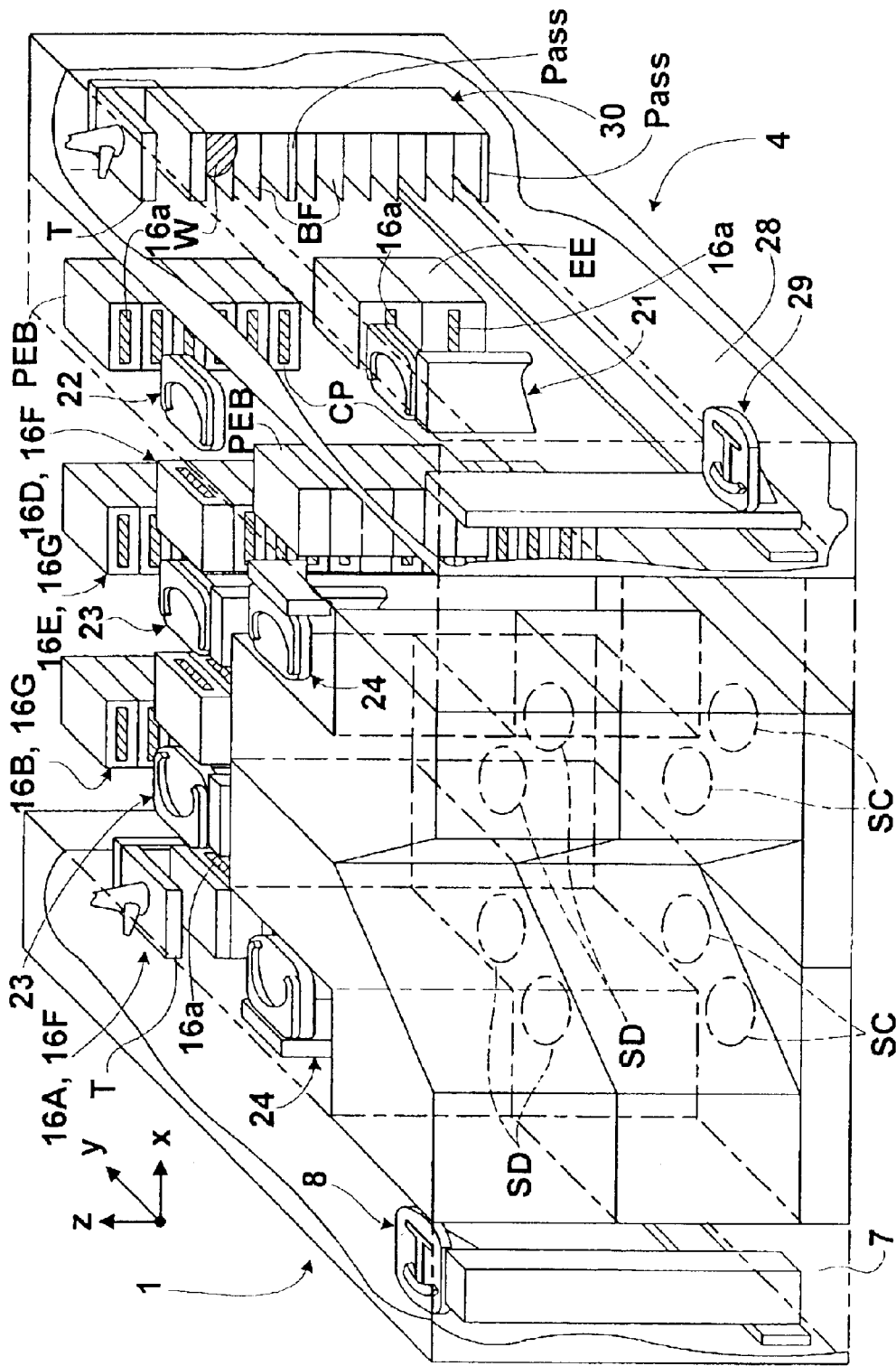
FIG. 16 is a perspective view showing an outline of a substrate treating apparatus in a second embodiment of the invention.
Figure 17:
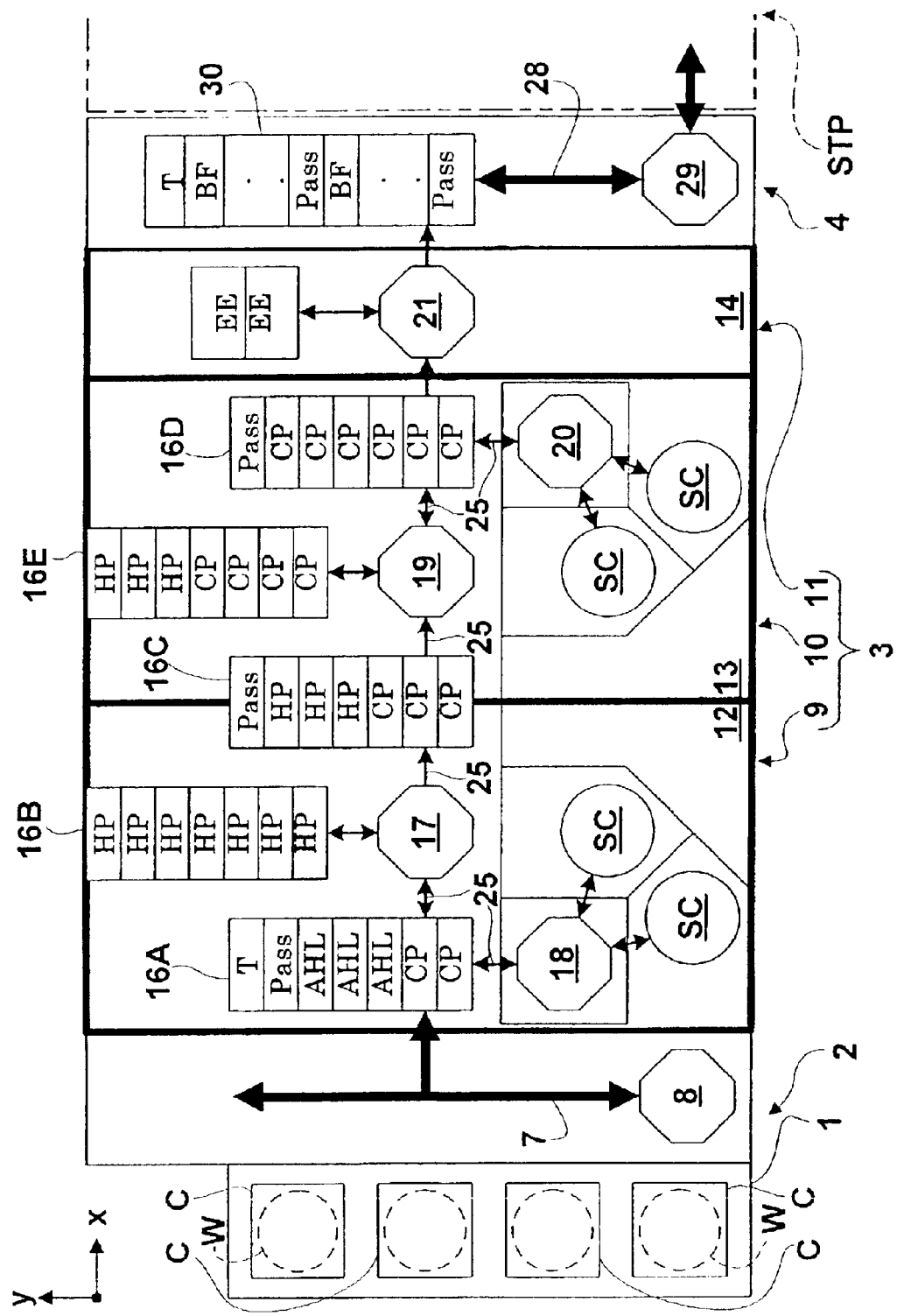
FIG. 17 is a block diagram seen in plan view of a first story of the substrate treating apparatus in the second embodiment.
Figure 18:
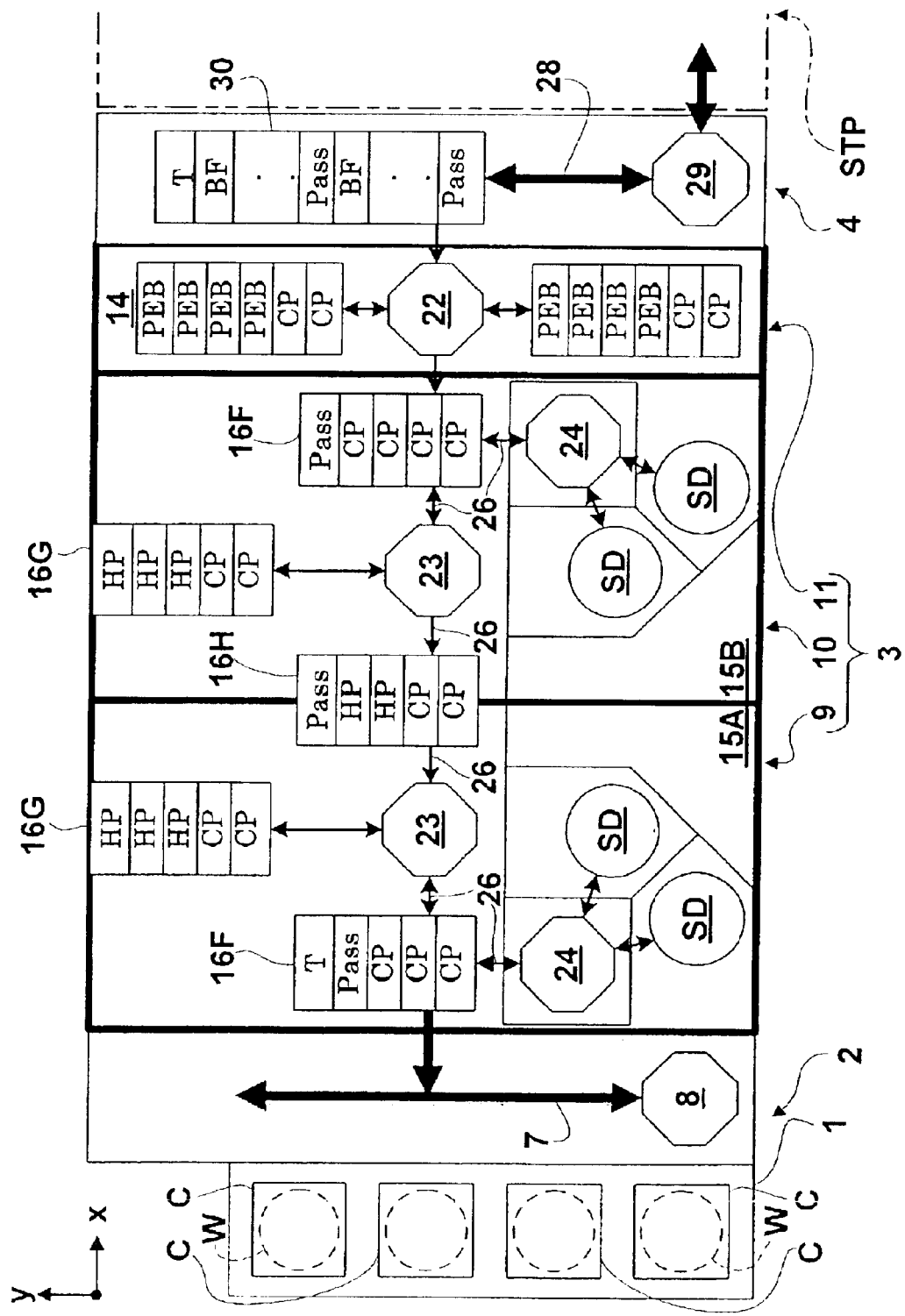
FIG. 18 is a block diagram seen in plan view of a second story of the substrate treating apparatus in the second embodiment.

FIG. 16 is a perspective view showing an outline of a substrate treating apparatus in a second embodiment. FIG. 17 is a block diagram seen in plan view of a first story of the substrate treating apparatus. FIG. 18 is a block diagram seen in plan view of a second story of the substrate treating apparatus. Like references are used to identify like parts which are the same as in the first embodiment and will not be described again.

The heat-treating column 16A in the second embodiment includes, stacked from bottom to top, two cooling modules (referenced "CP" in FIG. 17) for cooling heated wafers W and maintaining the wafers W at room temperature, three adhesion promoting modules (referenced "AHL" in FIG. 17) for promoting adhesion of photoresist film to the wafers W, a substrate rest (referenced "Pass" in FIG. 17) for transferring wafers W without heat-treating the wafers W, and a testing module T. In the adhesion promoting treatment, wafers W are treated with HMDS $[(CH_3)_3SiNHSi(CH_3)_3]$ in vapor form before resist application.

The substrate rest "Pass" in the heat-treating column 16A, a substrate rest "Pass" in a heat-treating column 16F in a developing cell 15A described hereinafter, the testing module T in the heat-treating column 16A, and a testing module T in the developing cell 15A correspond to the third receiver of this invention. A substrate rest "Pass" in an interface rack 30 described hereinafter, and a testing module T in the interface rack 30 correspond to the fourth receiver of this invention. The testing module T in the heat-treating column 16A, the testing module T in the heat-treating column 16F in the developing cell 15A and the testing module T in the interface rack 30 correspond to the third testing module of this invention. The substrate rest "Pass" in the heat-treating column 16A, the substrate rest "Pass" in the heat-treating column 16F in the developing cell 15A, the substrate rest "Pass" in the interface rack 30 correspond to the bypass passage of this invention.

Each testing module T includes an optical microscope or the like. The testing module T in the heat-treating column 16A is a mechanism for checking sizes and numbers of dust particles adhering to wafers W. The testing module T in the interface rack 30 is a mechanism for checking alignment accuracy for exposure. The testing module T in the heat-treating column 16F in the developing cell 15A is a mechanism for checking defects of circuit patterns.

The developing cell 15A adjacent the indexer 1 has the same construction as the developing cell 15B except that the two developing cells 15A and 15B are symmetrical (with respect to an yz plane) and that the testing module T is disposed in the heat-treating column 16F in the developing cell 15A. Thus, the developing cell 15A will not be described. The heat-treating column 16F in the developing cell 15A has a function to examine or test wafers W in the testing module T, a function to transfer wafers W through cooling modules CP between the transport mechanism 23 for heat treatment and transport mechanism 24 for development, and a function to transfer wafers W through the substrate rest "Pass" between the transport mechanism 23 for heat treatment and the indexer's transport mechanism 8.

At the starting point of treating transport paths 25 constituting a going-only path, i.e. in a location adjacent the indexer 1, the testing module T of heat-treating column 16A is disposed for testing certain of the wafers W, and the substrate rest "Pass" of heat-treating column 16A is disposed for transferring the remaining wafers W without testing. At the terminal point of the treating transport paths 25, i.e. in the interface 4, the testing module T of interface rack 30 is disposed for testing certain of the wafers W, and the substrate rests "Pass" of interface rack 30 are disposed for transferring the remaining wafers W without testing.

At the starting point of the treating transport paths 26 constituting a return-only path, i.e. in the interface 4, the testing module T of interface rack 30 is disposed for testing certain of the wafers W, and the substrate rests "Pass" of interface rack 30 are disposed for transferring the remaining wafers W without testing. At the terminal point of treating transport paths 26, i.e. in a location adjacent the indexer 1, the testing module T of heat-treating column 16F is disposed for testing certain of the wafers W, and the substrate rest "Pass" of heat-treating column 16F is disposed for transferring the remaining wafers W without testing.

As shown in FIG. 16, the interface rack 30 has a substrate rest "Pass" exclusive to the first story and a substrate rest "Pass" exclusive to the second story arranged in a vertical multi-stage structure. The substrate rest "Pass" exclusive to the first story is used for transferring wafers W between the transport mechanism 21 for edge exposure in the first story portion of the post-exposure baking cell 14 and the interface's transport mechanism 29. The substrate rest "Pass" exclusive to the second story is used for transferring wafers W between the transport mechanism 22 for post-exposure bake in the second story portion of the post-exposure baking cell 14 and the interface's transport mechanism 29. A plurality of buffers (referenced "BF" in FIG. 16) are arranged between the substrate rest "Pass" exclusive to the first story and the substrate rest "Pass" exclusive to the second story, and above the substrate rest "Pass" exclusive to the second story, for temporarily storing wafers W. The testing module T is disposed above the buffers BF exclusive to the second story, i.e. at the top of the rack 30. Thus, the substrate rest "Pass" and buffers BF exclusive to the first story, the substrate rest "Pass" and buffers BF exclusive to the second story, and the testing module T, are stacked from bottom to top.

Figure 19:
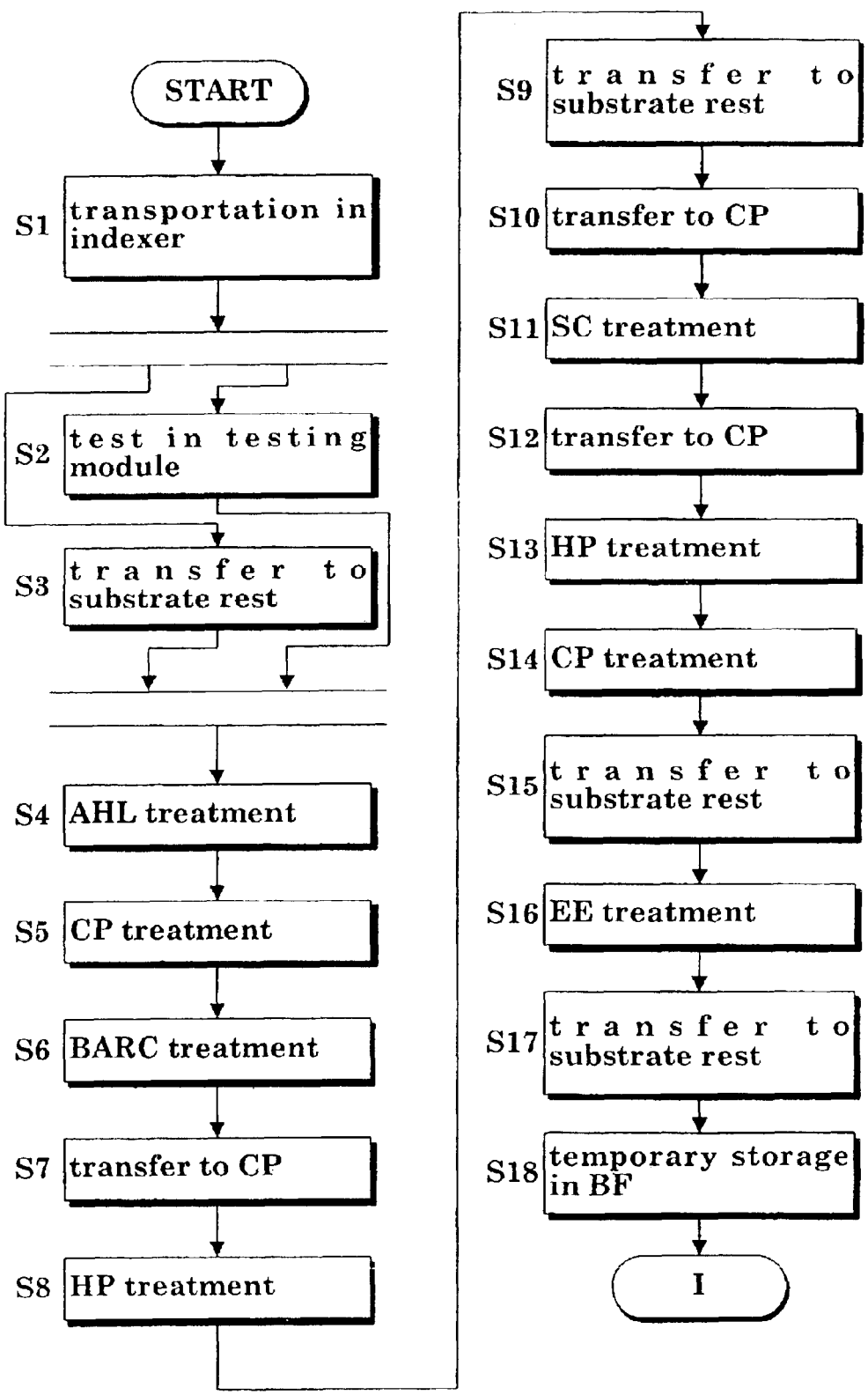
FIG. 19 is a flow chart showing a series of substrate treatments in a photolithographic process by the substrate treating apparatus in the second embodiment.
Figure 20:
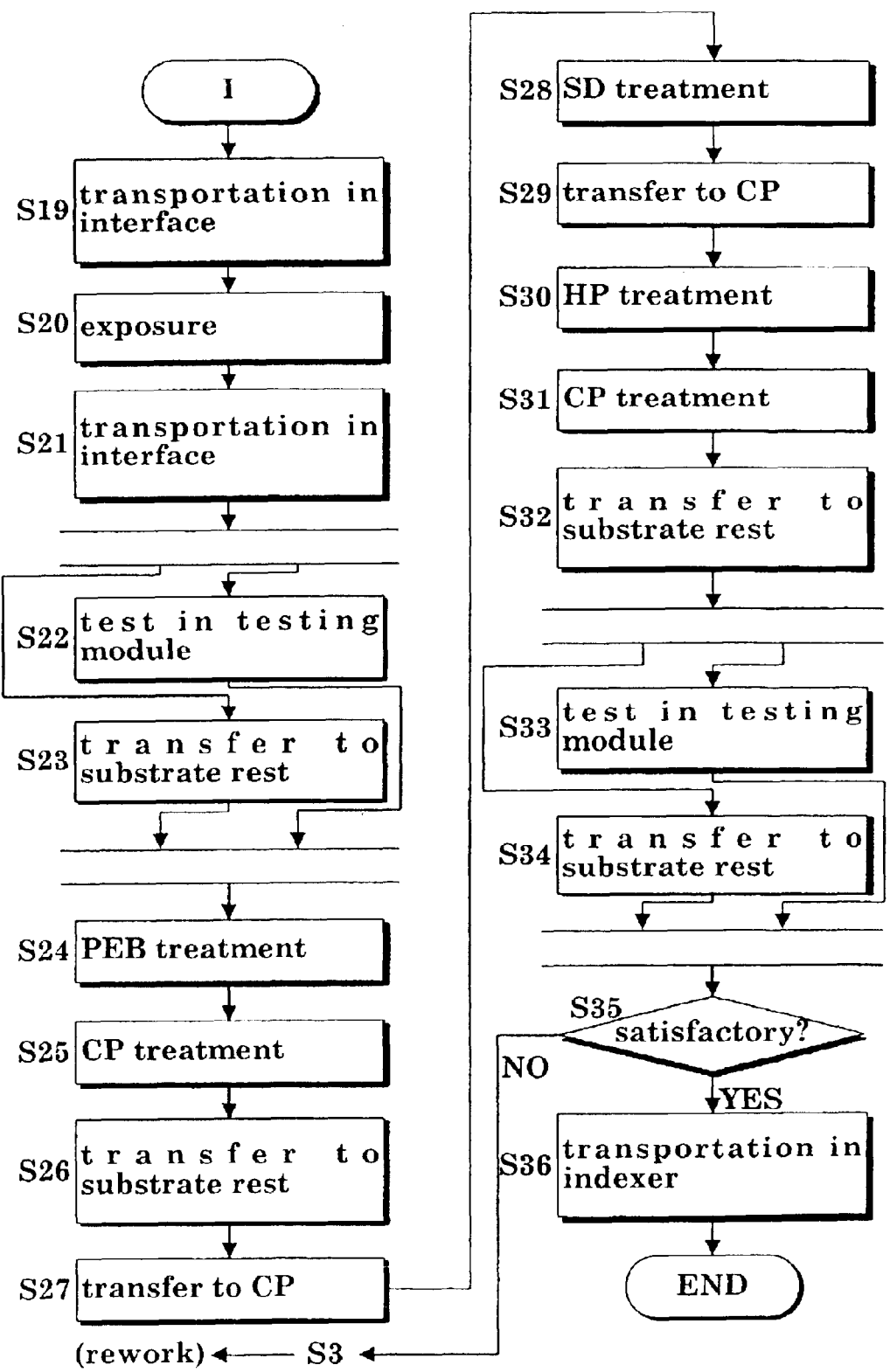
FIG. 20 is a flow chart showing a series of substrate treatments in a photolithographic process by the substrate treating apparatus in the second embodiment.

A series of substrate treatments in a photolithographic process will be described hereinafter with reference to the flowcharts of FIGS. 19 and 20 and to FIGS. 21 and 22. While a plurality of wafers W are processed in parallel in each treatment, the following description centers on one wafer W. Among the transport mechanisms in FIGS. 21 and 22, ID represents the indexer, SC the spin coaters (numeral 18 for anti-reflective coating formation, and numeral 20 for resist film formation), EE represents edge exposure, IF the interface, PEB post-exposure bake and SD the spin developers.

(Step S1) Transportation in Indexer:

A cassette C containing a plurality of wafers W to be treated is placed on the cassette table 2. To fetch one wafer W from this cassette C, the indexer's transport mechanism 8 moves horizontally along the indexer's transport path 7 to a position opposed to the cassette C. The arm base 8a is rotated in a horizontal plane to be opposed to the cassette C. The arm base 8a is moved vertically to a position opposed to the wafer W to be fetched from the cassette C. Then, the arm 8e is moved forward under the wafer W. The arm 8e is raised slightly to pick up the wafer W. The arm 8e holding the wafer W is retracted to take the wafer W out of the cassette C.

(Step S2) Test in Testing Module:

To test the wafer W in the testing module T of the heat-treating column 16A in the anti-reflective coating forming cell 12, the indexer's transport mechanism 8 moves along the indexer's transport path 7 and places the wafer W in the testing module T of the heat-treating column 16A in the cell 12. Specifically, the transport mechanism 8 moves along the transport path 7 to a position opposed to the testing module T. Then, the arm base 8a is raised and rotated to place the arm 8e opposite the testing module T. The arm 8e holding the wafer W is advanced to place the wafer W in the testing module T. Then, the arm 8e is retracted.

The wafer W placed in the testing module T is tested for sizes and numbers of dust particles adhering to the wafer W. When dust particles exceeding a predetermined size or predetermined number are found adhering to the wafer W as a result of the test, the wafer W is regarded as a reject. The treatment of this wafer W is discontinued, and the wafer W is returned to the cassette table 2 in the indexer 1, instead of transporting the wafer W to the heat-treating columns 16A–16H, spin coaters SC or spin developers SD. The treatment of the remaining wafers W, described hereinafter, fetched from the same cassette C as the tested wafer W, preferably, is also discontinued and the wafers W are returned to the cassette table 2 in the indexer 1, instead of transporting the wafers W to the heat-treating columns 16A–16H, spin coaters SC or spin developers SD.

(Step S3) Transfer to Substrate Rest:

While the test of the above wafer W is in progress, each of the remaining wafers W is transferred through the substrate rest "Pass". To pass each remaining wafer W to the transport mechanism 17 for heat treatment in the anti-reflective coating forming cell 12, the indexer's transport mechanism 8 moves along the indexer's transport path 7, and places each wafer W in the substrate rest "Pass" of the heat-treating column 16A in the cell 12.

(Step S4) Adhesion (AHL) Treatment:

To receive the wafer W placed in the testing module T or substrate rest "Pass", the arm base 17a of the transport mechanism 17 for heat treatment is raised and rotated in a horizontal plane. For the wafer W placed in the testing module T, when the arm 17d is placed opposite the testing module T, the arm 17d is advanced to take the wafer W out of the testing module T. For the wafer W placed in the substrate rest "Pass", when the arm 17d is placed opposite the substrate rest "Pass", the arm 17d is advanced through the opening 16a of the substrate rest "Pass" to take the wafer W out of the substrate rest "Pass". Then, the arm 17d holding the wafer W is retracted.

To treat the wafer W in one of the adhesion promoting modules AHL of the heat-treating column 16A, the arm base 17a is lowered to the adhesion promoting module AHL under the testing module T and substrate rest "Pass". The arm 17d is advanced through the opening 16a of the adhesion promoting module AHL and places the wafer W in the adhesion promoting module AHL. Then, the arm 17d is retracted.

The wafer W placed in the adhesion promoting module AHL receives adhesion promoting treatment to increase the adhesion of photoresist film to the wafer W.

The transport mechanism 17 for heat treatment also transfers the wafer W from the adhesion promoting module AHL to one of the cooling modules CP. The transport mechanism 17 may be kept on standby in front of the adhesion promoting module AHL until completion of the adhesion promoting treatment. For a higher processing efficiency, the transport mechanism 17 may be used to transport other wafers W until completion of the adhesion promoting treatment.

(Step S5) Cooling (CP) Treatment:

Upon completion of the adhesion promoting treatment, the arm 17d of the transport mechanism 17 advances into the adhesion promoting module AHL, and takes the wafer W out of the adhesion promoting module AHL.

To treat the wafer W in one of the cooling modules CP of the heat-treating column 16A, the arm base 17a is lowered to the cooling module CP under the adhesion promoting module AHL. Then, the arm 17d is advanced through the opening 16a of the cooling module CP, and places the wafer W in the cooling module CP.

The wafer W placed in the cooling module CP receives cooling treatment to cool the wafer W heated in the adhesion promoting module AHL and maintain it at room temperature.

(Step S6) Bottom Anti-Reflective Coating (BARC) Treatment:

After the cooling treatment, the arm 18d of the transport mechanism 18 for anti-reflective coating formation takes the wafer W out of the cooling module CP through the opening 16a of the cooling module CP.

To treat the wafer W in one of the spin coaters SC in the anti-reflective coating forming cell 12, the arm base 18a of the transport mechanism 18 is lowered and rotated. Then, the arm 18d is advanced to place the wafer W on the spin chuck (not shown) of the spin coater SC.

The wafer W placed in the spin coater SC receives anti-reflective coating treatment for forming an anti-reflective coating on the wafer W while spinning the wafer W.

(Step S7) Transfer to Cooling Module (CP):

After the anti-reflective coating treatment, the transport mechanism 18 unloads the wafer W from the spin coater SC.

To load the wafer W into one of the cooling modules CP in the heat-treatment column 16A, the arm base 18a of the transport mechanism 18 is raised and rotated. Then, the arm 18d is advanced to place the wafer W in the cooling module CP. The wafer W may be cooled in this cooling module CP as necessary.

(Step S8) Heating (HP) Treatment:

To receive the wafer W placed in the cooling module CP, the arm 17d of the transport mechanism 17 for heat treatment advances into the cooling module CP, and takes the wafer W out of the cooling module CP.

To treat the wafer W in one of the heating modules HP of the heat-treating column 16B in the anti-reflective coating forming cell 12, the arm 17d of the transport mechanism 17 advances into the heating module HP, and places the wafer W in the heating module HP.

The wafer W placed in the heating module HP receives heating treatment for heating the wafer W after the anti-reflective coating formation.

(Step S9) Transfer to Substrate Rest:

After the heating treatment, the transport mechanism 17 takes the wafer W out of the heating module HP.

To pass the wafer W on to the transport mechanism 19 for heat treatment in the resist film forming cell 13, the transport mechanism 17 for heat treatment places the wafer W in the substrate rest "Pass" of the heat-treating column 16C.

(Step S10) Transfer to Cooling Module (CP):

To receive the wafer W placed in the substrate rest "Pass", the transport mechanism 19 for heat treatment takes the wafer W out of the substrate rest "Pass".

The transport mechanism 19 places the wafer W in one of the cooling modules CP of the heat-treating column 16D. In this cooling module CP, cooling treatment is performed to cool the wafer W to a predetermined temperature.

(Step S11) Resist Film Forming (SC) Treatment:

To receive the wafer W placed in the cooling module CP, the transport mechanism 20 for resist film formation takes the wafer W out of the cooling module CP.

To treat the wafer W in one of the spin coaters SC in the resist film forming cell 13, the transport mechanism 20 places the wafer W on the spin chuck (not shown) of the spin coater SC.

The wafer W placed in the spin coater SC receives resist film forming treatment for forming resist film on the wafer W while spinning the wafer W.

(Step S12) Transfer to Cooling Module (CP):

After the resist film forming treatment, the transport mechanism 20 unloads the wafer W from the spin coater SC.

The transport mechanism 20 places the wafer W in one of the cooling modules CP of the heat-treating column 16D. The wafer W may be cooled in this cooling module CP as necessary.

(Step S13) Heating (HP) Treatment:

To receive the wafer W placed in the cooling module CP, the transport mechanism 19 takes the wafer W out of the cooling module CP.

To treat the wafer W in one of the heating modules HP of the heat-treating column 16E in the resist film forming cell 13, the transport mechanism 19 places the wafer W in the heating module HP.

The wafer W placed in the heating module HP receives heating treatment for heating the wafer W after the resist film formation.

(Step S14) Cooling (CP) Treatment:

After the heating treatment, the transport mechanism 19 takes the wafer W out of the heating module HP.

To treat the wafer W in one of the cooling modules CP of the heat-treating column 16D, the transport mechanism 19 places the wafer W in the cooling module CP.

The wafer W placed in the cooling module CP receives cooling treatment to cool the wafer W heated in the heating module HP and maintain it at room temperature.

(Step S15) Transfer to Substrate Rest:

After the cooling treatment, the transport mechanism 19 for heat treatment takes the wafer W out of the cooling module CP.

To pass the wafer W on to the transport mechanism 21 for edge exposure in the post-exposure baking cell 14, the transport mechanism 19 for heat treatment places the wafer W in the substrate rest "Pass" of the heat-treating column 16D.

(Step S16) Edge Exposure (EE) Treatment:

To receive the wafer W placed in the substrate rest "Pass", the transport mechanism 21 for edge exposure advances into the substrate rest "Pass", and takes the wafer W out of the substrate rest "Pass".

To treat the wafer W in one of the edge exposure units EE in the post-exposure baking cell 14 on the first story, the transport mechanism 21 places the wafer W in the edge exposure unit EE.

The wafer W placed in the edge exposure unit EE receives edge exposure treatment for exposes the edges of wafer W before an exposing process.

(Step S17) Transfer to Substrate Rest:

After the edge exposure treatment in the edge exposure unit EE, the transport mechanism 21 for edge exposure takes the wafer W out of the edge exposure unit EE.

To pass the wafer W on to the transport mechanism 29 in the interface 4, the transport mechanism 21 for edge exposure places the wafer W in the substrate rest "Pass", exclusive to the first story, in the rack 30 of the interface 4.

(Step S18) Temporary Storage in Buffer (BF):

To receive the wafer W placed in the substrate rest "Pass", the interface's transport mechanism 29 advances into the substrate rest "Pass" and takes the wafer W out of the substrate rest "Pass". When a waiting time occurs with the wafer W because of the processing time in the exposing apparatus STP, the interface's transport mechanism 29 stores the wafer W in one of the buffers BF exclusive to the first story. When an exposing process is performed without requiring the wafer W to wait for its turn, this temporary storage in the buffer BF is omitted.

(Step S19) Transportation in Interface:

To receive the wafer W placed in the buffer BF, the interface's transport mechanism 29 moves along the transport path 28, and the arm 29e of the transport mechanism 29 is advanced to take the wafer W out of the buffer BF through the opening of the buffer BF.

(Step S20) Exposure:

To process the wafer W in the exposing apparatus STP connected to the interface 4, the transport mechanism 29 moves along the transport path 28, and the arm 29e of the transport mechanism 29 is advanced to load the wafer W into the exposing apparatus STP. The wafer W is exposed in the exposing apparatus STP.

(Step S21) Transportation in Interface:

After the exposing process, the transport mechanism 29 moves the transport path 28 to unload the wafer W from the exposing apparatus STP.

(Step S22) Test in Testing Module:

To test the wafer W in the testing module T at the top of the interface rack 30, the transport mechanism 29 places the wafer W in the testing module T.

The wafer W placed in the testing module T is tested for alignment accuracy for exposure, for example. When the testing shows an alignment between the wafer W and a photomask failing to meet a predetermined level of accuracy, the wafer W is regarded as a reject. This wafer W is removed directly, to discontinue the treatment of this wafer W. The remaining wafers W, described hereinafter, preferably, are also removed and the treatment thereof discontinued since these wafers W are treated at substantially the same time as the tested wafer W.

(Step S23) Transfer to Substrate Rest:

While the test of the above wafer W is in progress, each of the remaining wafers W is transferred through the substrate rest "Pass". To pass each wafer W on to the transport mechanism 22 for post-exposure bake in the post-exposure baking cell 14 on the second story, the interface's transport mechanism 29 places the wafer W in the substrate rest "Pass", exclusive to the second story, in the rack 30 of the interface 4.

When an adjustment is needed for the time for passing the wafer W to the transport mechanism 22 for post-exposure bake, the interface's transport mechanism 29 transports the wafer W to one of the buffers BF exclusive to the second story for adjustment of time. When the transport mechanism 22 for post-exposure bake becomes ready to accept the wafer W, the interface's transport mechanism 29 transports the wafer W from the buffer BF to the substrate rest "Pass".

(Step S24) Post-Exposure Baking (PEB) Treatment:

To receive the wafer W placed in the testing module T or substrate rest "Pass", the transport mechanism 22 for post-exposure bake takes the wafer W out of the testing module T or substrate rest "Pass".

To treat the wafer W in one of the post-exposure baking modules PEB in the post-exposure baking cell 14 on the second story, the transport mechanism 22 for post-exposure bake places the wafer W in the post-exposure baking module PEB.

The wafer W placed in the post-exposure baking module PEB receives post-exposure baking treatment for heating the exposed wafer W.

(Step S25) Cooling (CP) Treatment:

After the post-exposure baking treatment, the transport mechanism 22 takes the wafer W out of the post-exposure baking module PEB.

To treat the wafer W in one of the cooling modules CP in the post-exposure baking cell 14 on the second story, the arm base 22a of the transport mechanism 22 is lowered to the cooling module CP under the post-exposure baking module PEB. Then, the arm 22d is advanced to place the wafer W in the cooling module CP.

The wafer W placed in the cooling module CP receives cooling treatment to cool the wafer W heated in the post-exposure baking module PEB and maintain it at room temperature.

(Step S26) Transfer to Substrate Rest:

After the cooling treatment, the transport mechanism 22 takes the wafer W out of the cooling module CP.

To pass the wafer W on to the transport mechanism 23 for heat treatment in the developing cell 15B, the transport mechanism 22 places the wafer W in the substrate rest "Pass" of heat-treating column 16F in the cell 15B.

When the treatment of wafers W is in progress in both the spin developers SD, the transport mechanism 22 may pass the wafer W on to the transport mechanism 23 for heat treatment in the developing cell 15B through the substrate rest "Pass" of the heat-treating column 16F in the cell 15B. The transport mechanism 23 in the cell 15B then passes the wafer W on to the transport mechanism 23 in the developing cell 15A through the substrate rest "Pass" of the heat-treating column 16H shared by the cells 15A and 15B. Further, the transport mechanism 23 in the developing cell 15A passes the wafer W on to the transport mechanism 24 for development in the cell 15A through one of the cooling modules CP of heat-treatment column 16F in the cell 15A. Subsequently, the transport mechanism 24 in the cell 15A places the wafer W in one of the spin developers SD in the cell 15A for development on the spin developer SD.

(Step S27) Transfer to Cooling Module (CP):

To receive the wafer W placed in the substrate rest "Pass", the transport mechanism 23 for heat treatment takes the wafer W out of the substrate rest "Pass".

The transport mechanism 23 places the wafer W in one of the cooling module CP of the heat-treating column 16F. This cooling module CP may be operated to adjust the wafer W to a temperature around room temperature with increased precision.

(Step S28) Developing (SD) Treatment:

To receive the wafer W placed in the cooling module CP, the transport mechanism 24 for development takes the wafer W out of the cooling module CP.

To treat the wafer in one of the spin developers SD in the developing cell 15B, the transport mechanism 24 places the wafer W on the spin chuck (not shown) of the spin developer's SD.

The wafer W placed in the spin developer SD is developed while being spun.

(Step S29) Transfer to Cooling Module (CP):

After the developing treatment, the transport mechanism 24 unloads the wafer W from the spin developer SD.

To pass the wafer W on to the transport mechanism 23 for heat treatment in the developing cell 15B, the transport mechanism 24 places the wafer W in one of the cooling modules CP of the heat-treating column 16F in the developing cell 15B.

(Step S30) Heating (HP) Treatment:

To receive the wafer W placed in the cooling module CP, the transport mechanism 23 takes the wafer W out of the cooling module CP.

To treat the wafer W in one of the heating modules HP of the heat-treating column 16G in the developing cell 15B, the transport mechanism 23 places the wafer W in the heating module HP.

The wafer W placed in the heating module HP receives heating treatment for heating the developed wafer W.

(Step S31) Cooling (CP) Treatment:

After the heating treatment, the transport mechanism 23 takes the wafer W out of the heating module HP.

To treat the wafer W in one of the cooling modules CP of the heat-treating column 16G, the arm base 23a of the transport mechanism 23 is lowered to the cooling module CP under the heating module HP. Then, the arm 23d is advanced to place the wafer W in the cooling module CP.

The wafer W placed in the cooling module CP receives cooling treatment to cool the wafer W heated in the heating module HP and maintain it at room temperature.

(Step S32) Transfer to Substrate Rest:

After the cooling treatment, the transport mechanism 23 takes the wafer W out of the cooling module CP.

To pass the wafer W on to the transport mechanism 23 for heat treatment in the developing cell 15A, the transport mechanism 23 in the developing cell 15B places the wafer W in the substrate rest "Pass" of heat-treating column 16H.

(Step S33) Test in Testing Module:

To test the wafer W in the testing module T of the heat-treating column 16F in the developing cell 15A, the transport mechanism 23 for heat treatment in the developing cell 15A takes the wafer W out of the substrate rest "Pass" of the heat-treating column 16H, and places the wafer W in the testing module T. The testing of the wafer W placed in the testing module T will be described in detail hereinafter in relation to step S35 (satisfactory?).

(Step S34) Transfer to Substrate Rest:

While the test of the above wafer W is in progress, each of the remaining wafers W is transferred through the substrate rest "Pass". That is, to pass each wafer W on to the transport mechanism 8 in the indexer 1, the transport mechanism 23 places the wafer W in the substrate rest "Pass" of heat-treating column 16F in the developing cell 15A.

(Step S35) Satisfactory?

The wafer W placed in the testing module T is tested for circuit pattern defects. When the testing shows a circuit pattern defect, the wafer W is regarded as unacceptable. The wafer W found unacceptable is transported through the indexer 1 and placed again in the substrate rest "Pass" of the heat-treating column 16A in the anti-reflective coating forming cell 12 (step S3) to treat the wafer W all over again (reworking). The remaining wafers W transferred through the substrate rest "Pass" in step S34 at this time, preferably, are also transported through the indexer 1 and placed again in the substrate rest "Pass" of the heat-treating column 16A after step S34 to be reworked since these wafers W are treated at substantially the same time as the tested wafer W.

(Step S36) Transportation in Indexer:

To take out the wafer W placed in the testing module T or substrate rest "Pass", the indexer's transport mechanism 8 moves along the indexer's transport path 7. The arm 8e of the transport mechanism 8 is advanced to take the wafer W out of the testing module T or substrate rest "Pass".

To deposit the wafer W in a cassette C placed on the cassette table 2, the transport mechanism 8 moves along the transport path 7 to a position opposed to the cassette C. The arm base 8a of the transport mechanism 8 is rotated in a horizontal plane to be opposed to the cassette C. Then, the arm base 8a is lowered to a position opposed to a stage in the cassette C for receiving the wafer W, and the arm 8e is advanced and slightly lowered to place the wafer W on that stage. The arm 8e is withdrawn, leaving the wafer W in the cassette C.

A predetermined number of treated wafers W are successively deposited in the cassette C to complete the series of substrate treatments.

The second embodiment solves the problem (III) described hereinbefore.

Regarding Problem (III):

The substrate treating apparatus in the second embodiment having the above construction produces the following effects. The treating transport paths 25 and 26 are arranged on the lower and upper stories for transporting the wafers W between the heat-treating columns 16 and spin coaters SC and between the heat-treating columns 16 and spin developers SD. The testing module T of heat-treating column 16A is disposed at the starting point of the treating transport paths 25 on the first story, i.e. in a location adjacent the indexer 1. The testing module T of interface rack 30 is disposed at the terminal point of the treating transport paths 25, i.e. in the interface 4 (this terminal point being also the starting point of the treating transport paths 26 on the second story). The testing module T of heat-treating column 16F is disposed at the terminal point of the treating transport paths 26, i.e. in a location adjacent the indexer 1.

With the testing module T disposed at the starting point of the treating transport paths 25 on the first story, the treating apparatus can check the condition of the wafer W present at the starting point of the treating transport paths 25, i.e. the condition of the wafer W before the series of heat treatments, anti-reflective coating formation and resist film formation (step S2). With the testing module T disposed at the terminal point of the treating transport paths 25, the treating apparatus can check the condition of the wafer W present at terminal point of the treating transport paths 25, i.e. the condition of the wafer W immediately after the series of heat treatments, anti-reflective coating formation and resist film formation. (Note that, in the above steps, the wafer W is not checked immediately after the series of heat treatments, anti-reflective coating formation or resist film formation.)

With the testing module T disposed at the starting point of the treating transport paths 26 on the second story, the treating apparatus can check the condition of the wafer W present at the starting point of the treating transport paths 26, i.e. the condition of the wafer W before the series of heat treatments and development (step S22). With the testing module T disposed at the terminal point of the treating transport paths 26, the treating apparatus can check the condition of the wafer W present at terminal point of the treating transport paths 26, i.e. the condition of the wafer W immediately after the series of heat treatments and development (step S33).

As noted above, the condition of the wafer W is checked before the series of heat treatments and development (step S22). This means that, in the second embodiment, the condition of the wafer W immediately after exposure may be checked.

Since the testing modules T are provided at the starting points and terminal points of the treating transport paths 25 and 26, respectively, as described above, a reduction may be made in the waiting time of wafers W due to interference between the wafers W being tested and other wafers W, compared with a case of testing wafers W halfway through each of the treating transport paths 25 and 26. With the testing modules T incorporated into the apparatus in the second embodiment, a reduction may be made in the time taken in transporting wafers W for testing. Thus, the efficiency of treating wafers W including the testing of wafers W is improved.

In the second embodiment, a test may be carried out in the testing module T of the heat-treating column 16A at the starting point of the treating transport paths 25 while transferring wafers W between the indexer 1 and the heat-treating column 16A through the substrate rest "Pass" and the testing module T of the heat-treating column 16A. A test may be carried out in the testing modules T of the interface rack 30 at the terminal point of the treating transport paths 25 (and at the starting point of the treating transport paths 26) while transferring wafers W between the interface 4 and each treating module (e.g. an edge exposure module EE, post-exposure baking module PEB or cooling module CP) of the post-exposure baking cell 14 through the substrate rests "Pass" and testing modules T of the interface rack 30. A test may be carried out in the testing module T of the heat-treating column 16F at the terminal point of the treating transport paths 26 while transferring wafers W between the heat-treating column 16F and indexer 1 through the substrate rest "Pass" and the testing module T of the heat-treating column 16F. As a result, the efficiency of treating wafers W may be improved.

Further, in the second embodiment, the wafers W other than the wafer W subjected to the tests are transferred, without being tested, through the substrate rests "Pass" between the indexer 1, interface 4, heat-treating columns 16, spin coaters SC and spin developers SD. Thus, while certain of the wafers W are tested, the remaining wafer W may be transferred, to further improve the treating efficiency.

In the series of substrate treatments in steps S1–S36, the testing modules T determine acceptance or rejection of wafers W treated in the respective treating units including exposure. In particular, the wafers W regarded as unacceptable in step S33 are transported through the indexer 1 and placed again in the substrate rest "Pass" of the heat-treating column 16A at the starting point of the treating transport paths 25. The wafers W placed are transported again along the treating transport paths 25 for repeated treatment. In this way, the wafers W regarded as unacceptable may be reworked.

This invention is not limited to the embodiments described above, but may be modified as follows:

(1) The first and second embodiments have been described by taking resist application and development in a photolithographic process for example. The described substrate treatments are not limitative. The invention is applicable to any substrate treatment performed in a usual way for semiconductor substrates, glass substrates for liquid crystal displays, glass substrates for photomasks or substrates for optical disks. Such treatment includes, for example, a chemical treatment including cleaning and etching performed by immersing substrates in treating solutions, and drying, etching treatment other than the above immersion type (e.g. dry etching and plasma etching), cleaning other than the immersion type performed by spinning substrates (e.g. sonic cleaning and chemical cleaning), etching, chemical-mechanical polishing (CMP), sputtering, chemical vapor deposition (CVD) and ashing.

Figure 23:
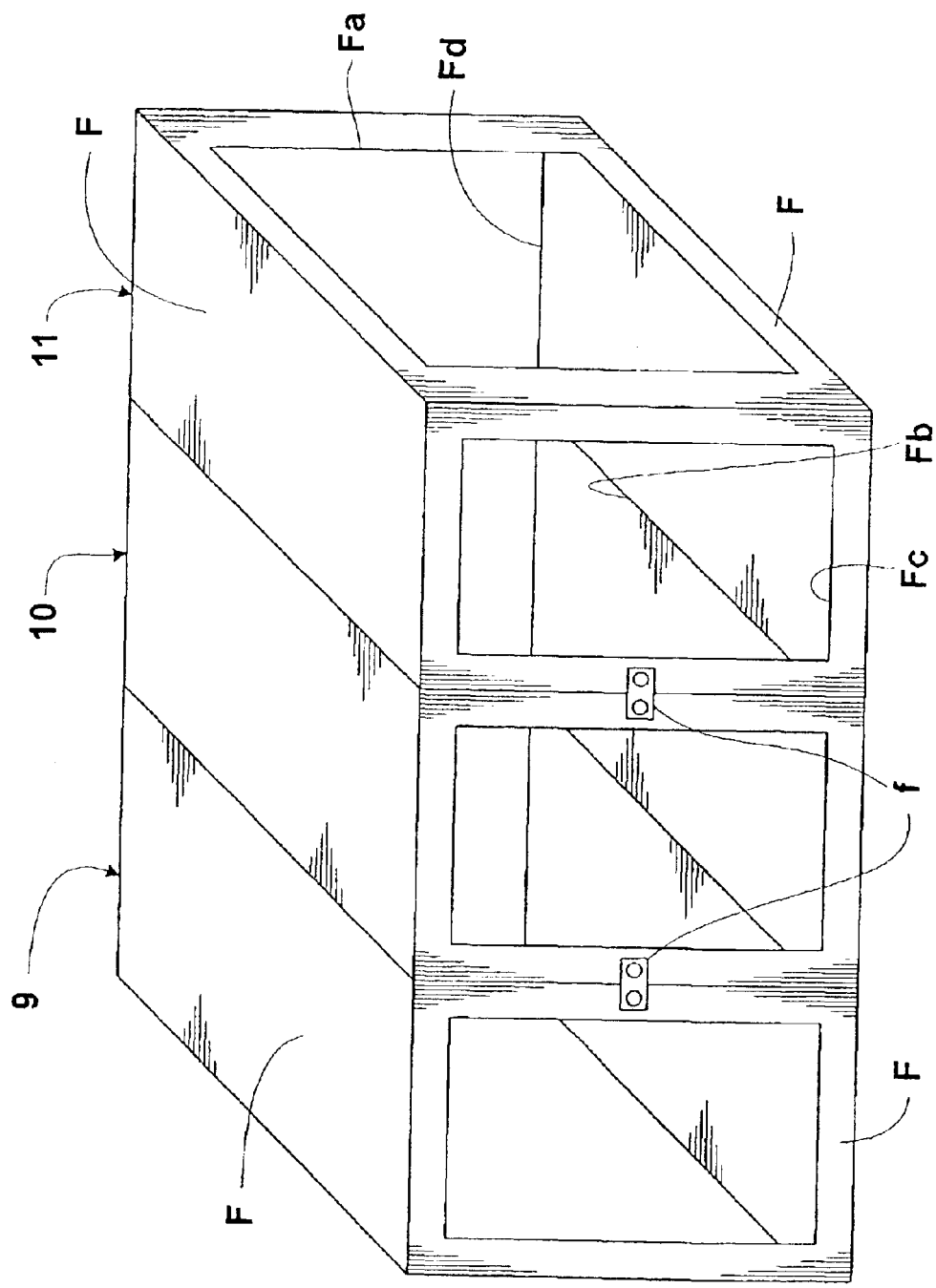
FIG. 23 is a perspective view showing an outline of a first to a third treating units with outer frames.

(2) Each of the first to third treating units 9–11 in the first and second embodiments may be constructed as follows. As shown in FIG. 23, each unit has an opening Fa formed in a right-hand side, an opening Fb in a left-hand side, an opening Fc in a front side, and an opening Fd in a back side. With these openings Fa–Fd formed, outer wall portions of each unit other than the opening Fa–Fd act as outer frames F, respectively. The frames F of two adjoining units are connected by coupling elements f (e.g. fittings). Thus, the opening Fa in the right-hand side of one unit is aligned with the opening Fb in the left-hand side of the other unit to place the two units in communication with each other. This construction allows the first to third treating units 9–11 to be arranged in a direction for transporting wafers W. These units may be made attachable and detachable to be variable in number according to the number of wafers W to be treated. Particularly in a modification of the second embodiment having testing units 41 to be described hereinafter, the testing units 41 may also have a construction similar to the first to third treating units 9–11.

Figure 24:
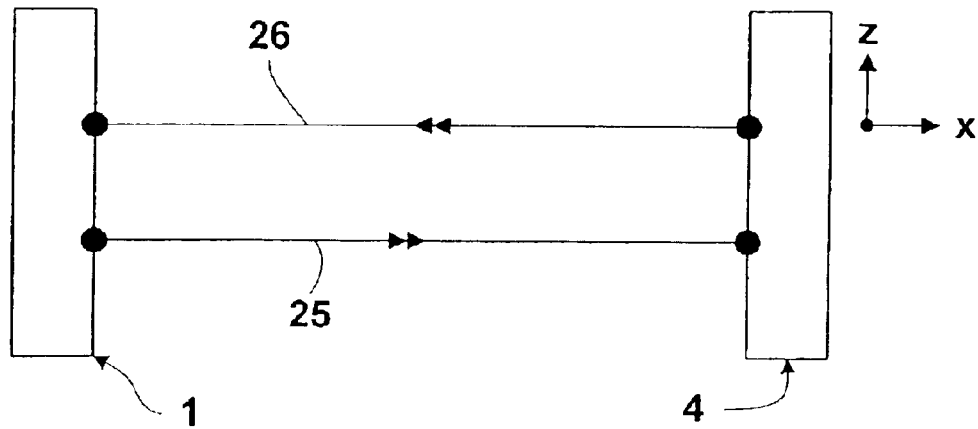
FIG. 24 is a path block diagram in side view of the substrate treating apparatus in the first embodiment.

The aspect of the first embodiment for solving the problem (I) may be modified as follows:

(3) In the first embodiment described hereinbefore, as shown in the path block diagram in side view in FIG. 24, the treating transport paths 25 are connected to the indexer 1, and the treating transport paths 26 to the interface 4. These paths may be modified as set out hereunder. The black circles in FIGS. 24 through 35 represent connections. The arrows in FIGS. 24 through 35 indicate directions for transporting wafers W.

Figure 25:
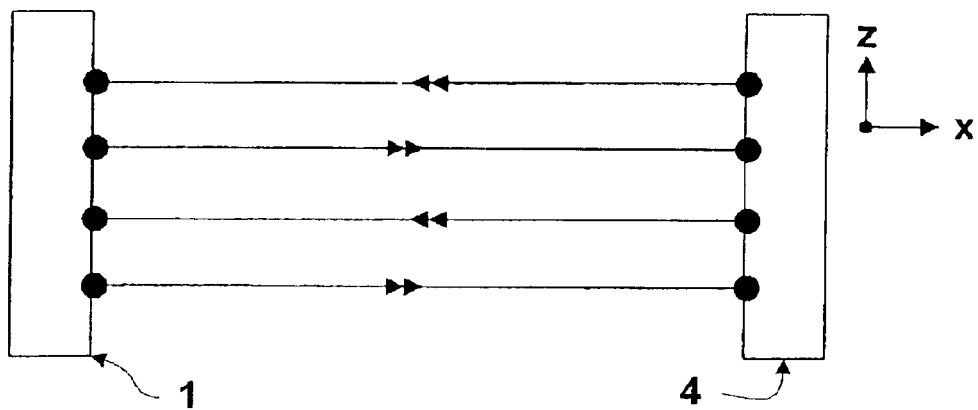
FIG. 25 is a path block diagram in side view of a modified substrate treating apparatus in the first embodiment.

In the first embodiment, the substrate transport paths are arranged on two stories (treating transport paths 25 and 26). As shown in FIG. 25, for example, the substrate transport paths may be arranged on three or more stories.

Figure 26:
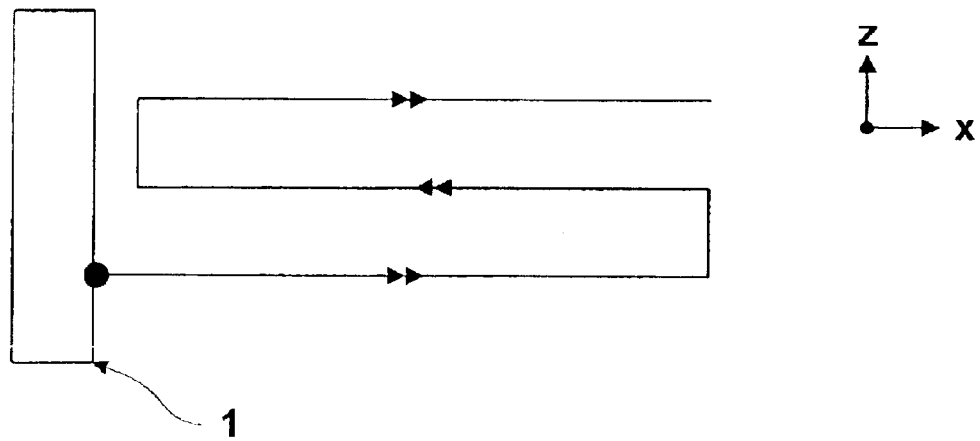
FIG. 26 is a path block diagram in side view of another modified substrate treating apparatus.
Figure 27:
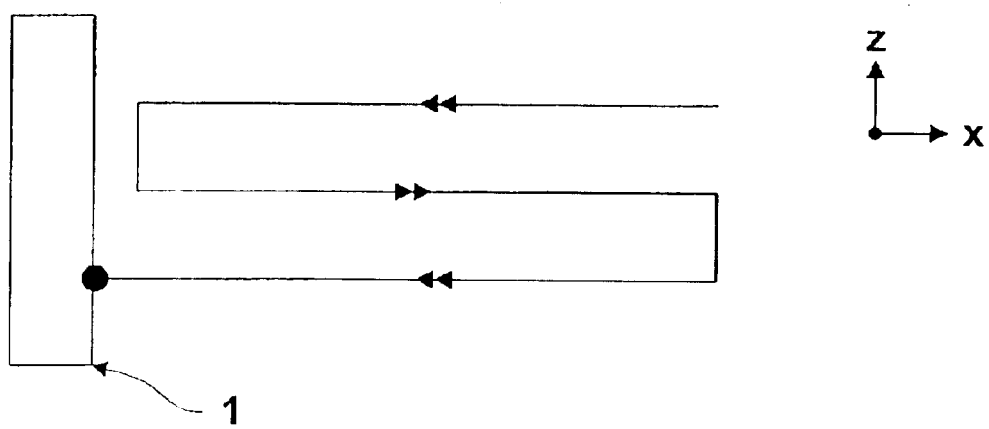
FIG. 27 is a path block diagram in side view of a further modified substrate treating apparatus.
Figure 28:
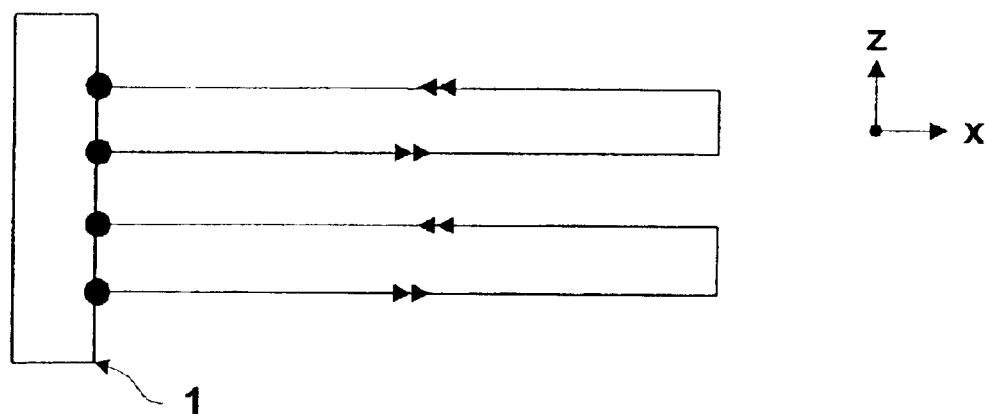
FIG. 28 is a path block diagram in side view of a further modified substrate treating apparatus.

The apparatus may have only the indexer 1 connected thereto, without connecting the interface 4. As shown in FIGS. 26 and 27, an end of the series of substrate transport paths on the upper and lower stories may be connected to the indexer 1. As shown in FIG. 28, the ends of the substrate transport path on each story may be connected to the indexer 1.

While the constructions shown in FIGS. 26 and 27 are the same, the wafers W are transported in opposite directions. That is, in FIG. 26, a wafer W introduced is transported through the indexer 1 and placed at the end of the series of substrate transport paths connected to the indexer 1. The wafer W placed is transported through the series of substrate transport paths from one treating unit to another for substrate treatment. The wafer W having received the series of substrate treatments is discharged from the substrate treating apparatus through a discharge outlet not shown. On the other hand, in FIG. 27, a wafer W fed from outside into a treating unit in the substrate treating apparatus through a feed inlet not shown is transported through the series of substrate transport paths from one treating unit to another to receive the series of substrate treatments. The wafer W having received the series of substrate treatments is placed at the end of the series of substrate transport paths. Then, the wafer W is transported through the indexer 1 connected to the end of the series of substrate transport paths, and discharged from the substrate treating apparatus.

In FIG. 28, a wafer W to be treated is transported through the indexer 1 and placed at one of the ends of the substrate transport paths arranged on the two stories and connected to the indexer 1. The wafer W placed is transported through the substrate transport path from one treating unit to another for substrate treatment on the story on which the wafer W is placed. The wafer W having received the substrate treatment is placed at the end of the substrate transport path on that story. Then, the wafer W is transported through the indexer 1 connected to the end of the substrate transport path, and discharged from the substrate treating apparatus.

A plurality of wafers W may be transported through the indexer 1 and placed, at substantially the same time, at the ends of the substrate transport paths arranged on the two stories and connected to the indexer 1 to receive substrate treatment at substantially the same time. The wafers W having received the series of substrate treatments may be placed at the ends of the substrate transport paths on the stories on which the wafers W are placed, respectively. Further, the wafers W may be transported through the indexer 1 connected to the ends of the substrate transport paths, and placed again at the ends of the substrate transport paths to receive the series of substrate treatments repeatedly.

In any case, the substrate treating apparatus shown in FIGS. 26 through 28 are effective for performing substrate treatment without connecting an external treating apparatus such as the exposing apparatus STP provided in the first embodiment.

Figure 29:
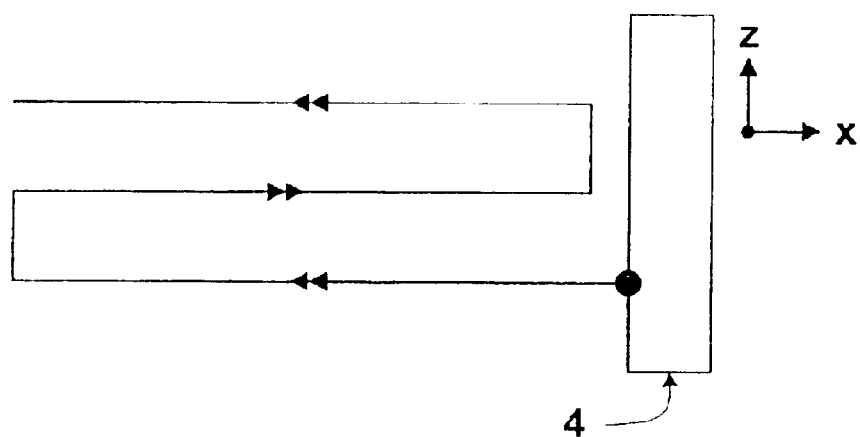
FIG. 29 is a path block diagram in side view of a further modified substrate treating apparatus.
Figure 30:
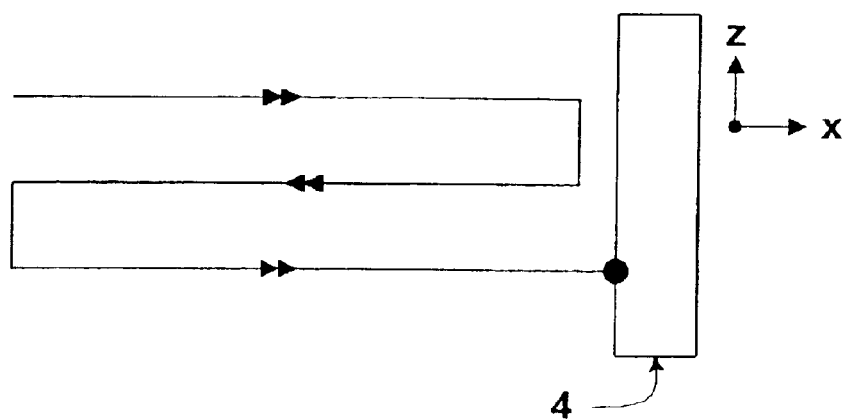
FIG. 30 is a path block diagram in side view of a further modified substrate treating apparatus.
Figure 31:
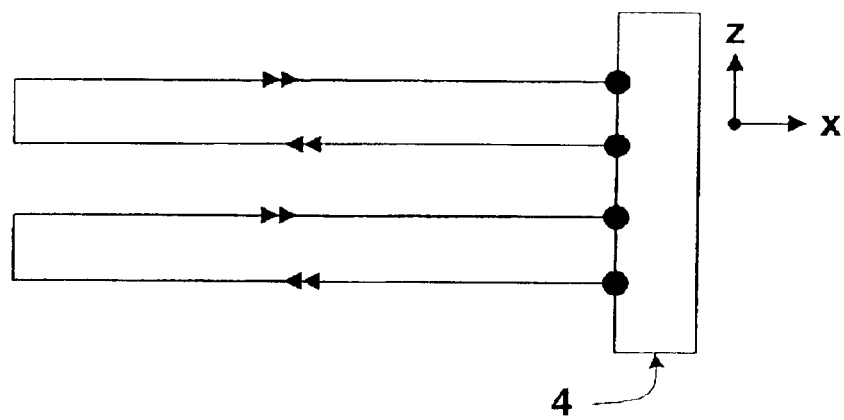
FIG. 31 is a path block diagram in side view of a further modified substrate treating apparatus.

Conversely, the apparatus may have only the interface 4 connected thereto, without connecting the indexer 1. As shown in FIGS. 29 and 30, an end of the series of substrate transport paths on the upper and lower stories may be connected to the interface 4. As shown in FIG. 31, ends of the substrate transport path on each story may be connected to the interface 1.

While the constructions shown in FIGS. 29 and 30 are the same, the wafers W are transported in opposite directions. That is, in FIG. 29, after treatment by an external treating apparatus such as the exposing apparatus STP, the wafer W treated is transported through the interface 4 and placed at the end of the series of substrate transport paths connected to the interface 4. The wafer W placed is transported through the series of substrate transport paths from one treating unit to another for substrate treatment. The wafer W having received the series of substrate treatments is discharged from the substrate treating apparatus through a discharge outlet not shown. On the other hand, in FIG. 30, a wafer W fed from outside into a treating unit in the substrate treating apparatus through a feed inlet not shown is transported through the series of substrate transport paths from one treating unit to another to receive the series of substrate treatments. The wafer W having received the series of substrate treatments is placed at the end of the series of substrate transport paths. Then, the wafer W is transported through the interface 4 connected to the end of the series of substrate transport paths, and passed on to the external treating apparatus such as the exposing apparatus STP to be treated by the external treating apparatus.

In FIG. 31, after treatment by the external treating apparatus, the wafer W treated is transported through the interface 4 and placed at one end of one of the substrate transport paths arranged on the two stories and connected to the interface 4. The wafer W placed is transported through the substrate transport path from one treating unit to another for substrate treatment on the story on which the wafer W is placed. The wafer W having received the substrate treatment is placed at the end of the substrate transport path on that story. Then, the wafer W is transported through the interface 4 connected to the end of the substrate transport path, and passed on to the external treating apparatus to be treated by the external treating apparatus again.

A plurality of wafers W having been treated by the external treating apparatus may be transported through the interface 4 and placed, at substantially the same time, at the ends of the substrate transport paths arranged on the two stories and connected to the interface 4 to receive substrate treatment at substantially the same time. The wafers W having received the series of substrate treatments may be placed at the ends of the substrate transport paths on the stories on which the wafers W are placed, respectively. Further, the wafers W may be transported through the interface 4 connected to the ends of the substrate transport paths, and placed again at the ends of the substrate transport paths to receive the series of substrate treatments repeatedly.

Figure 32:
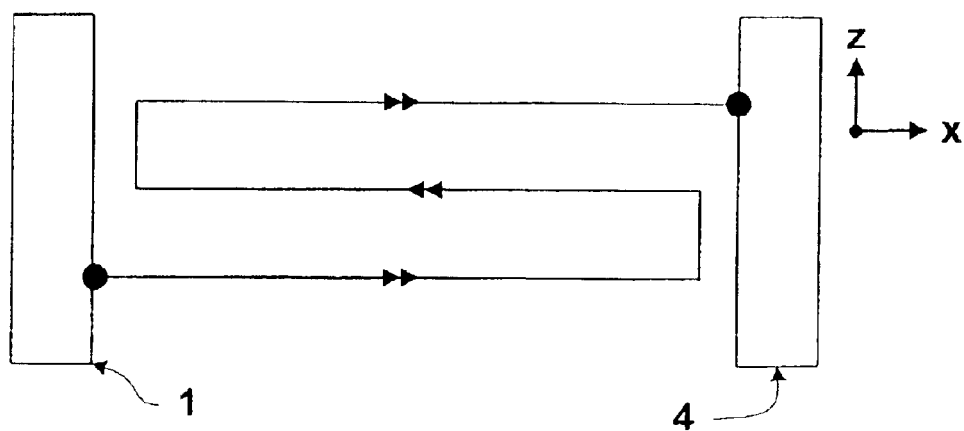
FIG. 32 is a path block diagram in side view of a further modified substrate treating apparatus.
Figure 33:
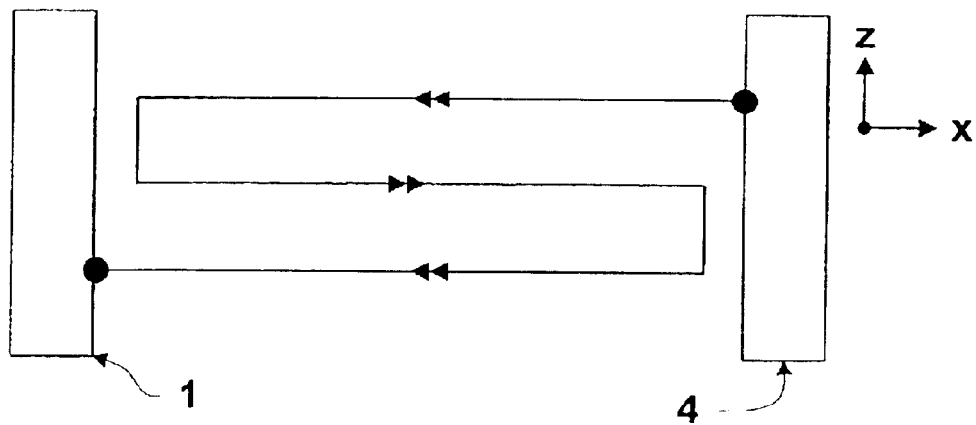
FIG. 33 is a path block diagram in side view of a further modified substrate treating apparatus.

In the first embodiment described hereinbefore, one end of the substrate transport path on each story (the substrate transport paths 25 or 26) is connected to the indexer 1, while the other end thereof is connected to the interface 4. As shown in FIGS. 32 and 33, one end of the series of substrate transport paths arranged on the two stories may be connected to the indexer 1, and the other end to the interface 4.

While the constructions shown in FIGS. 32 and 33 are the same, the wafers W are transported in opposite directions. That is, in FIG. 32, a wafer W introduced is transported through the indexer 1 and placed at the end of the series of substrate transport paths connected to the indexer 1. The wafer W placed is transported through the series of substrate transport paths from one treating unit to another for substrate treatment. The wafer W having received the series of substrate treatments is placed at the other end of the series of substrate transport paths. Then, the wafer W is transported through the interface 4 connected to the other end of the series of substrate transport paths, and passed on to an external treating apparatus such as the exposing apparatus STP to be treated by the external treating apparatus. On the other hand, in FIG. 33, after treatment by the external treating apparatus such as the exposing apparatus STP, the wafer W treated is transported through the interface 4 and placed at the other end of the series of substrate transport paths connected to the interface 4. The wafer W placed is transported through the series of substrate transport paths from one treating unit to another for substrate treatment. The wafer W having received the substrate treatment is placed at the one end of the series of substrate transport paths. Then, the wafer W is transported through the indexer 1 connected to the one end of the series of substrate transport paths, and discharged from the substrate treating apparatus.

Figure 34:
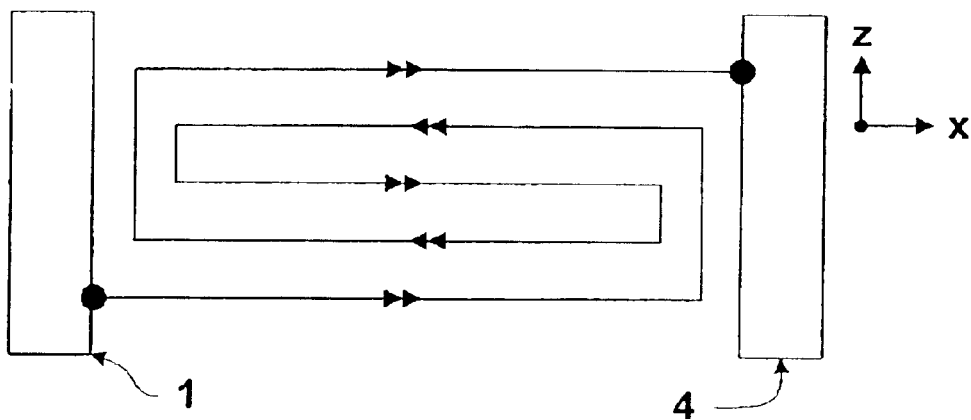
FIG. 34 is a path block diagram in side view of a further modified substrate treating apparatus.

In the first embodiment shown in FIGS. 25 through 33, the substrate transport paths arranged on the different stories to transport wafers W first on the lower story and then on the upper story, or vice versa. As shown in FIG. 34, the substrate transport path first extending on a lower level, in a direction for transporting wafers W, may be turned up and back once, then turned down and back, and again turned up and back. In other words, with the substrate transport direction reversed alternately, a going-only path and a return-only path may be arranged to alternate in the vertical direction.

Figure 35:
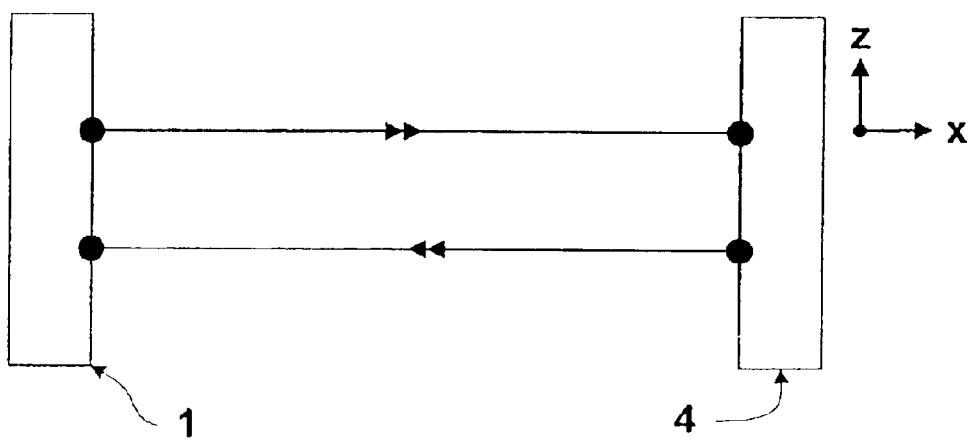
FIG. 35 is a path block diagram in side view of a further modified substrate treating apparatus.

In the first embodiment described hereinbefore, the treating transport paths 25 constituting the going-only path are arranged below, and the treating transport paths 26 constituting the return-only path arranged above. As shown in FIG. 35, the treating transport paths 25 constituting the going-only path may be arranged above, and the treating transport paths 26 constituting the return-only path arranged below.

(4) In the first embodiment described hereinbefore, the first to third treating units 9–11 including part of the treating transport paths 25 and 26 are arranged in the direction for transporting wafers W. Instead of the unit construction, the treating transport paths (treating transport paths 25 and 26) may, respectively, be formed integral.

Figure 36A:
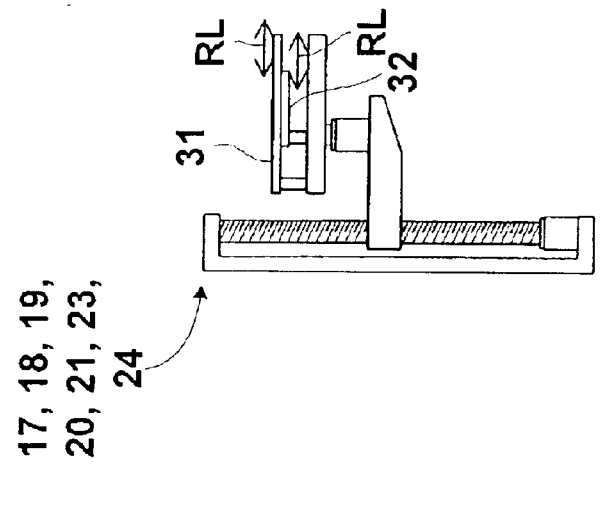
FIG. 36A is a plan view of a transport mechanism for heat treatment, anti-reflective coating formation, resist film formation, edge exposure or development in a modified embodiment.

(5) In the first embodiment described hereinbefore, each of the transport mechanisms 17–21, 23 and 24 for transporting wafers W along the substrate transport paths (treating transport paths 25 and 26), as shown in FIG. 6, has one arm (arm 17d in the case of the transport mechanism 17 for heat treatment) for both loading and unloading the wafers W. As shown in FIG. 36, each transport mechanism may have two arms, one of which is a loading arm 31 for loading wafers W into the treating devices, and the other an unloading arm 32 for unloading wafers W from the treating devices.

Figure 36B:
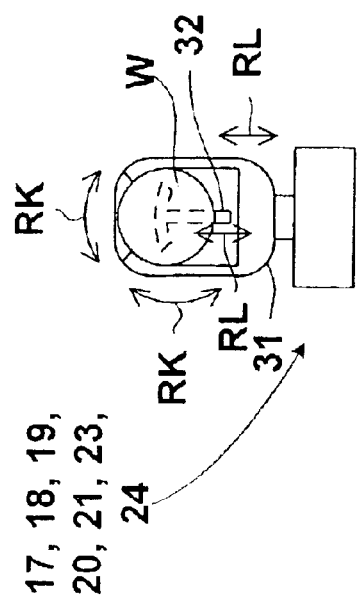
FIG. 36B is a side view of FIG. 36A.

For example, one of the loading arm 31 and unloading arm 32 holds each wafer W by sucking the back surface of the wafer W, and the other arm holds each wafer W by gripping edges of the wafer W. In FIG. 36, the unloading arm 32 holds each wafer W by sucking the back surface of the wafer W, and the loading arm 31 holds each wafer W by gripping edges of the wafer W. As shown in FIG. 36B, the loading arm 31 is disposed above the unloading arm 32. Further, as shown in FIG. 36B, each arm 31 or 32 is rotatable about z-axis (in the directions of arrow RK) and extendible and retractable radially of the rotation (in the directions of arrow RL). When the unloading arm 32 unloads a wafer W by holding the back surface of the wafer W, the loading arm 31 is advanced horizontally to grip the edges of the wafer W while the unloading arm 32 is withdrawn horizontally. When the loading arm 31 has gripped the edges of the wafer W, the unloading arm 32 cancels the suction of the back surface of the wafer W. Then, the loading arm 31 advances, while holding the wafer W, to load the wafer W into a treating device. In this case, while the loading arm 31 loads a wafer W into a treating module, the unloading arm 32 can unload a wafer W from the treating module. As a result, substrate treatment may be performed with increased efficiently. The loading arm 31 corresponds to the loading transport mechanism of this invention. The unloading arm 32 corresponds to the unloading transport mechanism of this invention.

The aspect of the first embodiment for solving the problem (II) may be modified as follows:

(6) In the first embodiment described hereinbefore, the third treating unit 11 including the post-exposure baking cell 14 is arranged with the first and second treating units 9 and 10 to perform edge exposure and post-exposure bake. Where no edge exposure or post-exposure bake is performed, the third treating unit 11 need not necessarily be provided. In this case, the second treating unit 10 including the resist film forming cell 13 and developing cell 15B is connected directly to the interface 4. The substrate rest "Pass" in the heat-treating column 16D of the resist film forming cell 13, and the substrate rest "Pass" in the heat-treating column 16F of developing cell 15B, along with the interface rack 30, constitute the second receiver of this invention.

(7) In the first embodiment described hereinbefore, the substrate rests "Pass" in the heat-treating columns 16A and 16F, constituting the first receiver of this invention, are arranged in the positions adjacent the indexer 1, i.e. at the ends, of the treating transport paths 25 and 26. The two substrate rests "Pass" may be vertically opposed to each other from the first story to the second story, and disposed in the indexer 1, or may be disposed to bridge the indexer 1 and treating transport paths 25 and 26. Similarly, the interface rack 30 disposed in the interface 4 and acting as the second receiver of this invention may be divided into substrate rest "Pass" exclusive to the first story and substrate rest "Pass" exclusive to the second story. The substrate rests "Pass" for the respective stories may be disposed in positions adjacent the interface 4, i.e. at the ends, of the treating transport paths 25 and 26, or may be disposed to bridge the interface 4 and treating transport paths 25 and 26.

(8) The first embodiment described hereinbefore includes the substrate rests "Pass" in the heat-treating columns 16A and 16F acting as the first receiver of this invention, and the interface rack 30 acting as the second receiver of this invention. The substrate rests "Pass" and interface rack 30 are not absolutely necessary where wafers W are transferred directly without using the substrate rests "Pass" and the interface rack 30, i.e. without placing the wafers in the substrate rests "Pass" and the interface rack 30. Of course, either the substrate rests "Pass" or the interface rack 30 may be provided.

(9) In the first embodiment described hereinbefore, as shown in the path block diagram in side view in FIG. 24, the treating transport paths 25 and 26 on the respective stories are connected to the indexer 1 and to the interface 4. These paths may be modified as set out hereunder. In FIGS. 24 and 37 through 40, the black circles represent connections, and the arrows indicate directions for transporting wafers W.

In the first embodiment, as in the above modification (3), the substrate transport paths are arranged on two stories (treating transport paths 25 and 26). As shown in FIG. 25, for example, the substrate transport paths may be arranged on three or more stories.

Figure 37:
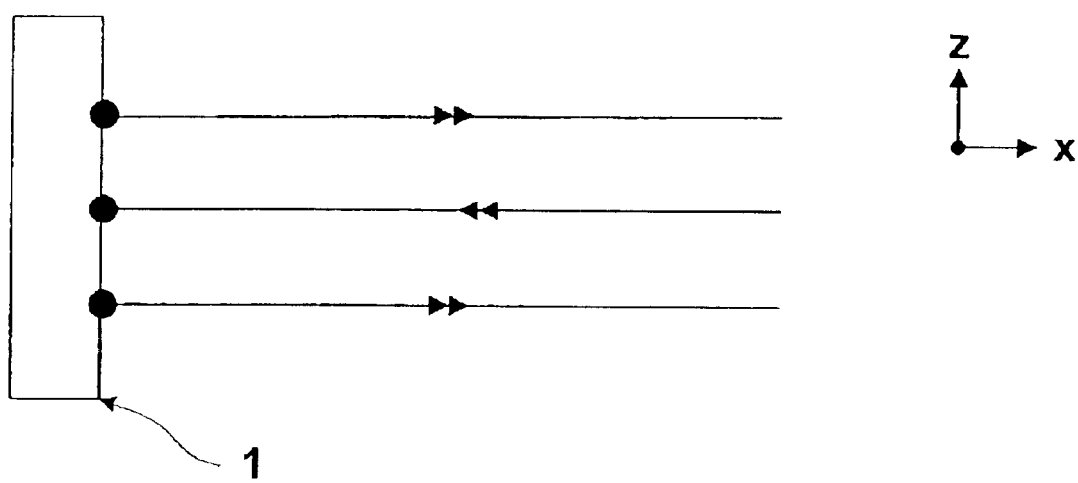
FIG. 37 is a path block diagram in side view of a further modified substrate treating apparatus.

The apparatus may have only the indexer 1 connected thereto, without connecting the interface 4. As shown in FIG. 37, an end of the substrate transport path on each story may be connected to the indexer 1. The other end of the substrate transport path is connected to a substrate inlet or substrate outlet not shown. The substrate treating apparatus shown in FIG. 37 is effective for performing substrate treatment without connecting an external treating apparatus such as the exposing apparatus STP provided in the first embodiment.

Figure 38:
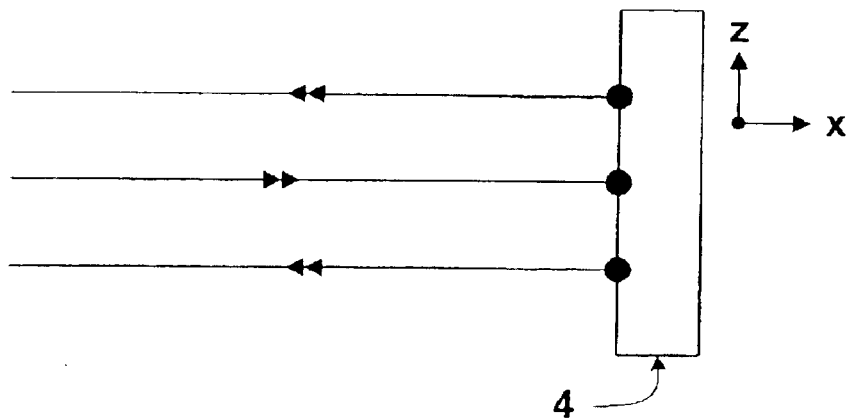
FIG. 38 is a path block diagram in side view of a further modified substrate treating apparatus.

Conversely, the apparatus may have only the interface 4 connected thereto, without connecting the indexer 1. As shown in FIG. 38, an end of the substrate transport path on each story may be connected to the interface 4. The other end of the substrate transport path is connected to a substrate inlet or substrate outlet as noted above.

Figure 39:
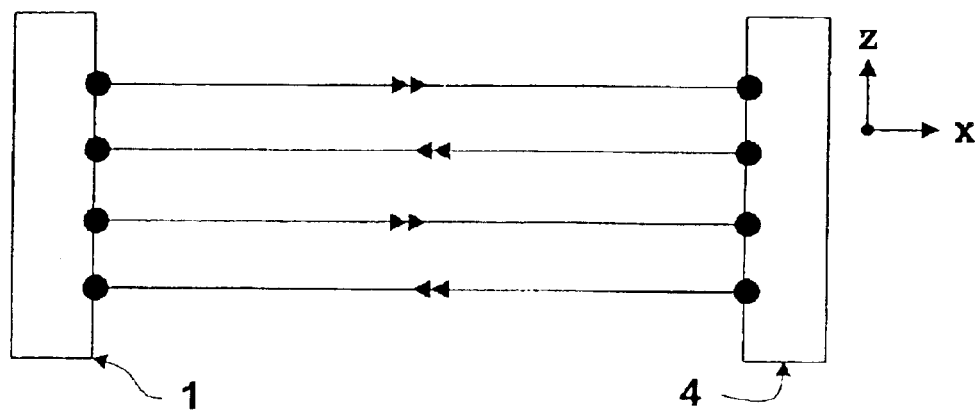
FIG. 39 is a path block diagram in side view of a further modified substrate treating apparatus.
Figure 40:
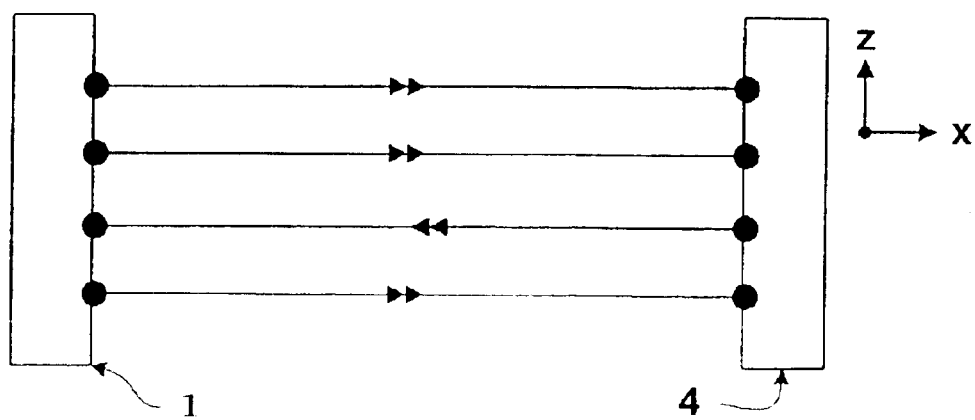
FIG. 40 is a path block diagram in side view of a further modified substrate treating apparatus.

The directions for transporting wafers W indicated by the arrows in FIGS. 24, 25, 37 and 38 are not limitative. As shown in FIG. 39, the directions for transporting wafers W may all be opposite to what is shown in FIG. 25. As shown in FIG. 40, wafers W may be transported along the substrate transport paths on certain stories opposite to the substrate transport directions shown in FIG. 25.

The second embodiment may be modified as follows:

(10) In the second embodiment described hereinbefore, the testing module T of heat-treating column 16A is disposed at the starting point of the treating transport paths 25 on the first story (this starting point being also the terminal point of the treating transport paths 26 on the second story), i.e. a location adjacent in the indexer 1. Another testing module T is disposed at the terminal point of the treating transport paths 25 (this terminal point being also the starting point of the treating transport paths 26), i.e. in the interface 4. However, the starting point of the treating transport paths 25 (or the terminal point of the treating transport paths 26) is not limited to the location adjacent in the indexer 1, and the terminal point of the treating transport paths 25 (or the starting point of the treating transport paths 26) is not limited to the interface 4. The starting point of the treating transport paths 25 (or the terminal point of the treating transport paths 26) may be in the indexer 1. The terminal point of the treating transport paths 25 (or the starting point of the treating transport paths 26) may be in a location adjacent the interface 4 (e.g. one of the edge exposure units EE in the post-exposure baking cell 14 on the first story). For example, a testing module T may be provided in the indexer 1, and a testing module in a location adjacent the interface 4, e.g. in one of the edge exposure units EE in the post-exposure baking cell 14 on the first story, which is the terminal end of the treating transport paths 25.

(11) In the second embodiment described hereinbefore, testing modules T are provided at all of the starting points and terminal points of the treating transport paths 25 and 26. Testing modules T may be provided only at the starting points or terminal points of the transport paths, or for either the transport paths 25 or transport paths 26.

Figure 41:
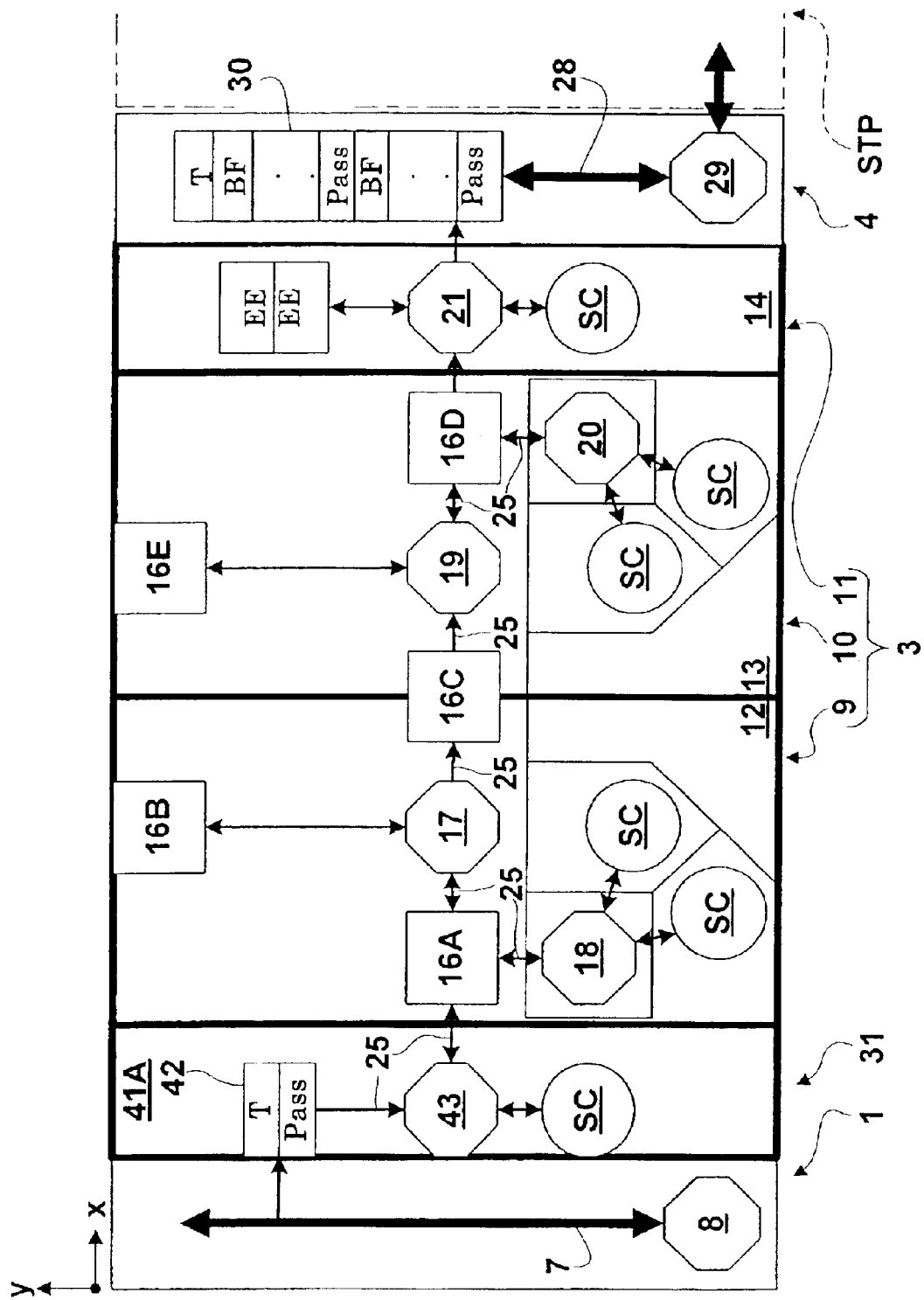
FIG. 41 is a block diagram seen in plan view of a first story of a modified substrate treating apparatus in the second embodiment.
Figure 42:
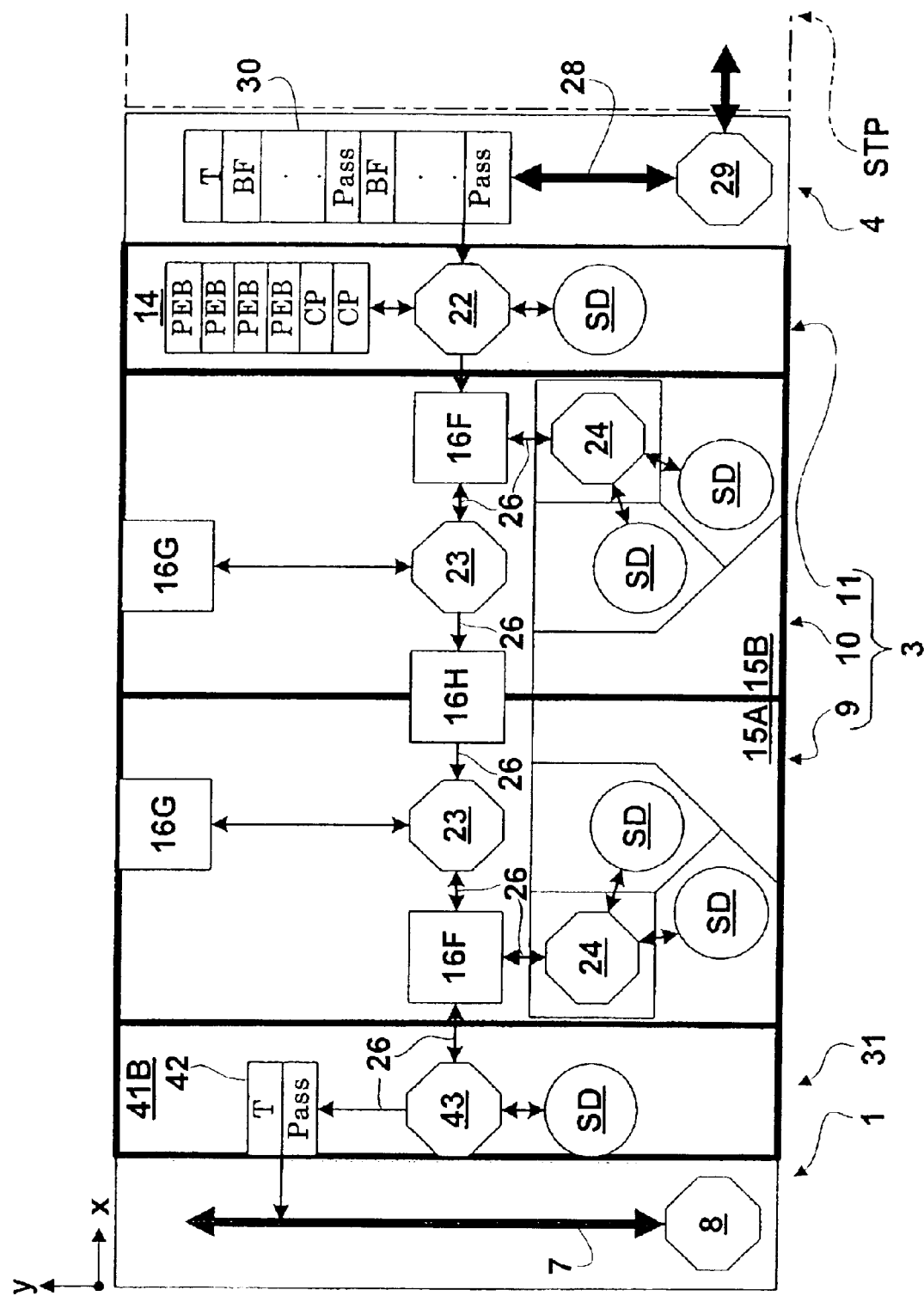
FIG. 42 is a block diagram seen in plan view of a second story of the modified substrate treating apparatus in the second embodiment.

(12) In the second embodiment described hereinbefore, each of the heat-treating columns 16A and 16F has a testing module T. As shown in FIGS. 41 and 42, a testing unit 41 may be provided including testing modules T independent of the heat-treating columns 16. FIG. 41 is a block diagram seen in plan view of a first story of the substrate treating apparatus. FIG. 42 is a block diagram seen in plan view of a second story of the substrate treating apparatus. For expediency of illustration, FIGS. 41 and 42 do not show a cassette table for receiving cassettes each containing or for containing substrates in multiple stages. Like references are used to identify like parts which are the same as in the second embodiment and will not be described again.

As shown in FIGS. 41 and 42, the testing unit 41 is provided besides the first to third treating units 9–11 which are the same as in the second embodiment. The testing unit 41 corresponds to the testing unit of this invention.

The testing unit 41 extends from the first story to the second story as do the first to third treating units 9–11. As shown in FIG. 41, the testing unit 41 includes a testing cell 41A disposed on the first story, and having a testing rest 42 and a spin coater SC arranged in two locations opposed to a transport mechanism 43 for testing. As shown in FIG. 42, the testing unit 41 includes a testing cell 41B disposed on the second story, and having a testing rest 42 and a spin coater SC arranged in two locations opposed to a transport mechanism 43 for testing. The transport mechanisms 43 for testing in the testing cells 41A and 41B have the same construction as the transport mechanism 17 for heat treatment.

As shown in FIG. 41, the post-exposure baking cell 14 on the first story includes edge exposure units EE as in the second embodiment, and a spin coater SC. As shown in FIG. 42, the second story portion of the cell 14 includes post-exposure baking modules PEB and cooling modules CP as in the second embodiment, and a spin developer SD.

Each of the testing rests 42 disposed in the testing cells 41A and 41B has functions to receive wafers W for transfer between the transport mechanism 8 in the indexer 1 and the transport mechanism 43 for testing, and to test certain of the wafers W during the transfer. That is, each testing rest 42 includes, stacked in order from the bottom, a substrate rest "Pass" for transferring wafers W other than those to be tested, and a testing module T for receiving and testing the wafers W. This testing rest 42 corresponds to the third receiver of this invention.

The heat-treating column 16A, as in the second embodiment, has functions to receive wafers W for transfer between the transport mechanism 17 for heat treatment and the transport mechanism 18 for anti-reflective coating formation and to perform heat treatment during the transfer, and also a function to transfer wafers W to and from the transport mechanism 43 for testing. The heat-treating column 16F in the developing cell 15A, as in the second embodiment, has functions to receive wafers W for transfer between the transport mechanism 23 for heat treatment and the transport mechanism 24 for development and to perform heat treatment during the transfer, and also a function to transfer wafers W to and from the transport mechanism 43 for testing.

With this construction, on the first story, the indexer's transport mechanism 8 and the transport mechanism 43 for testing transfer wafers W to and from the testing rest 42. The transport mechanism 43 for testing, the transport mechanism 17 for heat treatment and the transport mechanism 18 for anti-reflective coating formation transfer wafers W to and from the heat-treating column 16A. Thus, these transport mechanisms 43, 17 and 18 share the heat-treating column 16A. On the second story, the indexer's transport mechanism 8 and the transport mechanism 43 for testing transfer wafers W to and from the testing rest 42. The transport mechanism 43 for testing, the transport mechanism 23 for heat treatment and the transport mechanism 24 for development transfer wafers W to and from the heat-treating column 16F in the developing cell 15A. These transport mechanisms 43, 23 and 24 share the heat-treating column 16F. That is, the treating transport paths 25 include an arrangement of the testing rest 42 and the transport mechanism 43 for testing in the testing cell 41A, and, as in the second embodiment, an arrangement of the heat-treating columns 16A, 16C and 16D with the transport mechanisms 17–21 disposed in between. The treating transport paths 26 include the testing rest 42 and the transport mechanism 43 for testing in the testing cell 41B, and, as in the second embodiment, an arrangement of the heat-treating columns 16F and 16H with the transport mechanisms 22–24 disposed in between.

Where the testing unit 41 is provided as described above, the testing unit 41 may be detached from the first to third treating units 9–11 to reduce the number of units when the wafers W are not tested. When testing the wafers W, the testing unit 41 may be inserted between the indexer 1 and the first treating unit 9. In this way, the testing unit 41 may be incorporated into the apparatus not designed to test the wafers W, to realize a highly flexible substrate treating apparatus.

(13) The second embodiment described hereinbefore includes both the indexer 1 and interface 4, with the testing modules T disposed in the indexer 1 or the treating unit adjacent the indexer 1, and in the interface 4 or the treating unit adjacent the interface 4. Instead, the apparatus may include only the indexer 1 or interface 4, with a testing module T disposed therein.

(14) In the second embodiment described hereinbefore, the first to third treating units 9–11 including part of the treating transport paths 25 and 26 are arranged in the direction for transporting wafers W. Instead of the unit construction, the treating transport paths (treating transport paths 25 and 26) may, respectively, be formed integral.

(15) In the second embodiment and in modifications (10)–(14) described hereinbefore, the apparatus has a two-story structure. The apparatus may have three or more stories or only one story. Where apparatus has only one story, as shown in FIG. 43, for example, a testing module $T_1$ may be disposed in the indexer 1 or in any adjacent treating unit 44. As shown in FIG. 44, a testing module $T_2$ may be disposed in the interface 4 or in any adjacent treating unit 44. As shown in FIG. 45, a testing module $T_1$ may be disposed in the indexer 1 or in any adjacent treating unit 44, and a testing module $T_2$ in the interface 4 or in any adjacent treating unit 44. The testing module $T_1$ corresponds to the first testing device of this invention. The testing module $T_2$ corresponds to the second testing device of this invention. Where substrate rests, not shown, are arranged with the testing modules $T_1$ and $T_2$, the testing module $T_1$ and substrate rest correspond to the first testing rest of this invention, and the testing module $T_2$ and substrate rest correspond to the second testing rest of this invention. The substrate rests correspond to the bypass passages of this invention.

Figure 43A:
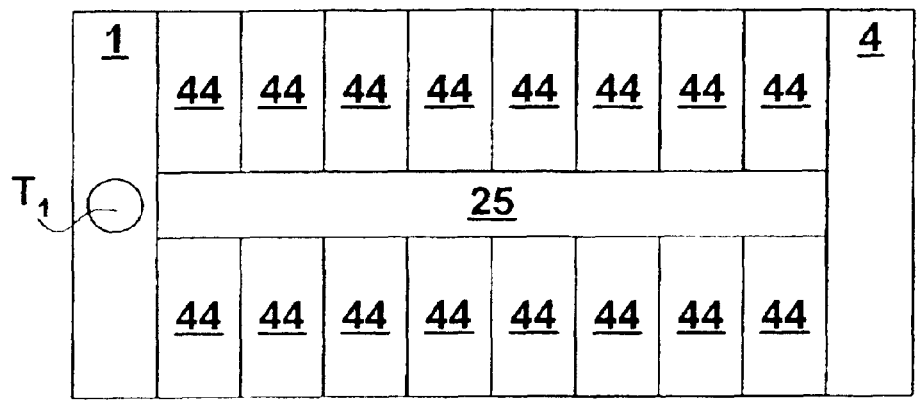
FIG. 43A is a block diagram in plan view of a further modified substrate treating apparatus.
Figure 43B:
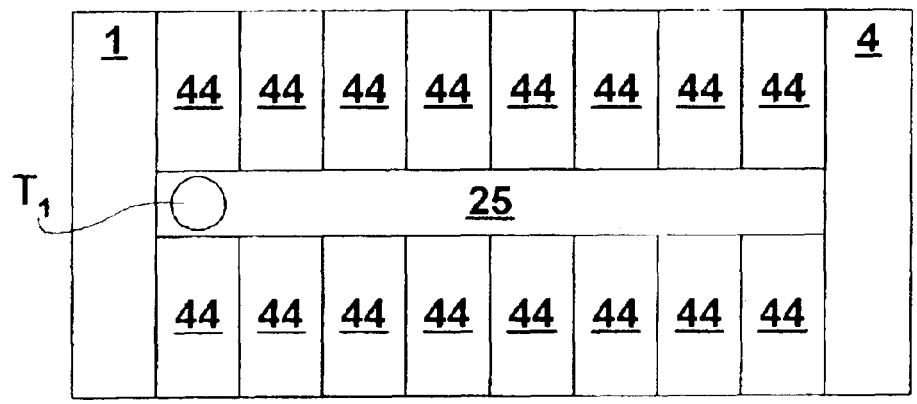
FIG. 43B is a block diagram in plan view of a further modified substrate treating apparatus.
Figure 43C:
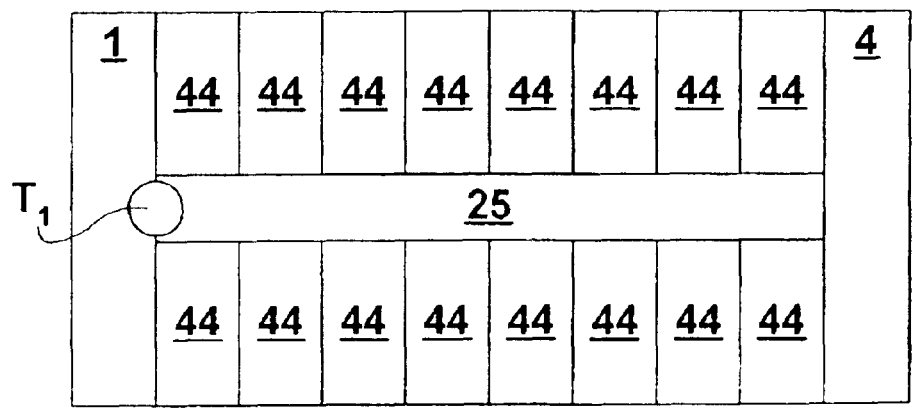
FIG. 43C is a block diagram in plan view of a further modified substrate treating apparatus.
Figure 44A:
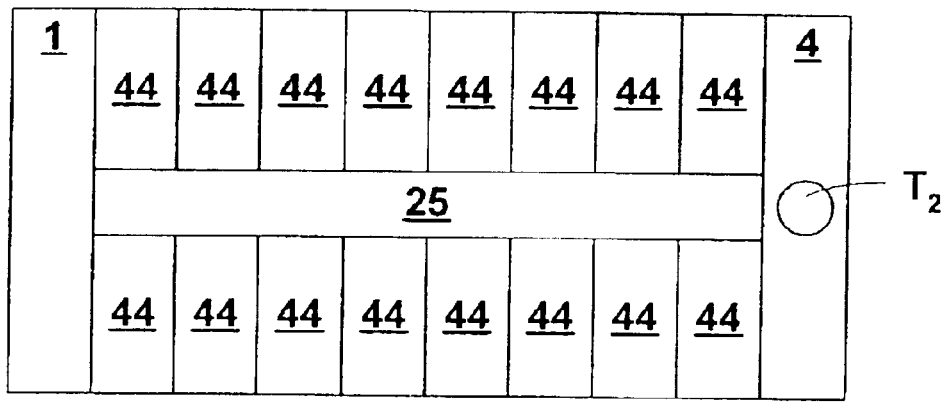
FIG. 44A is a block diagram in plan view of a further modified substrate treating apparatus.
Figure 44B:
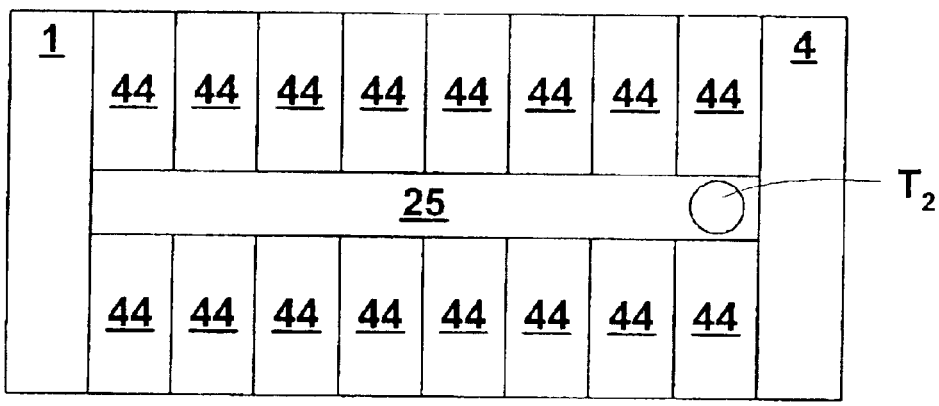
FIG. 44B is a block diagram in plan view of a further modified substrate treating apparatus.
Figure 44C:
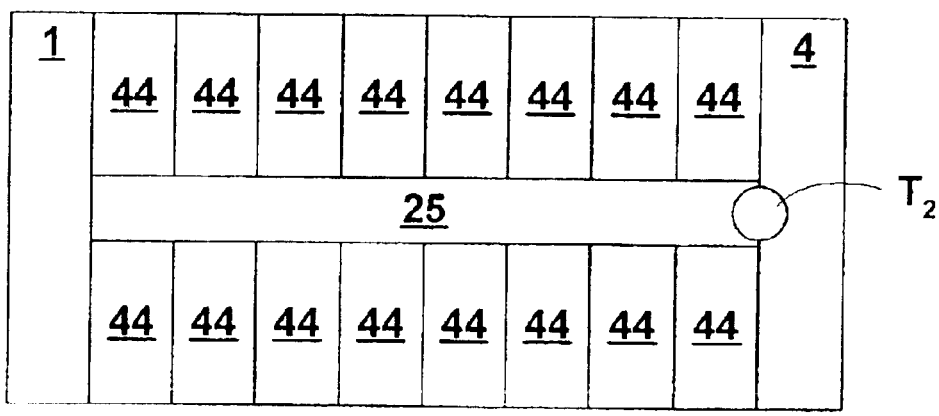
FIG. 44C is a block diagram in plan view of a further modified substrate treating apparatus.
Figure 45A:
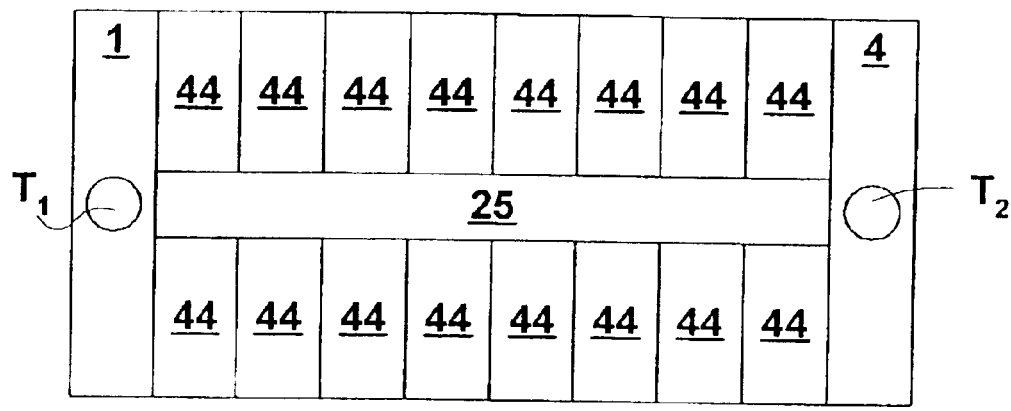
FIG. 45A is a block diagram in plan view of a further modified substrate treating apparatus.
Figure 45B:
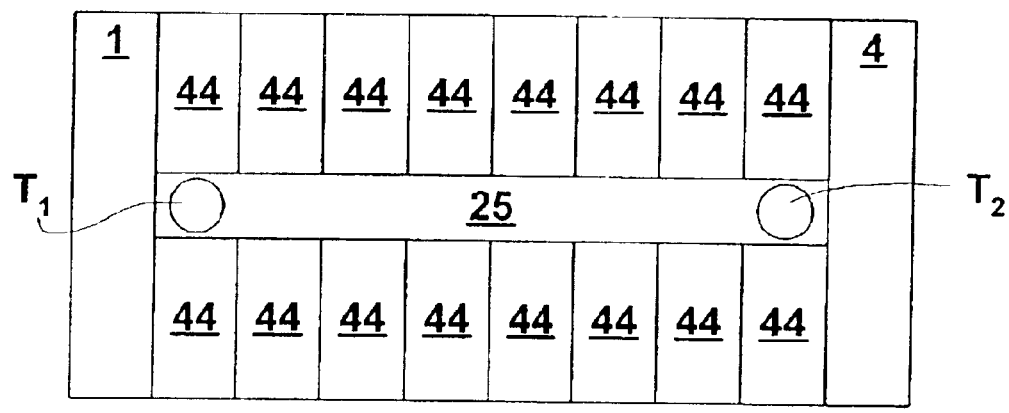
FIG. 45B is a block diagram in plan view of a further modified substrate treating apparatus.
Figure 45C:
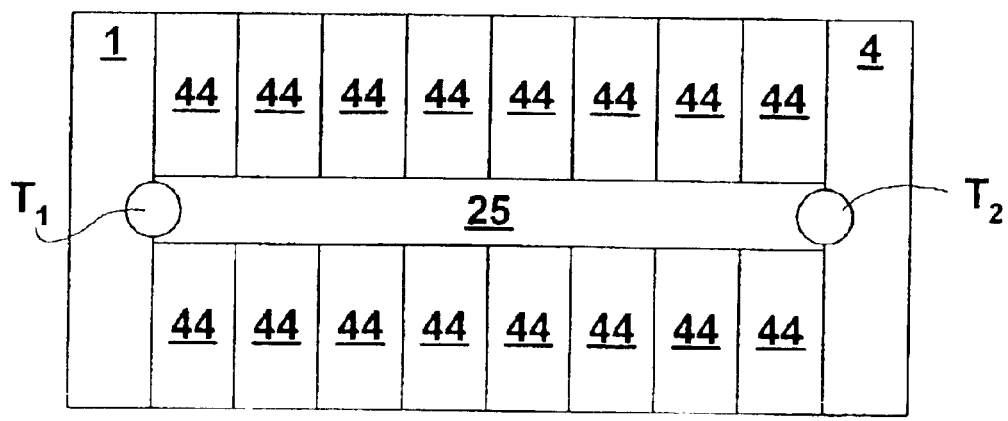
FIG. 45C is a block diagram in plan view of a further modified substrate treating apparatus.

As shown in FIG. 43A, the testing module $T_1$ may be disposed only in the indexer 1. As shown in FIG. 43B, the testing module $T_1$ may be disposed only in the treating unit 44 adjacent the indexer 1. Testing modules $T_1$ may be disposed in both the indexer 1 and adjacent treating unit 44. As shown in FIG. 43C, the testing module $T_1$ may be disposed to bridge the indexer 1 and adjacent treating unit 44.

Where the testing module $T_2$ is disposed in the interface 4 or adjacent treating unit 44, as shown in FIG. 44A, the testing module $T_2$ may be disposed only in the interface 4. As shown in FIG. 44B; the testing module $T_2$ may be disposed only in the treating unit 44 adjacent the interface 4. Testing modules $T_2$ may be disposed in both the interface 4 and adjacent treating unit 44. As shown in FIG. 44C, the testing module $T_2$ may be disposed to bridge the interface 4 and adjacent treating unit 44.

Where the testing module $T_1$ is disposed in the indexer 1 or adjacent treating unit 44, and the testing module $T_2$ in the interface 4 or adjacent treating unit 44, as shown in FIG. 45A, the testing modules $T_1$ and $T_2$ may be disposed only in the indexer 1 and interface 4, respectively. As shown in FIG. 45B, the testing modules $T_1$ and $T_2$ may be disposed only in the treating units 44 adjacent the indexer 1 and the treating unit 44 adjacent the interface 4, respectively. Testing modules $T_1$ may be disposed in both the indexer 1 and adjacent treating unit 44, and testing modules $T_2$ in both the interface 4 and adjacent treating unit 44. As shown in FIG. 45C, the testing module $T_1$ may be disposed to bridge the indexer 1 and adjacent treating unit 44, and the testing module $T_2$ to bridge the interface 4 and adjacent treating unit 44. The testing module $T_1$ may be disposed in the indexer 1, while the testing module $T_2$ is disposed to bridge the interface 4 and adjacent treating unit 44, or in the treating unit 44 adjacent the interface 4.

(16) In the second embodiment described hereinbefore, the substrate rests "Pass" are provided as bypass passages of this invention, so that the wafers W other than those to be tested are transferred through the substrate rests "Pass". These substrate rests "Pass" are not absolutely necessary. The testing modules T ($T_1$ and $T_2$ inclusive) acting as the first to third testing devices of this invention have, besides the function to test certain wafers W, the function to transfer these wafers W, i.e. the function of the first to fourth receivers of this invention. However, the testing modules T may perform only the testing function, and not the function to transfer wafers W.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus having a plurality of treating devices for treating substrates, comprising:
   a series of substrate transport paths arranged on upper and lower stories for transporting the substrates between said treating devices, the substrates being transferable between the substrate transport paths on the upper and lower stories;
   wherein said substrate transport paths on the respective stories have opposite directions for transporting the substrates, such that said substrate transport paths on the respective stories define a going-only path for transporting the substrates forward, and a return-only path for transporting the substrates backward.

2. A substrate treating apparatus as defined in claim 1, further comprising:
   an indexer juxtaposed with said series of substrate transport paths arranged on said upper and lower stories, and including a cassette table for receiving a cassette containing substrates to be treated, said indexer successively fetching the substrates to be treated from said cassette, delivering the substrates to be treated to said treating devices, receiving treated substrates from said treating devices, and successively depositing the treated substrates in said cassette;
   an end of said series of substrate transport paths being connected to said indexer.

3. A substrate treating apparatus as defined in claim 1, further comprising:
   an indexer juxtaposed with said series of substrate transport paths arranged on said upper and lower stories, and including a cassette table for receiving a cassette containing substrates to be treated, said indexer successively fetching the substrates to be treated from said cassette, delivering the substrates to be treated to said treating devices, receiving treated substrates from said treating devices, and successively depositing the treated substrates in said cassette;
   an end of each of said substrate transport paths on the respective stories being connected to said indexer.

4. A substrate treating apparatus as defined in claim 1, further comprising:
   an interface juxtaposed with said series of substrate transport paths arranged on said upper and lower stories, for relaying the substrates between said treating devices and an external treating apparatus disposed adjacent said substrate treating apparatus;
   an end of said series of substrate transport paths being connected to said interface.

5. A substrate treating apparatus as defined in claim 1, further comprising:
   an interface juxtaposed with said series of substrate transport paths arranged on said upper and lower stories, for relaying the substrates between said treating devices and an external treating apparatus disposed adjacent said substrate treating apparatus;
   an end of each of said substrate transport paths on the respective stories being connected to said interface.

6. A substrate treating apparatus as defined in claim 1, further comprising:

an indexer juxtaposed with one end of said series of substrate transport paths arranged on said upper and lower stories, and including a cassette table for receiving a cassette containing substrates to be treated, said indexer successively fetching the substrates to be treated from said cassette, delivering the substrates to be treated to said treating devices, receiving treated substrates from said treating devices, and successively depositing the treated substrates in said cassette; and an interface juxtaposed with the other end of said series of substrate transport paths arranged on said upper and lower stories, for relaying the substrates between said treating devices and an external treating apparatus disposed adjacent said substrate treating apparatus;

said one end of said series of substrate transport paths being connected to said indexer, and said other end of said series of substrate transport paths being connected to said interface.

7. A substrate treating apparatus as defined in claim 1, further comprising:

an indexer juxtaposed with one end of said series of substrate transport paths arranged on said upper and lower stories, and including a cassette table for receiving a cassette containing substrates to be treated, said indexer successively fetching the substrates to be treated from said cassette, delivering the substrates to be treated to said treating devices, receiving treated substrates from said treating devices, and successively depositing the treated substrates in said cassette; and an interface juxtaposed with the other end of said series of substrate transport paths arranged on said upper and lower stories, for relaying the substrates between said treating devices and an external treating apparatus disposed adjacent said substrate treating apparatus;

said one end of each of said substrate transport paths on the respective stories being connected to said indexer, and said other end of each of said substrate transport paths on the respective stories being connected to said interface.

8. A substrate treating apparatus as defined in claim 1, further comprising:

a coating device disposed on said going-only path for applying a treating solution to the substrates; and a developing device disposed on said return-only path for developing said substrates having the treating solution applied thereto in said coating device;

said series of substrate transport paths having said return-only path with said developing device arranged above said going-only path with said coating device, the substrates being transferable between said going-only path and said return-only path.

9. A substrate treating apparatus as defined in claim 1, further comprising:

a plurality of substrate transport means for transporting the substrates along said substrate transport paths on the respective stories;

wherein each of said substrate transport means includes a loading transport mechanism for loading the substrates into the treating devices, and an unloading transport mechanism for unloading the substrates from the treating devices.

10. A substrate treating apparatus as defined in claim 1, wherein:

a plurality of treating devices vertically opposed to each other among the treating devices arranged along said substrate transport paths on the upper and lower stories, and parts vertically opposed to each other of said substrate transport paths on the respective stories, constitute one of substrate treating units;

said substrate treating units being arranged in the directions for transporting the substrates.

11. A substrate treating apparatus as defined in claim 10, wherein one, on one of the stories, of the parts of said substrate transport paths included in each of said substrate treating units is connected to one, on said one of the stories, of the parts of said substrate transport paths included in an adjacent one of said substrate treating units.

12. A substrate treating apparatus as defined in claim 11, further comprising a substrate receiver on the substrate transport path on each story, between two adjacent substrate treating units, for receiving the substrates for transfer between said two adjacent substrate treating units.

13. A substrate treating apparatus as defined in claim 11, wherein at least one of said substrate treating units comprises a resist film forming device for forming photoresist film on the substrates.

14. A substrate treating apparatus as defined in claim 11, wherein at least one of said substrate treating units comprises an anti-reflective coating forming device for forming an anti-reflective coating on the substrates.

15. A substrate treating method using the substrate treating apparatus defined in claim 7, said method comprising the steps of:

placing substrates to be treated from said indexer at one of the ends of the substrate transport paths on the respective stories connected to said indexer;

transporting the substrates along the substrate transport path on the story on which the substrates have been placed, for substrate treatment in each of said treating devices;

transferring the substrates treated in each of said treating devices to said external treating apparatus through said interface connected to the other end of the substrate transport path on the story on which the substrates have been placed, for treatment in said external treating apparatus;

placing the substrates treated in said external treating apparatus, through said interface, at one of the other ends of the substrate transport paths on the respective stories connected to said interface; and transporting the substrates along the substrate transport path on the story on which the substrates have been placed, for substrate treatment in each of said treating devices;

a series of substrate treatments including the treatment by said external treating apparatus being carried out by executing the above steps.

16. A substrate treating method as defined in claim 15, wherein the substrates having received the series of substrate treatments including the treatment by said external treating apparatus are transported through the indexer connected to the ends of the substrate transport paths on the respective stories, and placed at one of the ends of the substrate transport paths on the respective stories, to repeat said series of substrate treatments for the substrates placed.

17. A substrate treating apparatus having a plurality of treating devices for treating substrates, comprising:

substrate transport paths arranged on upper and lower stories for transporting the substrates between said treating devices; and an indexer including a cassette table for receiving a cassette containing substrates to be treated, said indexer successively fetching the substrates to be treated from said cassette, delivering the substrates to be treated to said treating devices, receiving treated substrates from said treating devices, and successively depositing the treated substrates in said cassette;

wherein an end of each of said substrate transport paths on the respective stories is connected to the indexer.

18. A substrate treating apparatus as defined in claim 17, further comprising a first receiver disposed in one of said indexer and said end of each of said substrate transport paths on the respective stories for receiving the substrates for transfer between said indexer and said end of each of said substrate transport paths.

19. A substrate treating apparatus as defined in claim 18, wherein said first receiver is arranged on the upper and lower stories to extend from an uppermost story to a lowermost story of said substrate transport paths, said first receiver being disposed in said indexer.

20. A substrate treating apparatus having a plurality of treating devices for treating substrates, comprising:

substrate transport paths arranged on upper and lower stories for transporting the substrates between said treating devices; and an interface for relaying the substrates between said treating devices and an external treating apparatus disposed adjacent said substrate treating apparatus;

wherein an end of each of said substrate transport paths on the respective stories is connected to said interface.

21. A substrate treating apparatus as defined in claim 20, further comprising a receiver disposed in one of said interface and said end of each of said substrate transport paths on the respective stories for receiving the substrates for transfer between said end of each of said substrate transport paths and said interface.

22. A substrate treating apparatus as defined in claim 21, wherein said receiver is arranged on the upper and lower stories to extend from an uppermost story to a lowermost story of said substrate transport paths, said receiver being disposed in said interface.

23. A substrate treating apparatus having a plurality of treating devices for treating substrates, comprising:

substrate transport paths arranged on upper and lower stories for transporting the substrates between said treating devices;

an indexer including a cassette table for receiving a cassette containing substrates to be treated, said indexer successively fetching the substrates to be treated from said cassette, delivering the substrates to be treated to said treating devices, receiving treated substrates from said treating devices, and successively depositing the treated substrates in said cassette; and an interface for relaying the substrates between said treating devices and an external treating apparatus disposed adjacent said substrate treating apparatus;

wherein an end of each of said substrate transport paths on the respective stories is connected to said indexer, and the other end of each of said substrate transport paths on the respective stories is connected to said interface.

24. A substrate treating apparatus as defined in claim 23, further comprising a receiver disposed in one of said indexer and said end of the substrate transport path on each of the stories for receiving the substrates for transfer between said indexer and said end of substrate transport path on each of the stories.

25. A substrate treating apparatus as defined in claim 24, wherein said receiver is arranged on the upper and lower stories to extend from an uppermost story to a lowermost story of said substrate transport paths, said receiver being disposed in said indexer.

26. A substrate treating apparatus as defined in claim 23, further comprising a receiver disposed in one of said interface and said end of the substrate transport path on each of the stories for receiving the substrates for transfer between said end of said substrate transport path on each of the stories and said interface.

27. A substrate treating apparatus as defined in claim 26, wherein said receiver is arranged on the upper and lower stories to extend from an uppermost story to a lowermost story of said substrate transport paths, said receiver being disposed in said interface.

28. A substrate treating method using the substrate treating apparatus defined in claim 23, said method comprising the steps of:

placing substrates to be treated, fetched by said indexer, at one of the ends of the substrate transport paths on the respective stories connected to said indexer;

transporting the substrates along one of the substrate transport paths for substrate treatment in each of said treating devices;

transferring the substrates treated in each of said treating devices to said external treating apparatus through said interface connected to the other ends of the substrate transport paths, for treatment in said external treating apparatus;

placing the substrates treated in said external treating apparatus, through said interface, at one of the other ends of the substrate transport paths on the respective stories connected to said interface; and transporting the substrates along one of the substrate transport paths for substrate treatment in each of said treating devices;

a series of substrate treatments including the treatment by said external treating apparatus being carried out by executing the above steps.

29. A substrate treating method as defined in claim 28, wherein the substrates having received the series of substrate treatments including the treatment by said external treating apparatus are transported through the indexer connected to the ends of the substrate transport paths on the respective stories, and placed at one of the ends of the substrate transport paths on the respective stories, to repeat said series of substrate treatments for the substrates placed.

30. A substrate treating apparatus having a plurality of treating devices for treating substrates, comprising:

an indexer including a cassette table for receiving a cassette containing substrates to be treated, said indexer successively fetching the substrates to be treated from said cassette, delivering the substrates to be treated to said treating devices, receiving treated substrates from said treating devices, and successively depositing the treated substrates in said cassette; and a first testing device disposed in one of said indexer and one of said treating devices adjacent said indexer for testing substrates.

31. A substrate treating apparatus as defined in claim 30, further comprising a testing unit including said first testing device, said testing unit being juxtaposed with said treating devices in a direction for transporting the substrates.

32. A substrate treating apparatus as defined in claim 30, further comprising a first receiver for receiving the substrates for transfer between said indexer and said one of said treating devices adjacent said indexer, said first testing device being arranged to test the substrates placed in said first receiver.

33. A substrate treating apparatus as defined in claim 32, wherein, of a plurality of substrates transferred between said indexer and said treating devices, the substrates to be tested in said first testing device are transferred through said first receiver while the remaining substrates are transferred through a bypass passage without being tested.

34. A substrate treating apparatus having a plurality of treating devices for treating substrates, comprising:
- an interface for relaying the substrates between said treating devices and an external treating apparatus disposed adjacent said substrate treating apparatus; and
- a testing device disposed in one of said interface and one of said treating devices adjacent said interface for testing substrates.

35. A substrate treating apparatus as defined in claim 34, further comprising a testing unit including said testing device, said testing unit being juxtaposed with said treating devices in a direction for transporting the substrates.

36. A substrate treating apparatus as defined in claim 34, further comprising a receiver for receiving the substrates for transfer between said interface and said one of said treating devices adjacent said interface, said testing device being arranged to test the substrates placed in said receiver.

37. A substrate treating apparatus as defined in claim 36, wherein, of a plurality of substrates transferred between said interface and the treating devices, the substrates to be tested in said testing device are transferred through said receiver while the remaining substrates are transferred through a bypass passage without being tested.

38. A substrate treating apparatus having a plurality of treating devices for treating substrates, comprising:
- an indexer including a cassette table for receiving a cassette containing substrates to be treated, said indexer successively fetching the substrates to be treated from said cassette, delivering the substrates to be treated to said treating devices, receiving treated substrates from said treating devices, and successively depositing the treated substrates in said cassette; and
- an interface for relaying the substrates between said treating devices and an external treating apparatus disposed adjacent said substrate treating apparatus;
- a first testing device disposed in one of said indexer and one of said treating devices adjacent said indexer for testing substrates; and
- a second testing device disposed in one of said interface and one of said treating devices adjacent said interface for testing substrates.

39. A substrate treating apparatus as defined in claim 38, further comprising a testing unit including at least one of said first testing device and said second testing device, said testing unit being juxtaposed with said treating devices in a direction for transporting the substrates.

40. A substrate treating apparatus as defined in claim 38, further comprising a receiver for receiving the substrates for transfer between said indexer and said one of said treating devices adjacent said indexer, said first testing device being arranged to test the substrates placed in said first receiver.

41. A substrate treating apparatus as defined in claim 40, wherein, of a plurality of substrates transferred between said indexer and said treating devices, the substrates to be tested in said first testing device are transferred through said receiver while the remaining substrates are transferred through a bypass passage without being tested.

42. A substrate treating apparatus as defined in claim 38, further comprising a receiver for receiving the substrates for transfer between said interface and said one of said treating devices adjacent said interface, said second testing device being arranged to test the substrates placed in said receiver.

43. A substrate treating apparatus as defined in claim 42, wherein, of a plurality of substrates transferred between said interface and the treating devices, the substrates to be tested in said second testing device are transferred through said receiver while the remaining substrates are transferred through a bypass passage without being tested.

44. A substrate treating apparatus having a plurality of treating devices for treating substrates, comprising:
- a series of substrate transport paths arranged on upper and lower stories for transporting the substrates between said treating devices; and
- a testing device disposed at one of a starting point and a terminal point of the substrate transport paths arranged on the respective stories.

45. A substrate treating apparatus as defined in claim 44, further comprising a testing unit including said testing device, said testing unit being juxtaposed with said treating devices in a direction for transporting the substrates.

46. A substrate treating apparatus as defined in claim 44, further comprising:
- an indexer including a cassette table for receiving a cassette containing substrates to be treated, said indexer successively fetching the substrates to be treated from said cassette, delivering the substrates to be treated to said treating devices, receiving treated substrates from said treating devices, and successively depositing the treated substrates in said cassette; and
- a receiver disposed at one of said starting point and said terminal point of the substrate transport paths for receiving the substrates for transfer between said indexer and said treating devices;
- said testing device being arranged to test the substrates placed in said receiver.

47. A substrate treating apparatus as defined in claim 46, wherein, of a plurality of substrates transferred between said indexer and said treating devices, the substrates to be tested in said testing device are transferred through said receiver while the remaining substrates are transferred through a bypass passage without being tested.

48. A substrate treating apparatus as defined in claim 44, further comprising:
- an interface for relaying the substrates between one of said treating devices disposed adjacent one of said starting point and said terminal point of the substrate transport paths, and an external treating apparatus disposed adjacent said substrate treating apparatus; and
- another receiver disposed at one of said starting point and said terminal point of the substrate transport paths for receiving the substrates for transfer between said interface and said treating devices;
- said testing device being arranged to test the substrates placed in said other receiver.

49. A substrate treating apparatus as defined in claim 48, wherein, of a plurality of substrates transferred between said interface and the treating devices, the substrates to be tested in said testing device are transferred through said receiver while the remaining substrates are transferred through a bypass passage without being tested.

50. A substrate treating method using the substrate treating apparatus defined in claim 30, said method comprising the steps of:

loading the substrates to be treated, through said indexer, into said treating devices for treatment in each of said treating devices;

testing the substrates in said first testing device for results of the treatment in said treating devices; and reloading the substrates found unacceptable, through said indexer, into said treating devices for repeated treatment in each of said treating devices.

51. A substrate treating method using the substrate treating apparatus defined in claim 38, said method comprising the steps of:

loading the substrates to be treated, through said indexer, into said treating devices for treatment in each of said treating devices;

transferring the substrates treated in each of said treating devices, through said interface, to said external treating apparatus for treatment in said external treating apparatus;

loading the substrates treated in said external treating apparatus, through said interface, into said treating devices for treatment in each of said treating devices;

testing the substrates in said first testing device for results of the treatment in said treating devices; and reloading the substrates found unacceptable, through said indexer, into said treating devices for repeated treatment in each of said treating devices.

52. A substrate treating method using the substrate treating apparatus defined in claim 47, said method comprising the steps of:

placing the substrates to be treated, through said indexer, at the starting point of the substrate transport paths;

transporting the substrates along the substrate transport paths for treatment in each of said treating devices;

placing the substrates treated in each of said treating devices, at the terminal point of the substrate transport paths;

placing the substrates in the receiver for transfer to the indexer;

testing the substrates in the testing device for results of the treatment in said treating devices;

placing the substrates found unacceptable, through said indexer, at the starting point of the substrate transport paths again; and transporting the substrates again along the substrate transport paths for repeated treatment in each of said treating devices.

* * * * *